(12) United States Patent
Sugita et al.

(10) Patent No.: US 6,670,080 B2
(45) Date of Patent: Dec. 30, 2003

(54) MASK PATTERN CREATING METHOD AND MASK PATTERN CREATING APPARATUS

(75) Inventors: Mitsuro Sugita, Utsunomiya (JP); Tetsunobu Kochi, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/356,700

(22) Filed: Jul. 20, 1999

(65) Prior Publication Data

US 2003/0022071 A1 Jan. 30, 2003

(30) Foreign Application Priority Data

Jul. 21, 1998 (JP) .......................... 10-221096
Aug. 24, 1998 (JP) .......................... 10-251823
Oct. 29, 1998 (JP) .......................... 10-322965

(51) Int. Cl.[7] .......................... G03F 9/00; G03C 5/00; G06F 17/50
(52) U.S. Cl. .......................... 430/5; 430/30; 716/21
(58) Field of Search .......................... 430/30, 5, 22; 378/34, 35; 355/77; 716/21

(56) References Cited

U.S. PATENT DOCUMENTS 5,415,835 A   5/1995   Brueck et al. .............. 430/311
5,894,057 A * 4/1999   Yamaguchi et al. .......... 430/30

* cited by examiner

Primary Examiner—Christopher G. Young
Assistant Examiner—Saleha R. Mohamedulla
(74) Attorney, Agent, or Firm—Fitzpatrick, Cella, Harper & Scinto

(57) ABSTRACT

A method for creating a mask pattern used in multiple exposure for carrying out overlay printing of a micro-line pattern and a mask pattern a minimum line width of which is wider than a line width of the micro-line pattern to form a target pattern having a minimum line width corresponding to the line width of the micro-line pattern, the method having:

a step of preparing data of the target pattern desired to form after the exposure;

a step of carrying out a logical operation of predetermined micro-line pattern data and the target pattern data;

a step of dividing a surface of the mask pattern into plural types of areas, based on the result of the logical operation;

a step of setting a single light transmittance or a plurality of light transmittances required or allowed for the types of areas and grouping areas for which one light transmittance can be selected, in each light transmittance; and a step of synthesizing a synthetic pattern from grouped patterns formed in the respective light transmittances, wherein data of the synthetic pattern is used as data of the mask pattern.

22 Claims, 65 Drawing Sheets

(a) NEGATIVE-TYPE RESIST (b) POSITIVE-TYPE RESIST

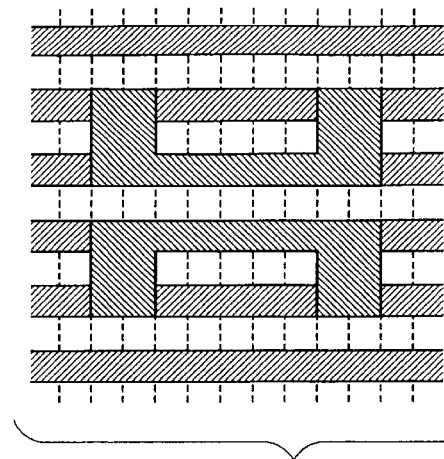
FIG. 11C
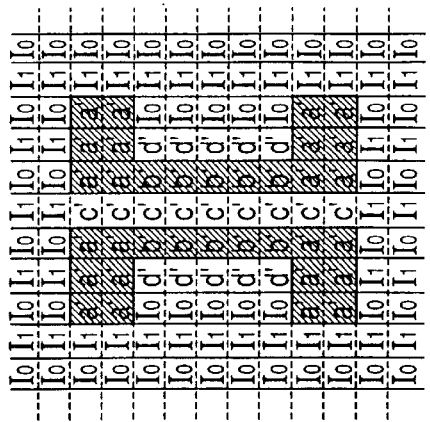
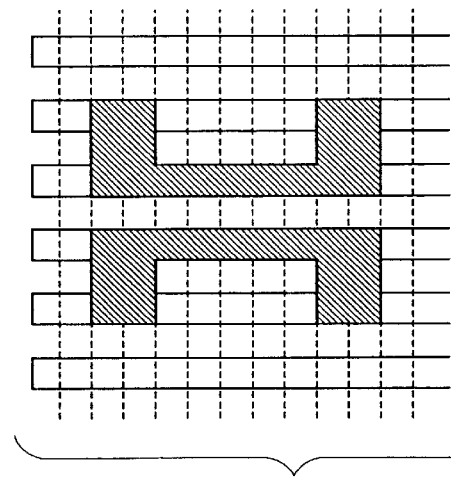
FIG. 11B
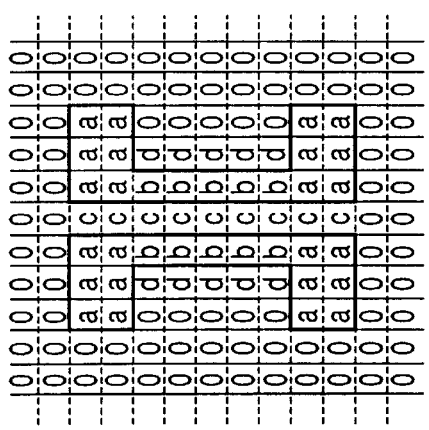
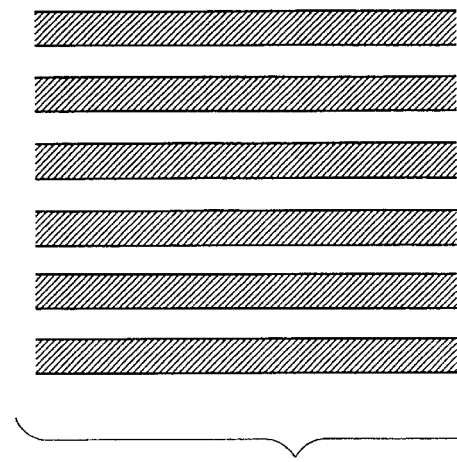
FIG. 11A
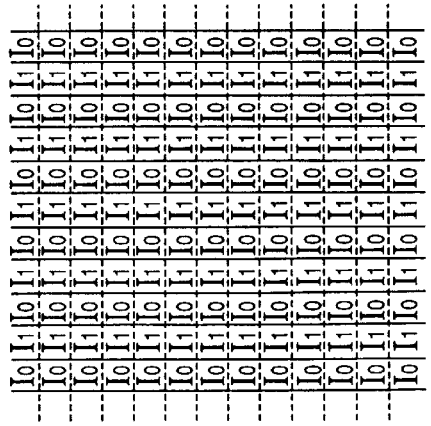

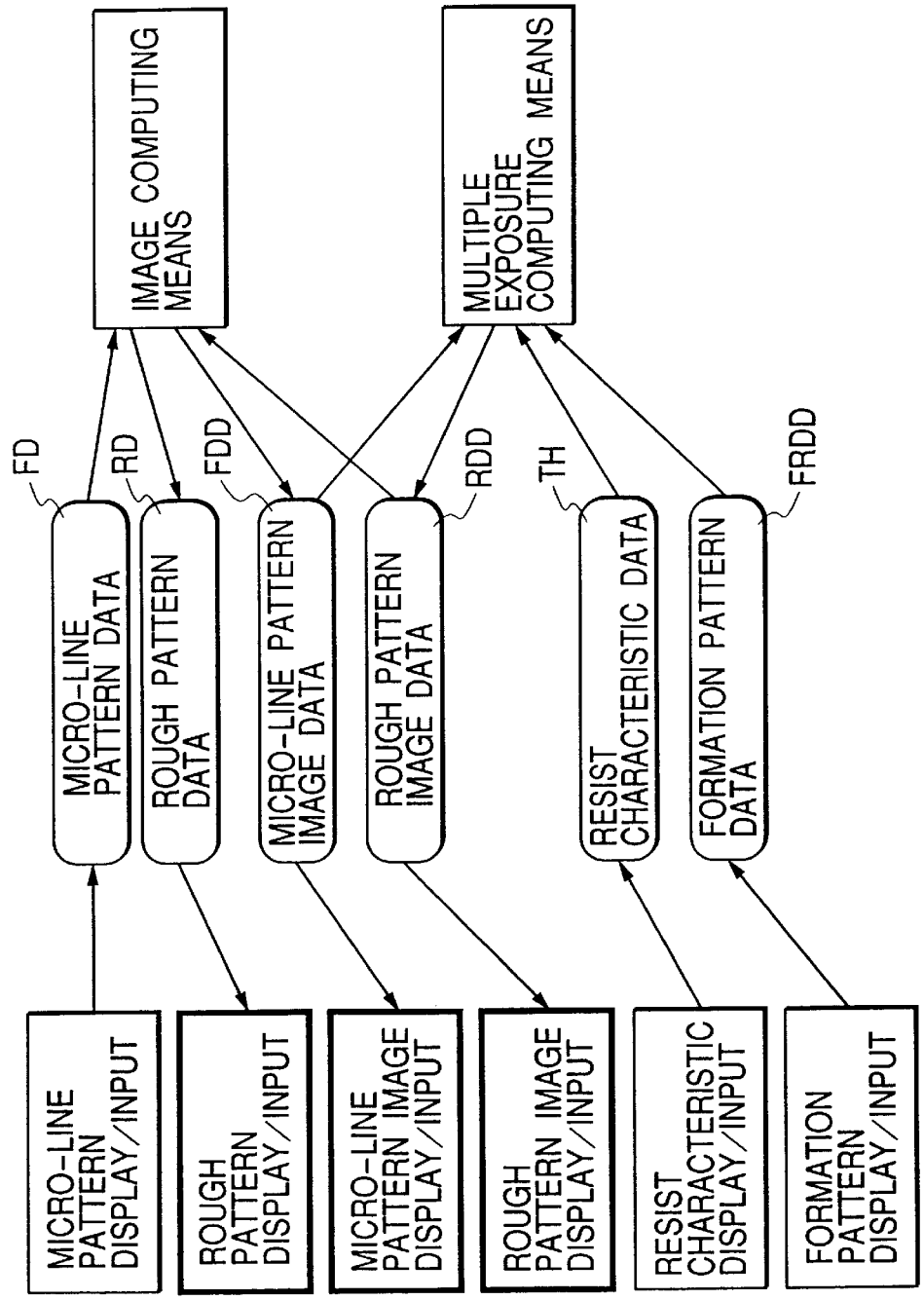

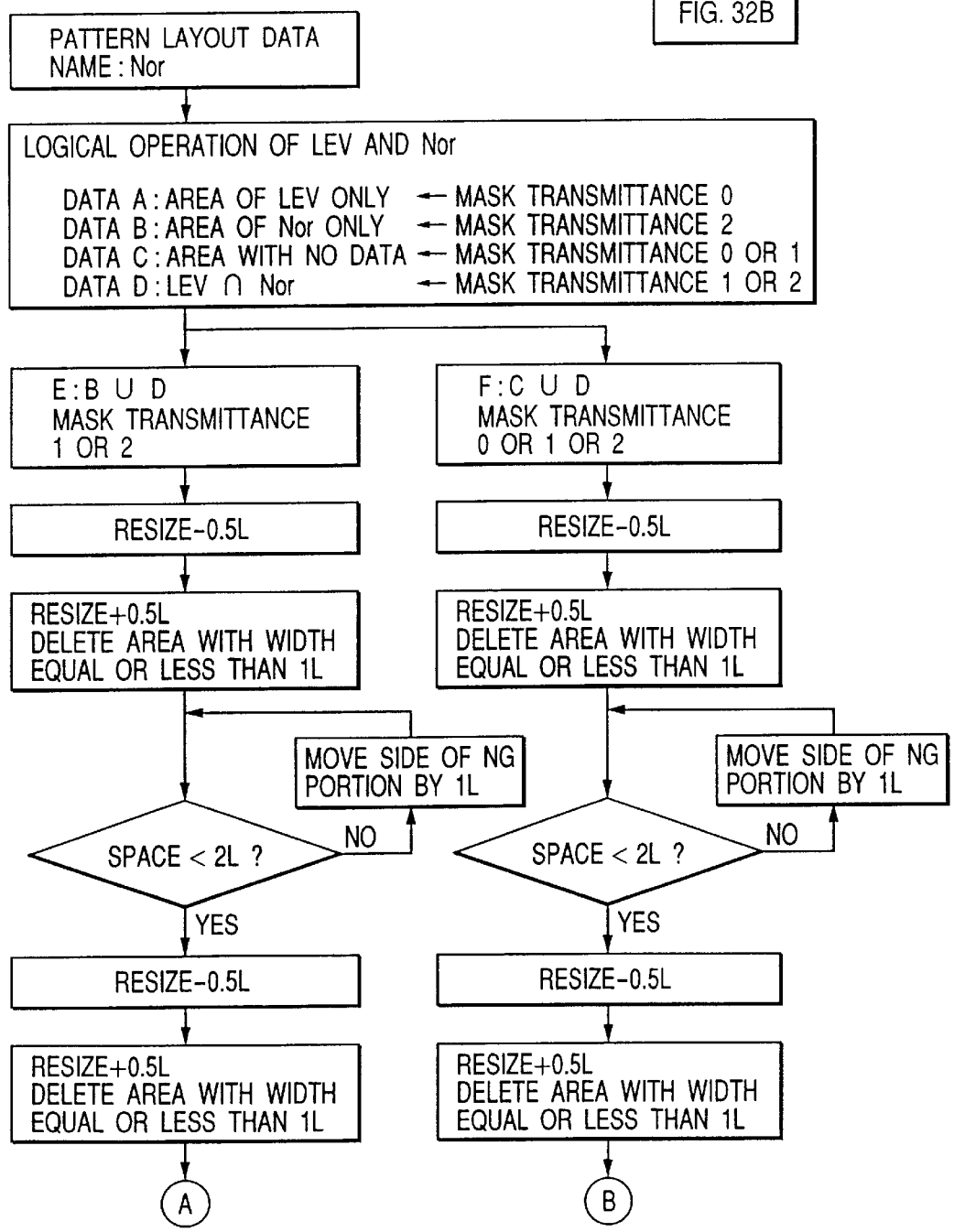

FIG. 37
(a)
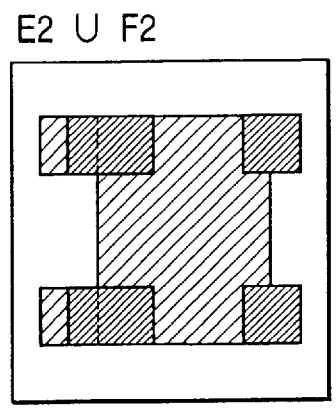
E2 ∪ F2
COMPARISON WITH Nor
IS THERE AREA OF
Nor ONLY ?
⇩
NO → OK
⇩
IS THERE AREA OF
E2 ∩ F2 ?
⇩
YES
⇩
REVISE E2 OR F2
SO AS TO SATISFY
DATA WIDTH CONDITION
⇩
OK
(b)
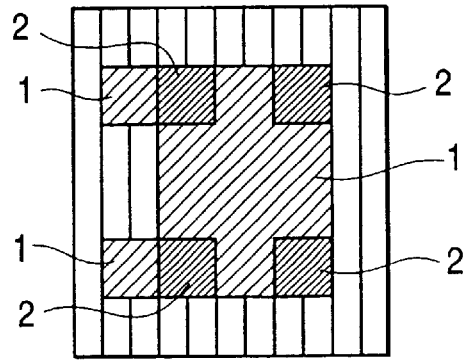

FIG. 38
(a)
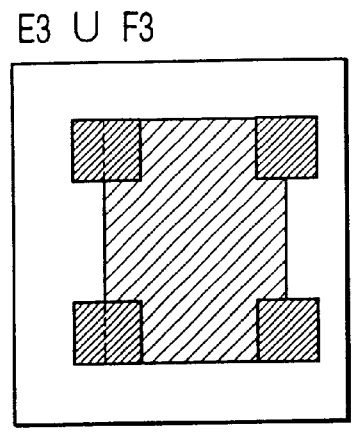
E3 ∪ F3
COMPARISON WITH Nor
IS THERE AREA OF
Nor ONLY ?
⇩
NO → OK
⇩
IS THERE AREA OF
E3 ∩ F3 ?
⇩
(b)
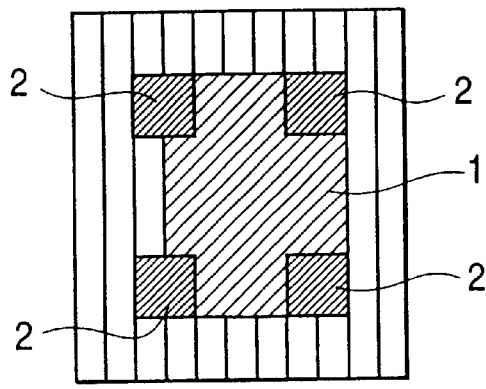
OK

FIG. 40
(a) E3 ∪ F2
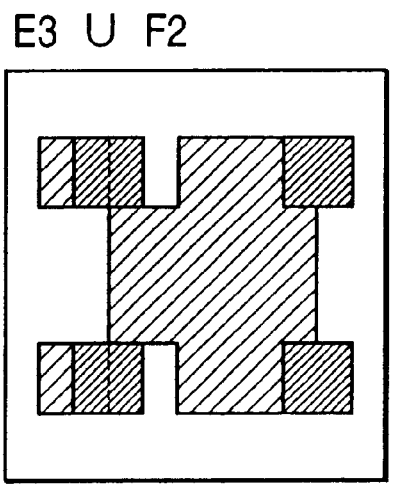
COMPARISON WITH Nor
IS THERE AREA OF
Nor ONLY ?
(b)
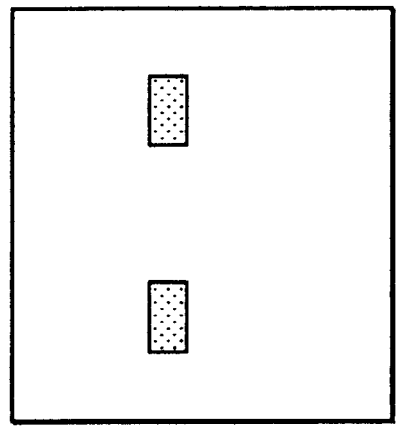
YES → NG FIG. 58
(a)
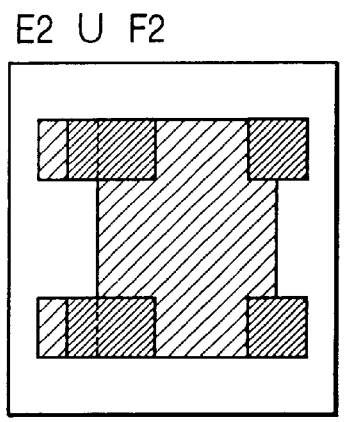
E2 ∪ F2
COMPARISON WITH Nor
IS THERE AREA OF
Nor ONLY ?
⇩
NO → OK
⇩
IS THERE AREA OF
E2 ∩ F2 ?
⇩
YES
⇩
REVISE E2 OR F2
SO AS TO SATISFY
DATA WIDTH CONDITION
⇩
OK
(b)
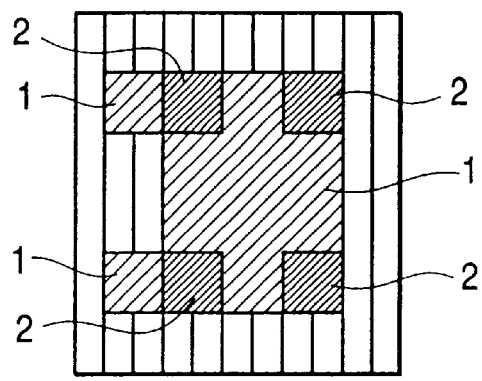

FIG. 59 {
(a)
E3 ∪ F3
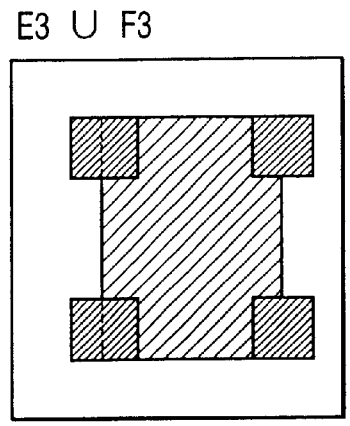
COMPARISON WITH Nor
IS THERE AREA OF
Nor ONLY ?
⇩
NO → OK
⇩
IS THERE AREA OF
E3 ∩ F3 ?
⇩
OK
(b)
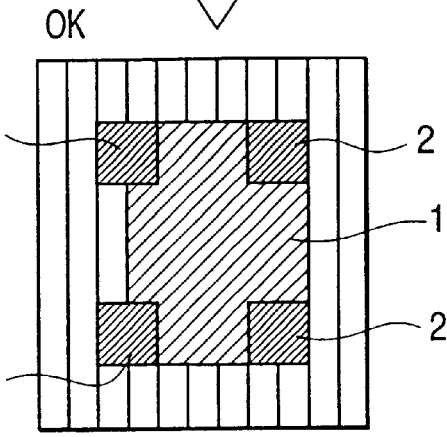

FIG. 61
(a) E3 U F2
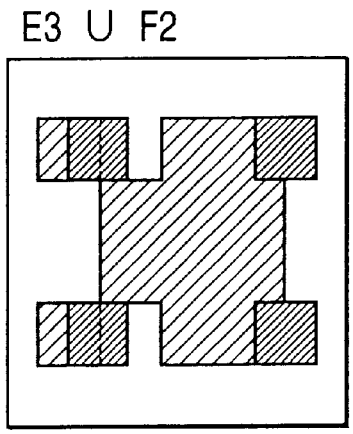
COMPARISON WITH Nor
IS THERE AREA OF
Nor ONLY ?
(b)
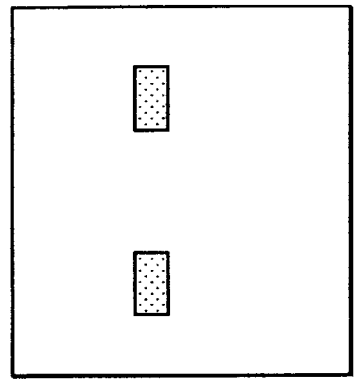
YES → NG

WAFER PROCESS

MASK PATTERN CREATING METHOD AND MASK PATTERN CREATING APPARATUS

BACKGROUND OF THE INVENTION

1. Field of the Invention

The present invention relates to a pattern creating apparatus and a pattern creating method and, more particularly, to those suitably applicable, for example, to the design of circuit patterns of photomasks or reticles used in an exposure step to expose a photosensitive substrate to exposure light in a microscopic circuit pattern in production of various devices such as semiconductor chips including IC, LSI, and so on, display elements including liquid crystal panels etc., detecting elements including magnetic heads etc., image pickup elements including CCD etc., and so on.

2. Related Background Art

For manufacturing the devices such as the IC, LSI, liquid crystal panels, and so on by the photolithography technology, it was conventional practice to employ projection exposure to project a circuit pattern of a photomask or a reticle or the like (hereinafter referred to as "mask") onto a photosensitive substrate such as a silicon wafer or a glass plate or the like (hereinafter referred to as "wafer") coated with a photoresist or the like by a projection optical system, so as to transfer (or expose) the circuit pattern thereonto.

In recent years, in response to the tendency toward higher integration of the above devices, there are demands for much finer patterns to be transferred onto the wafer, i.e., for increase of resolution to higher values. In the above projection exposure technology, which is the core of the microfabrication technology for wafers, therefore, the increase of resolution is now labored for forming an image (circuit pattern image) in the size (line width) of 0.3 µm or less.

A schematic diagram of a conventional projection exposure apparatus is illustrated in FIG. 19. In FIG. 19, reference numeral 191 designates an excimer laser as a light source for deep ultraviolet exposure, 192 an illumination optical system, 193 illumination light emerging from the illumination optical system 192, 194 a mask, 195 object-side exposure light emerging from the mask 194 and then entering an optical system (projection optical system) 196, 196 a demagnification type projection optical system, 197 image-side exposure light emerging from the projection optical system 196 and then entering a substrate 198, 198 a wafer being a photosensitive substrate, and 199 a substrate stage for holding the photosensitive substrate.

The laser light emitted from the excimer laser 191 is guided to the illumination optical system 192 by a routing optical system (190a, 190b) and is regulated by the illumination optical system 192 so as to be the illumination light 193 having predetermined light intensity distribution, distributed light distribution, spread angle (numerical aperture NA), etc., which illuminates the mask 194. In the mask 194 a pattern is made of chromium or the like on a quartz substrate and in the size equal to the inverse of a projection magnification of the projection optical system 196 (for example, two, four, or five) times a microscopic pattern to be formed on the wafer 198. The illumination light 193 is transmitted and diffracted by the microscopic pattern of the mask 194 to become the object-side exposure light 195.

The projection optical system 196 converts the object-side exposure light 195 to the image-side exposure light 197, which forms the microscopic pattern of the mask 194 on the wafer 198 at the above projection magnification and with well-suppressed aberration. The image-side exposure light 197, as illustrated in the enlarged view in the lower part of FIG. 19, converges at a predetermined numerical aperture NA (=sin(θ)) on the wafer 198 to form the image of the microscopic pattern on the wafer 198. When the microscopic pattern is successively transferred onto mutually different shot areas (areas to become one chip or plural chips) in the wafer 198, the substrate stage 199 is stepped along the image plane of the projection optical system to change the position of the wafer 198 relative to the projection optical system 196.

The above-stated projection exposure apparatus using the KrF excimer laser as a light source, which is presently becoming mainstream, has high resolving power, but it is technologically difficult to form a pattern image of not over 0.15 µm thereby, for example.

The projection optical system 196 has the limit of resolution determined from a trade-off between the optical resolution and the depth of focus originating in exposure wavelength (used in exposure). The resolution R and the depth of focus DOF of patterns resolved by the projection exposure apparatus are expressed by the Rayleigh's formula as indicated by Eq. (1) and Eq. (2) below.

$$R = k_1 (\lambda/NA) \quad (1)$$

$$DOF = k_2 (\lambda/NA^2) \quad (2)$$

In these equations, λ is the exposure wavelength, NA the numerical aperture on the image side to indicate brightness of the projection optical system 196, and $k_1$ and $k_2$ are constants determined by development process characteristics of the wafer 198 etc., which are normally values of about 0.5 to 0.7.

A potential way for improvement in the resolution to decrease the resolution R is "employment of higher NA" to increase the numerical aperture NA, but there is a limit of evolution in the employment of higher NA over a certain point, because the depth of focus DOF of the projection optical system 196 has to be kept at a value over a certain level in practical exposure. It is thus seen from these Eqs. (1), (2) that "shortening of wavelength" to decrease the exposure wavelength λ is eventually necessary for the improvement in the resolution.

There, however, arises a significant issue with progression in the wavelength shortening of the exposure wavelength. The issue is that there exists no glass material for the lenses constituting the projection optical system 196. Most of glass materials have transmittances close to 0 in the deep ultraviolet region and fused silica is available at present as a glass material produced for the exposure apparatus (the exposure wavelength of about 248 nm) by a special production method. The transmittance of this fused silica is also lowered quickly at the exposure wavelengths of not more than 193 nm.

It is very difficult to develop a practical glass material in the region of exposure wavelengths of not more than 150 nm corresponding to microscopic patterns having the line widths of 0.15 µm or below. The glass material to be used in the deep ultraviolet region also needs to satisfy plural conditions including durability, index uniformity, optical strain, workability, and so on, as well as the transmittance, which makes it doubtful whether there exists a practical glass material or not.

As described above, the conventional projection exposure methods and projection exposure apparatus need to decrease the exposure wavelength down to about 150 nm or less in order to form the patterns having the line widths of 0.15 µm or below on the wafer. Against it, there exists no practical glass material in this wavelength region at present, and thus no pattern has been allowed to be formed in the line width of 0.15 µm or below on the wafer.

U.S. Pat. No. 5,415,835 discloses the technology of forming the microscopic pattern by two-beam interference exposure, and this two-beam interference exposure permits formation of the pattern in the line width of 0.15 µm or below on the wafer.

The two-beam interference exposure will be explained referring to FIG. 15. In FIG. 15 the two-beam interference exposure is effected as follows; laser light L151 from laser 151, which has coherence and which is a bundle of parallel rays, is split into two beams, laser beams L151a, L151b, by half mirror 152 and the two split beams are reflected by respective plane mirrors 153a, 153b so as to make the two laser beams (parallel beams with coherence) intersect at a certain angle in the range greater than 0 but less than 90° on the surface of wafer 154, thereby forming interference fringes at the intersecting portion. A microscopic periodic pattern according to the light intensity distribution of the interference fringes is formed in the wafer 154 by exposing and printing the wafer 154 with the interference fringes (the light intensity distribution thereof).

Supposing the two beams L151a, L151b intersect on the wafer surface as inclined at the same angles on the respective sides with respect to the normal to the surface of the wafer 154, the resolution R in this two-beam interference exposure is expressed by Eq. (3) below.

$$R = \lambda/(4\sin\theta) \quad (3)$$
$$= \lambda/4NA$$
$$= 0.25(\lambda/NA)$$

In this equation, R represents the width of each of L&S (lines and spaces), i.e., the width of each of bright part and dark part of the interference fringes. Further, θ indicates the incident angle (absolute value) of each of the two beams to the image plane, and NA=sinθ.

When Eq. (3), which is the formula of resolution in the two-beam interference exposure, is compared with Eq. (1), which is the formula of resolution in the normal projection exposure, the resolution R of the two-beam interference exposure is equivalent to that where $k_1$=0.25 in Eq. (1), so that the two-beam interference exposure can achieve the resolution equal to two or more times the resolution of the normal projection exposure with $k_1$=0.5 to 0.7.

For example, when NA=0.6 at λ=0.248 nm (KrF excimer), we obtain R=0.10 µm, though it is not disclosed in the above U.S. Patent.

Since the two-beam interference exposure basically permits formation of only simple stripe patterns corresponding to the light intensity distribution (exposure amount distribution) of interference fringes, it is not easy to form a circuit pattern of a desired shape on the wafer.

Then above U.S. Pat. No. 5,415,835 suggests formation of isolated lines (line pattern) by multiple exposure in which a resist of the wafer is exposed to the exposure amount distribution corresponding to the interference fringes formed by the two-beam interference exposure and thereafter the normal exposure is carried out using the exposure apparatus and a mask with certain apertures formed therein, thereby providing the wafer with a desired exposure amount distribution.

SUMMARY OF THE INVENTION

An object of the present invention is to provide a pattern creating apparatus and a pattern creating method used in the design stage of mask patterns for multiple exposure.

This multiple exposure is exposure steps to expose the same region on the photosensitive substrate to mutually different light patterns without intervention of a developing treatment step.

The present application discloses a pattern creating apparatus comprising: first pattern handling means for preparing and/or displaying first pattern data; second pattern handling means for preparing and/or displaying second pattern data; characteristic parameter handling means for inputting and/or displaying a characteristic parameter for a pattern forming operation; multiple image computing means for carrying out an operation based on the first pattern data and the second pattern data outputted respectively from said first pattern handling means and from the second pattern handling means and based on the characteristic parameter outputted from said characteristic parameter handling means to output forming pattern data of the result of the operation; and forming pattern handling means for displaying said forming pattern data, wherein said first pattern handling means can input at least one of a period, a position, and a gradient of the first pattern, wherein said first pattern handling means displays at least one of a period, a position, and a gradient of the first pattern, wherein said first pattern handling means handles a pattern formed by overlay of plural periodic first patterns, wherein said second pattern handling means displays at least one of a position, a size, and a gradient of the pattern, and wherein said multiple image computing means performs an addition operation to calculate the sum of gradient data at one common position in the first pattern data and the second pattern data and outputs the addition result and wherein said multiple image computing means multiplies the data outputted after the addition operation by a filtering coefficient for each gradient given by said characteristic parameter handling means to obtain gradient data at each position and outputs the gradient data.

The present application also discloses another pattern creating apparatus comprising: first pattern handling means for preparing and/or displaying first pattern data; second pattern handling means for preparing and/or displaying second pattern data; characteristic parameter handling means for inputting and/or displaying a characteristic parameter for a pattern forming operation; forming pattern handling means for inputting and/or displaying final forming pattern data; and multiple image computing means adapted so that when data is inputted from three handling means out of said four handling means, the multiple image computing means computes and outputs one rest data, wherein said multiple image computing means carries out such an optimization operation as not to contradict with a forming pattern operation process to obtain forming pattern data by an operation based on the first pattern data and second pattern data outputted respectively from said first pattern handling means and from the second pattern handling means and based on the characteristic parameter outputted from said characteristic parameter handling means, and wherein said forming pattern operation process comprises steps of performing an addition operation to calculate the sum of gradient data at one common position in the first pattern data and in the second pattern data, outputting the addition result, multiplying the data outputted after the addition operation by a filtering coefficient for each gradient given by said characteristic parameter handling means to obtain gradient data at each position, and outputting the gradient data.

The present application discloses another pattern creating apparatus comprising: first pattern handling means for preparing and/or displaying first pattern data or/and first pattern image data; second pattern handling means for preparing and/or displaying second pattern data or/and second pattern image data; characteristic parameter handling means for inputting and/or displaying a characteristic parameter for a pattern forming operation; forming pattern handling means for inputting and/or displaying final forming pattern data; image computing means for carrying out an operation of first pattern image data to be generated through an exposure apparatus from the first pattern data and an operation of inversion thereof and for carrying out an operation of second pattern image data to be generated through the exposure apparatus from the second pattern data and an operation of inversion thereof to output the operation result; and multiple image computing means adapted so that when data is inputted from three handling means out of said four handling means, the multiple image computing means computes and outputs one rest data, wherein said multiple image computing means carries out such an optimization operation as not to contradict with a forming pattern operation process to obtain forming pattern data by an operation based on the first pattern data and the second pattern data outputted respectively from said first pattern handling means and from the second pattern handling means and based on the characteristic parameter outputted from said characteristic parameter handling means, and wherein said forming pattern operation process comprises steps of performing an addition operation to calculate the sum of gradient data at one common position in the first pattern data and in the second pattern data, outputting the addition result, multiplying the data outputted after the addition operation by a filtering coefficient for each gradient given by said characteristic parameter handling means to obtain gradient data at each position, and outputting the gradient data.

The present application also discloses a pattern creating method wherein multiple image computing means carries out an operation, using first pattern data prepared by first pattern handling means, second pattern data prepared by second pattern handling means, and a characteristic parameter for a pattern forming operation inputted by characteristic parameter handling means, and outputs forming pattern data of the result of the operation to forming pattern handling means. Further, the present application also discloses another pattern computing method wherein, using data from either three handling means out of data from four handling means including first pattern data prepared by first pattern handling means, second pattern data prepared by second pattern handling means, a characteristic parameter for a pattern forming operation inputted by characteristic parameter handling means, and final forming pattern data prepared by forming pattern handling means, one rest data is computed and outputted.

An exposure method of the present invention is a method of exposing a photosensitive substrate with the mask pattern obtained by making use of either one of the pattern computing apparatus stated above.

Another exposure method of the present invention is a method for exposing a photosensitive substrate with the mask pattern obtained by making use of either one of the pattern computing methods stated above.

An exposure apparatus of the present invention has an exposure mode in which a pattern on a mask is transferred onto a photosensitive substrate by use of either one of the exposure methods described above.

A production method of device according to the present invention has steps of exposing a wafer surface to a pattern on a mask surface by use of the above exposure apparatus and thereafter developing the wafer.

A mask of the present invention is produced by making use of either one of the pattern computing apparatus stated above.

A software program of the present invention is characterized by being programmed based on either one of the computing methods stated above.

A memory medium of the present invention is characterized by storing the above software program.

Another mask pattern creating method of the present invention is a mask pattern creating method comprising: a step of preparing data of a target pattern desired to form after exposure; a step of carrying out a logical operation of predetermined micro-line pattern data and said target pattern data; a step of dividing a surface of a mask pattern into plural types of areas, based on the result of the logical operation; a step of setting a light transmittance or a plurality of light transmittances required or allowed for the types of areas and grouping areas for which one light transmittance can be selected, in each light transmittance; and a step of synthesizing a synthetic pattern from grouped patterns formed in the respective light transmittances, wherein data of the synthetic pattern is used as data of the mask pattern.

Another mask pattern creating apparatus of the present invention is a mask pattern creating apparatus comprising: means for storing data of a target pattern desired to form after exposure and predetermined micro-line pattern data; means for carrying out a logical operation of said micro-line pattern data and target pattern data; means for dividing a surface of a mask pattern into plural types of areas, based on the result of the logical operation; means for setting a light transmittance or a plurality of light transmittances required or allowed for the types of areas and for grouping areas for which one light transmittance can be selected, in each light transmittance; means for synthesizing a synthetic pattern from grouped patterns formed in the respective light transmittances; and means for displaying and/or outputting data of the synthetic pattern as data of the mask pattern.

The above mask pattern creating technology of the present invention is preferably provided with a step or means of determining whether a grouped pattern comprised of the grouped areas satisfies a predetermined mask pattern design rule and revising a grouped pattern not satisfying the design rule so that the grouped pattern satisfies the design rule. Each of the pattern areas divided in the respective light transmittances on the mask pattern satisfies the mask pattern design rule, whereby the shape and light transmittances of the mask pattern can be exposed on the exposed substrate with good repeatability (faithful to setting) and whereby the target pattern can be formed on the exposed substrate with better repeatability.

Another mask pattern creating method of the present invention is a mask pattern creating method comprising: a step of preparing data of a target pattern desired to form after exposure; a step of carrying out a logical operation of predetermined micro-line pattern data and said target pattern data; a step of dividing a surface of a mask pattern into plural types of areas, based on the result of the logical operation; a step of setting a light transmittance or a plurality of light transmittances required or allowed for the types of areas and grouping areas for which one light transmittance can be selected, in each light transmittance; a first revising step of determining whether each of the grouped patterns comprised of the grouped areas satisfies a predetermined mask pattern design rule, and revising a grouped pattern not satisfying the design rule so that the grouped pattern satisfies the design rule; and a step of synthesizing a synthetic pattern from grouped patterns formed in the respective light transmittances and revised if necessary, wherein data of the synthetic pattern is used as data of the mask pattern, said mask pattern creating method further comprising: a second revising step of determining whether the synthetic pattern satisfies said design rule and revising the synthetic pattern if the synthetic pattern does not satisfy the design rule; a selection step carried out when each revising step results in obtaining a plurality of revision results for one grouped pattern or synthetic pattern or when said synthesizing step results in obtaining a plurality of synthesis results and, as a result, if said mask pattern data includes a plurality of mask pattern data, said selection step comprising computing images corresponding to the respective mask pattern data and selecting one of the data, based on the obtained image data.

Another mask pattern creating apparatus of the present invention is a mask pattern creating apparatus comprising: means for storing data of a target pattern desired to form after exposure and predetermined micro-line pattern data; means for carrying out a logical operation of said micro-line pattern data and target pattern data; means for dividing a surface of a mask pattern into plural types of areas, based on the result of the logical operation; means for setting a light transmittance or a plurality of light transmittances required or allowed for the types of areas and for grouping areas for which one light transmittance can be selected, in each light transmittance; first revising means for determining whether each of the grouped patterns comprised of the grouped areas satisfies a predetermined mask pattern design rule and for revising a grouped pattern not satisfying the design rule so that the grouped pattern satisfies the design rule; means for synthesizing a synthetic pattern from the grouped patterns formed in the respective light transmittances and revised if necessary and for outputting data of the synthetic pattern as data of the mask pattern; second revising means for determining whether the synthetic pattern satisfies said design rule and for revising the synthetic pattern if the synthetic pattern does not satisfy the design rule; and means adapted so that when each of said revising means obtains a plurality of revision results for one grouped pattern or synthetic pattern or when said synthesizing means obtains a plurality of synthesis results and, as a result, if said mask pattern data includes a plurality of mask pattern data, said means computes images corresponding to the respective mask pattern data and selects one of the images, based on the obtained image data.

Most of the above mask pattern creating technology of the present invention can be executed by the computer and a data preparing person needs only to prepare and input the data (target pattern data) of the same shape as a pattern desired to form finally on the resist. Generation of the mask pattern data thereafter can be carried out automatically by the computer according to the above procedures, so that the optimal mask pattern can be created efficiently even in the design of large-scale semiconductor integrated circuits.

Since each of the pattern areas divided in the respective light transmittances on the mask pattern is revised so as to satisfy the mask pattern design rule, the shape and light transmittances of the mask pattern can be exposed on the exposed substrate with good repeatability (faithful to setting) and the target pattern can thus be formed on the exposed substrate with better repeatability.

BRIEF DESCRIPTION OF THE DRAWINGS

FIG. 11A, FIG. 11B, and FIG. 11C are explanatory diagrams to show Embodiment 2 of the present invention;

FIG. 29 is a block diagram of major part of Embodiment 4 of the pattern computing apparatus and pattern computing method according to the present invention;

FIG. 37 is an explanatory diagram to show a way up to generation of a first rough mask pattern candidate by combining revised patterns E2 and F2 of FIG. 35 and FIG. 36, resizing each weight area, and setting a transmittance according to the weight of each area;

FIG. 38 is an explanatory diagram to show a way up to generation of a second rough mask pattern candidate by combining revised patterns E3 and F3 of FIG. 35 and FIG. 36, resizing each weight area, and setting a transmittance according to the weight of each area;

FIG. 40 is an explanatory diagram to show an inappropriate pattern for a rough mask pattern candidate as a result of combining the revised patterns E3 and F2 of FIG. 35 and FIG. 36 and resizing each weight area;

FIG. 58 is an explanatory diagram to show a way up to generation of a first rough mask pattern candidate by combining revised patterns E2 and F2 of FIG. 56 and FIG. 57, resizing each weight area, and setting a transmittance according to the weight of each area;

FIG. 59 is an explanatory diagram to show a way up to generation of a second rough mask pattern candidate by combining revised patterns E3 and F3 of FIG. 56 and FIG. 57, resizing each weight area, and setting a transmittance according to the weight of each area;

FIG. 61 is an explanatory diagram to show an inappropriate pattern for a rough mask pattern candidate as a result of combining the revised patterns E3 and F2 of FIG. 56 and FIG. 57 and resizing each weight area;

DETAILED DESCRIPTION OF THE PREFERRED EMBODIMENTS

Figure 1:
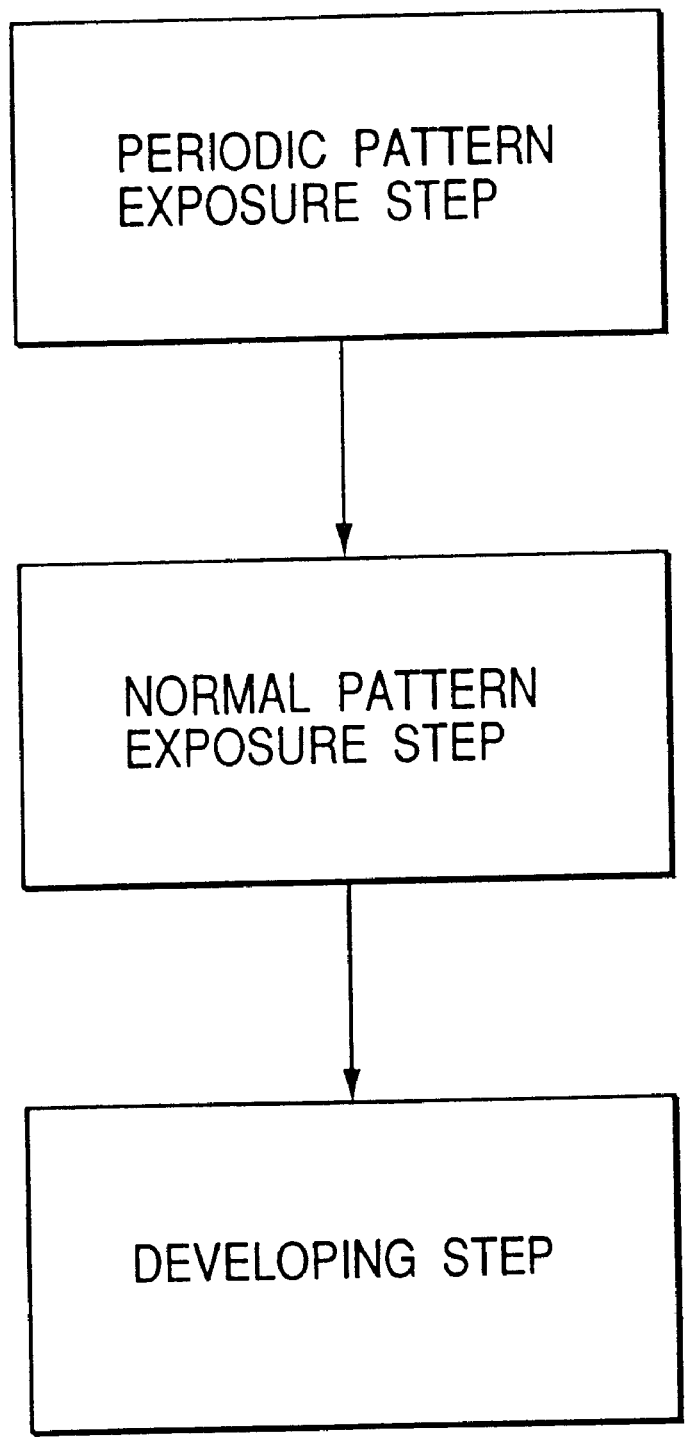
FIG. 1 is a flowchart of an exposure method according to the present invention.

First described is an example of an exposure method for carrying out the multiple exposure to form any desired pattern on a photosensitive substrate.

The present invention provides a computing method and a computing apparatus of a mask pattern suitably applicable to the technology for creating elements (devices) by the multiple exposure, and use of the computing method and computing apparatus permits more efficient design of the mask pattern as to the production of elements with the pattern in the resolution of 0.15 μm or below.

The method and apparatus stated herein are those having micro-line pattern handling means for preparing and/or displaying periodic micro-line pattern data, rough pattern handling means for preparing and/or displaying arbitrary rough pattern data, resist characteristic handling means for inputting and/or displaying a resist characteristic for a pattern forming operation, pattern operation means for carrying out an operation based on the micro-line pattern data and the rough pattern data outputted respectively from the micro-line pattern handling means and the rough pattern handling means and based on a parameter of the resist characteristic outputted from the resist characteristic handling means to output forming pattern data of the operation result, and forming pattern displaying means for displaying the forming pattern data, wherein the pattern operation means is means for carrying out an addition operation to compute the sum of exposure light intensity data at a common position in the micro-line pattern data and in the rough pattern data to output the sum and for multiplying the output sum data by an exposure sensitivity and a remaining film characteristic at each exposure light intensity, which are the input resist characteristic, to obtain remaining film thickness data at each position or the like.

They are also characterized by having micro-line pattern handling means for preparing and/or displaying periodic micro-line pattern data, rough pattern handling means for preparing and/or displaying arbitrary rough pattern data, resist characteristic handling means for inputting and/or displaying a characteristic parameter for a pattern forming operation, and forming pattern handling means for inputting and/or displaying final forming pattern data, and by further having optimization operation means adapted so that when data is inputted from either three handling means out of said four handling means, the optimization operation means outputs one rest data.

Further, the aforementioned optimization operation means is also provided with a function of carrying out such an optimization operation as not to contradict with the forming pattern operation process in which the forming pattern data is obtained by the operation based on the micro-line pattern data and the rough pattern data outputted respectively from the micro-line pattern handling means and the rough pattern handling means and based on the resist characteristic parameter outputted from the resist characteristic handling means.

FIG. 1 to FIG. 9B are explanatory diagrams to show an embodiment of the multiple exposure method. FIG. 1 is a flowchart to show the multiple exposure method. FIG. 1 shows each block of a periodic pattern (micro-line pattern) exposure step, a normal projection exposure step (rough pattern exposure step), and a developing step constituting the multiple exposure method, and the flow thereof. In the same figure the order of the periodic pattern exposure step and the projection exposure step can be reverse or, where either one step includes a plurality of exposure stages, the steps can be carried out alternately. Although a step of precise positioning or the like is present between the exposure steps, it is omitted from this illustration.

The exposure method and exposure apparatus according to the present invention are characterized by double exposure to carry out the periodic pattern exposure and the normal exposure on a substrate to be exposed (a photosensitive substrate).

The normal pattern exposure herein is exposure to permit formation of an arbitrary pattern, though in a lower resolution than in the periodic pattern exposure, which is, for example, the projection exposure to project the pattern of the mask by the projection optical system.

The pattern exposed by the normal pattern exposure (a rough pattern) includes a microscopic pattern of not over the resolution in addition to a large pattern over the resolution of the projection exposure apparatus used, while the periodic pattern exposure forms a periodic pattern in a line width approximately equal to that of the microscopic pattern. The line width of the large pattern over the resolution in the normal pattern exposure is not limited to the line width of the periodic pattern exposure, but it is effective to define the line width of the large pattern as an integral multiple of the line width of the periodic pattern exposure.

The shape of the large pattern in the normal pattern exposure is arbitrary and can be oriented in various directions. Many general IC patterns are often directed in two orthogonal directions and finest patterns are often limited to orientation in only one specific direction.

In the multiple exposure of FIG. 1 the direction of the periodic pattern is aligned with the direction of the finest pattern in the normal pattern during the periodic pattern exposure. A center of a peak of an exposure amount distribution of the periodic pattern is aligned with a center of the microscopic pattern of not over the resolution in the normal pattern.

Each of the periodic pattern exposure and the normal pattern exposure in the exposure method and exposure apparatus according to the present invention is comprised of a single exposure stage or a plurality of exposure stages and, in cases where the exposure includes a plurality of exposure stages, the photosensitive substrate is exposed to an exposure amount distribution differing every exposure stage.

Figure 2B:
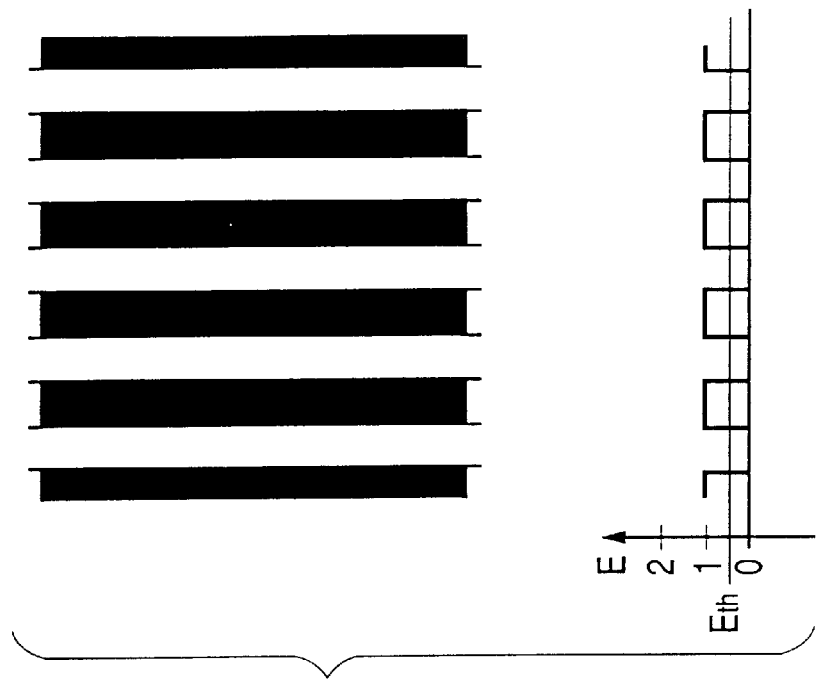
FIG. 2A and FIG. 2B are explanatory diagrams to show exposure patterns by the two-beam interference exposure.
Figure 2A:
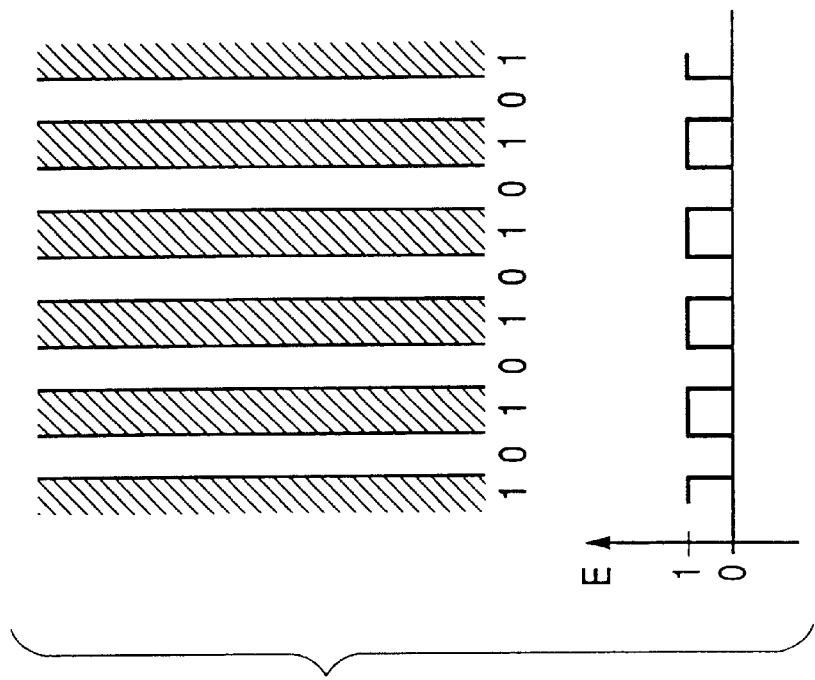

When the exposure is carried out according to the flow of FIG. 1, the wafer (photosensitive substrate) is first exposed by the periodic pattern as illustrated in FIGS. 2A and 2B in the periodic pattern exposure step. Numerals in FIGS. 2A and 2B indicate exposure amounts, and the hatched portions of FIG. 2A are of exposure amount 1 (which is arbitrary in fact) while blank portions are of exposure amount 0.

In cases where a resist pattern is formed by development subsequent to the exposure of only this periodic pattern, an exposure threshold Eth of the resist of the photosensitive substrate is normally set between the exposure amounts 0 and 1 as illustrated in a graph in the lower part of FIG. 2B. The upper part of FIG. 2B shows a lithography pattern (a pattern of projections and depressions) finally obtained.

Figure 3A:
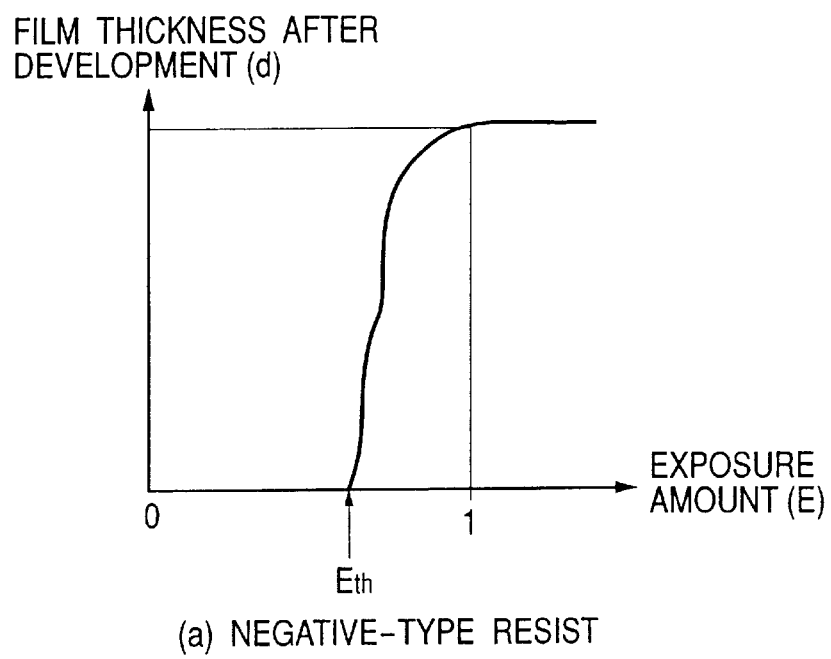
FIG. 3A and FIG. 3B are explanatory diagrams to show exposure sensitivity characteristics of respective resists.
Figure 3B:
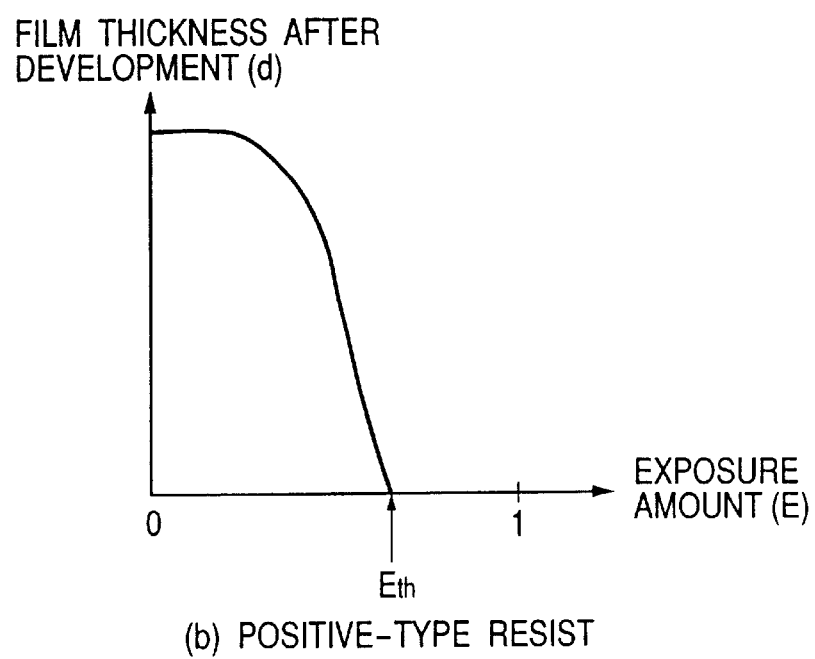

FIG. 3A and FIG. 3B show exposure amount dependence of film thickness after development and the exposure threshold for each of resists of the photosensitive substrate in this case, i.e., for a positive type resist (hereinafter referred to as "positive type") and a negative type resist (hereinafter referred to as "negative type"). In the case of the positive type the film thickness after development is 0 when the exposure amount is not less than the exposure threshold Eth;

whereas in the case of the negative type the film thickness after development is 0 when the exposure amount is not more than the exposure threshold Eth.

Figure 4:
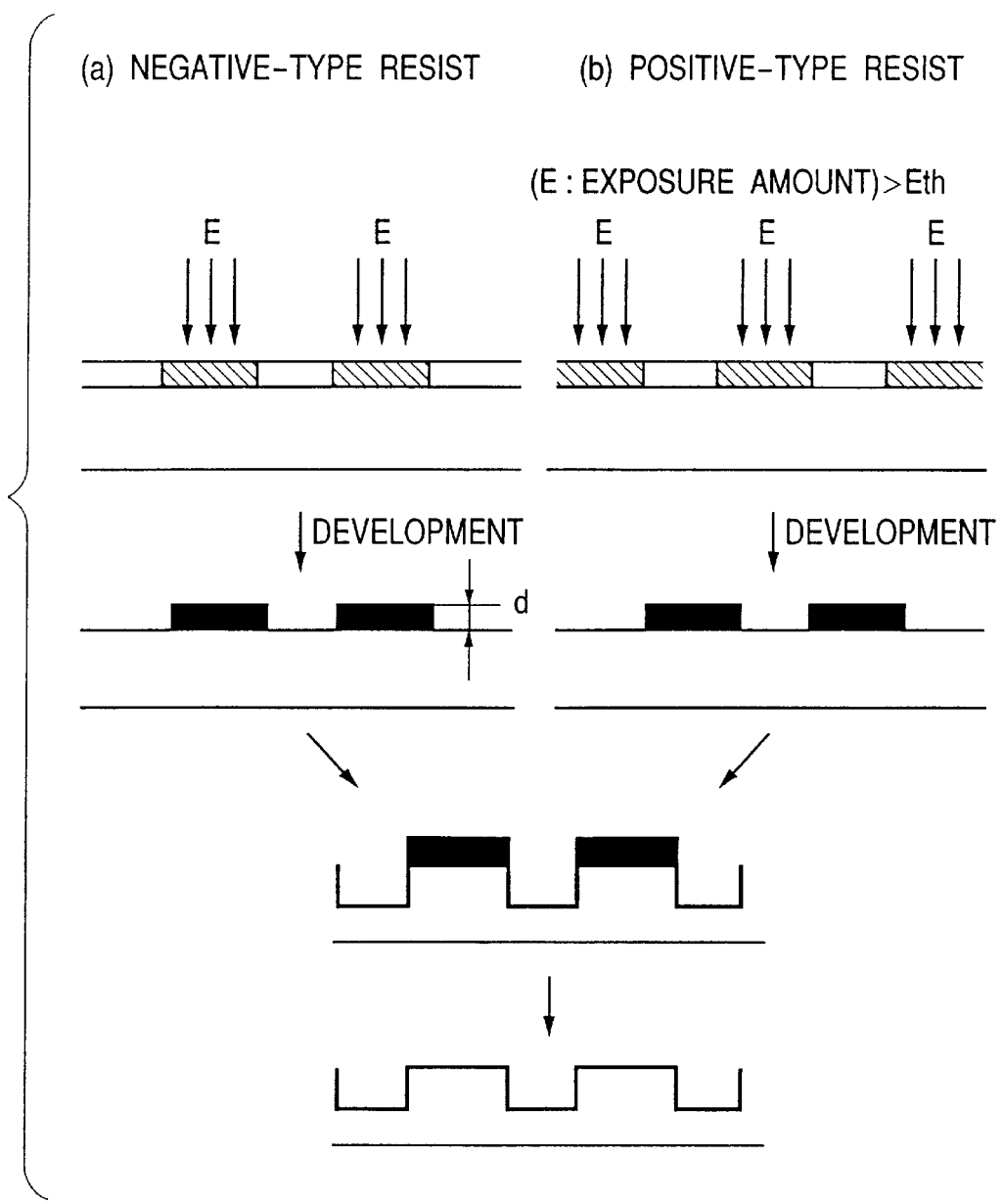
FIG. 4 is an explanatory diagram to show pattern formation by development.

FIG. 4 is a schematic diagram to show how the lithography pattern is formed via the development and etching process after such exposure, in the case of the negative type and the positive type.

Figure 5:
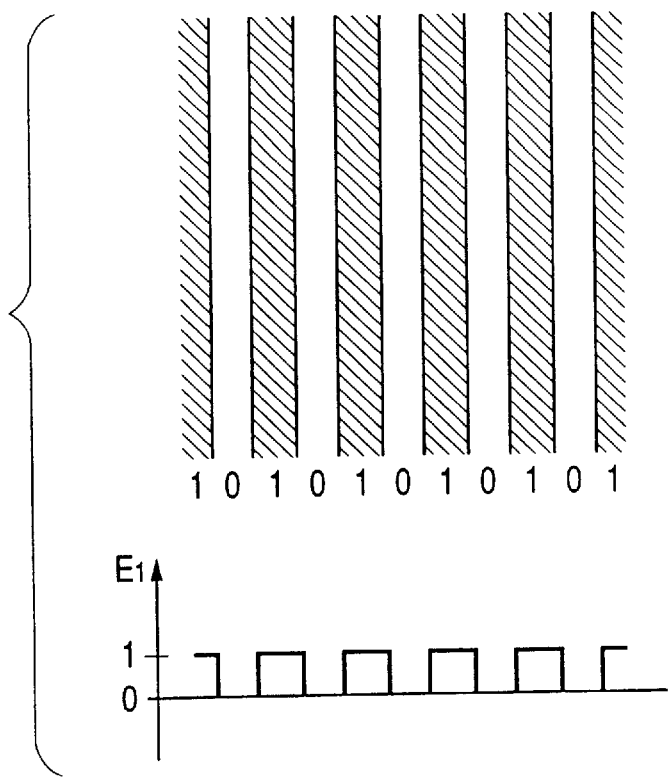
FIG. 5 is an explanatory diagram to show an exposure pattern by the ordinary two-beam interference exposure.
Figure 6:
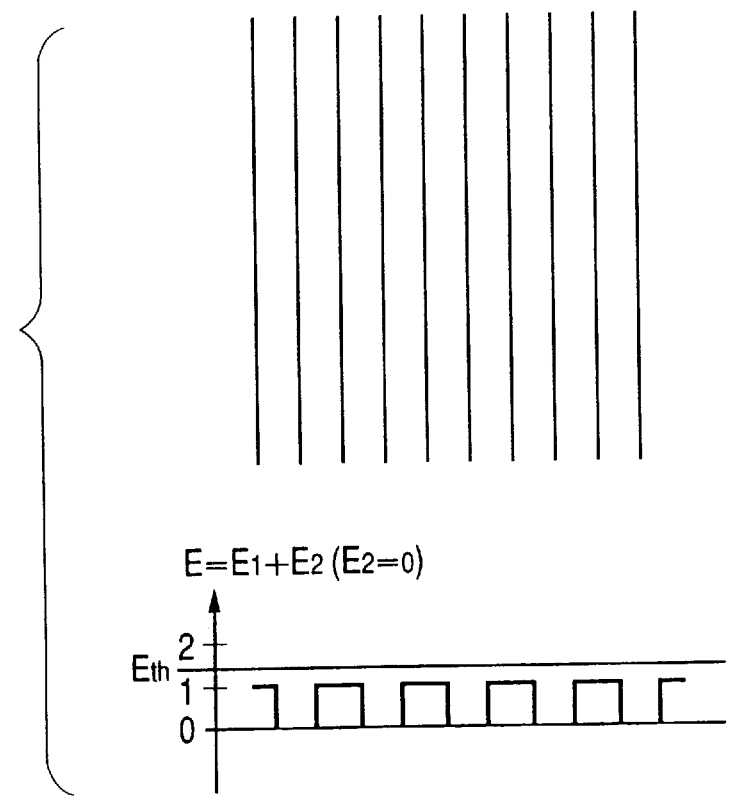
FIG. 6 is an explanatory diagram to show an exposure pattern by the two-beam interference exposure in the present invention.

In the present embodiment, different from this setting of the normal exposure sensitivity, the exposure threshold Eth of the resist of the exposed substrate is set greater than 1, where the maximum exposure amount in the periodic pattern exposure is 1, as illustrated in FIG. 5 and FIG. 6. When this photosensitive substrate is exposed to the exposure pattern (exposure amount distribution) by only the periodic pattern exposure illustrated in FIGS. 2A and 2B is subjected to development, it is short of the exposure amount, and thus there appears no portion having the thickness of 0 after the development, though there is a little variation in film thickness. Therefore, the lithography pattern is not formed by etching. This can be regarded as disappearance of the periodic pattern. (The present invention is described herein using the example of the negative type, but the present invention can also be applied to the cases of the positive type.)

In FIG. 6, the upper part shows the lithography pattern though nothing is formed therein, and the graph in the lower part shows the relationship between the exposure amount distribution and the exposure threshold. In the lower part $E_1$ indicates the exposure amount in the periodic pattern exposure and $E_2$ the exposure amount in the normal projection exposure.

A feature of the present embodiment is that the exposure pattern of the high resolution visually disappearing after only the periodic pattern exposure is combined with the exposure pattern of the arbitrary shape including the pattern in the size of not over the resolving power of the exposure apparatus and the large pattern by the normal projection exposure to effect exposure over the exposure threshold Eth of the resist on a selective basis in only desired areas, whereby the desired lithography pattern can be formed at last.

Figure 7B:
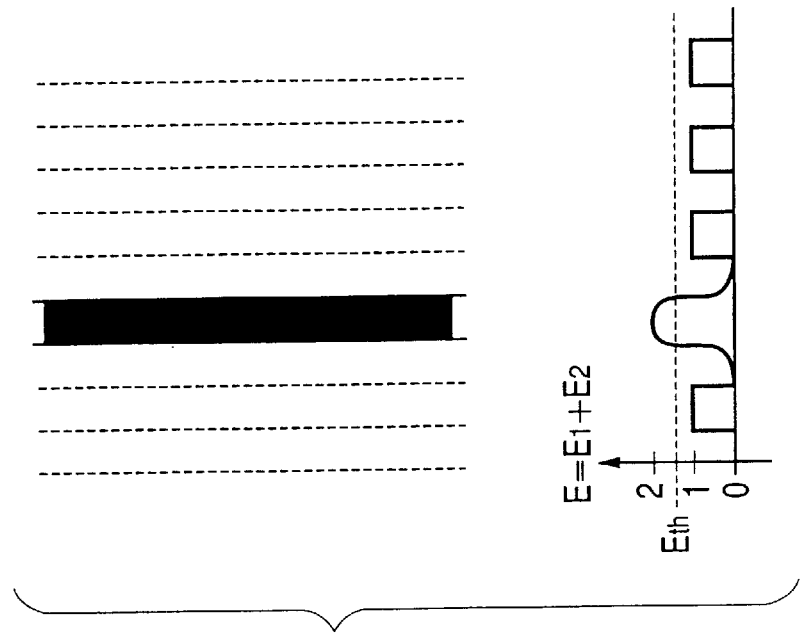
FIG. 7A and FIG. 7B are explanatory diagrams to show an example of an exposure pattern (a lithography pattern) that can be formed in Embodiment 1 of the present invention.
Figure 7A:
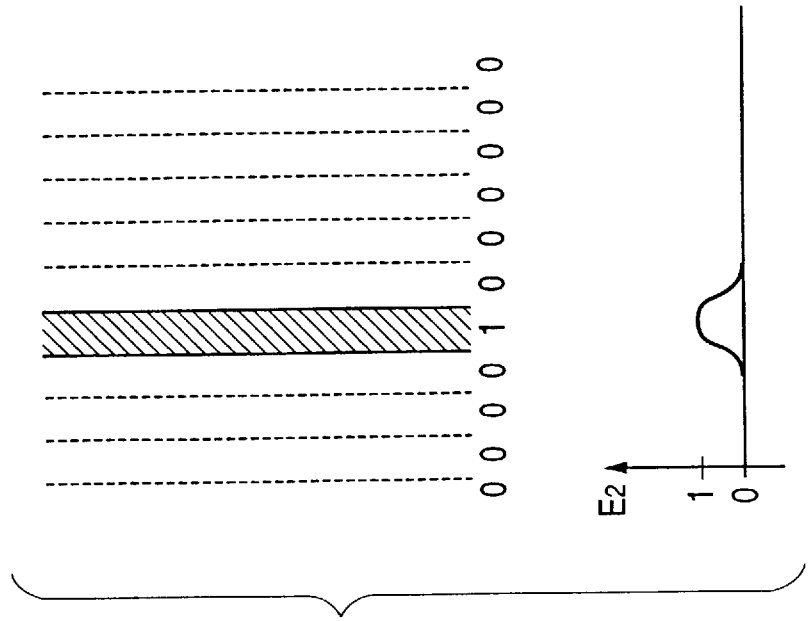

FIG. 7A shows an exposure pattern of a pattern of not over the resolution by the normal projection exposure (normal pattern exposure). Since the pattern is a microscopic pattern of not over the resolving power of the apparatus, the intensity distribution is unsharp and spread on the exposed object while failing to resolve the pattern. In the present embodiment the microscopic pattern has the line width equal to approximately a half of the resolution of the normal projection exposure.

If the projection exposure to form the exposure pattern of FIG. 7A is carried out without a developing step after the periodic pattern exposure of FIG. 5 as being overlaid on the same area in the same resist, the total exposure amount distribution on the resist surface will be one as illustrated in the graph in the lower part of FIG. 7B. In this example a ratio of the exposure amount $E_1$ of the periodic pattern exposure to the exposure amount $E_2$ of the projection exposure is 1:1 and the exposure threshold Eth of the resist is set between the exposure amount $E_1$ (=1) and the sum (=2) of the exposure amount $E_1$ and the exposure amount $E_2$ of the projection exposure; therefore, the lithography pattern is formed as illustrated in the upper part of FIG. 7B.

On that occasion, alignment is made so that the center of the microscopic pattern in the normal pattern is aligned with a peak of the exposure amount distribution of the periodic pattern. Further, the direction of the normal pattern is aligned with the direction of the periodic pattern.

The isolated line pattern shown in the upper part of FIG. 7B is a pattern having the resolution equal to that of the periodic pattern exposure and is not the simple periodic pattern. Therefore, the pattern is obtained in the higher resolution than that achieved by the normal projection exposure.

Figure 8B:
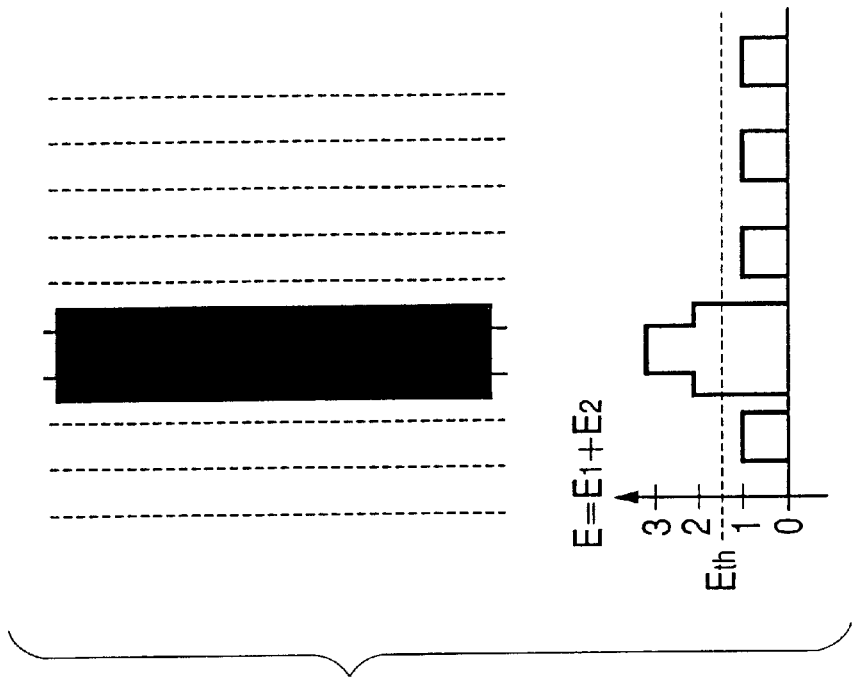
FIG. 8A and FIG. 8B are explanatory diagrams to show another example of an exposure pattern (a lithography pattern) that can be formed in Embodiment 1 of the present invention.
Figure 8A:
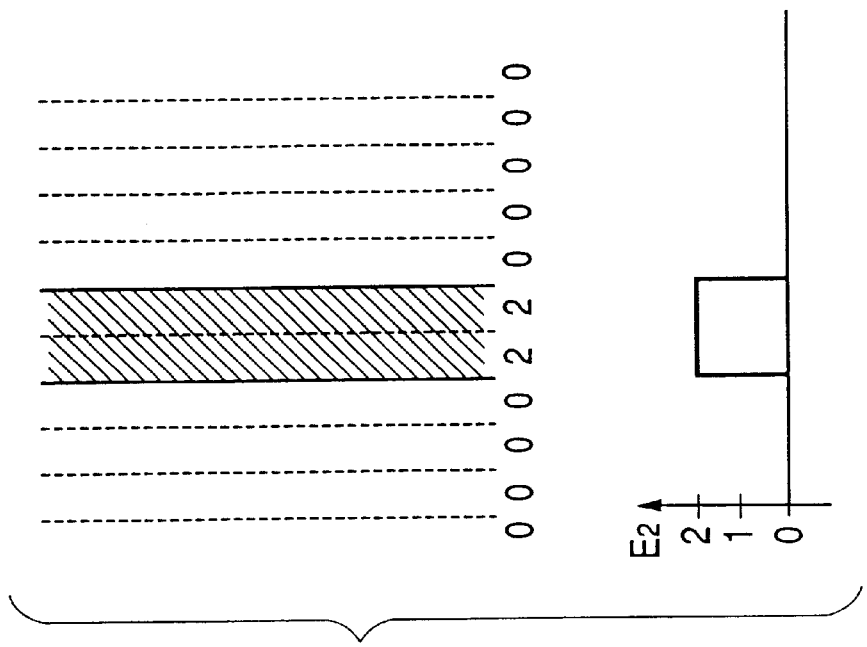

Let us here suppose that the projection exposure to form the exposure pattern of FIGS. 8A and 8B (which is the projection exposure over the exposure threshold (the exposure amount of double the threshold in this example) in double the line width of the exposure pattern of FIG. 5) is superimposed on the same area in the same resist without the developing step after the periodic pattern exposure of FIG. 5. On this occasion, the center of the microscopic pattern in the normal pattern is aligned with the peak position of the exposure amount distribution of the periodic pattern exposure, whereby a good pattern image can be obtained with good symmetry of the superimposed pattern.

The total exposure amount distribution of this resist is as illustrated in FIG. 8B and only the lithography pattern by the projection exposure is formed finally while the exposure pattern of the two-beam interference exposure (periodic pattern exposure) disappears.

Figure 9B:
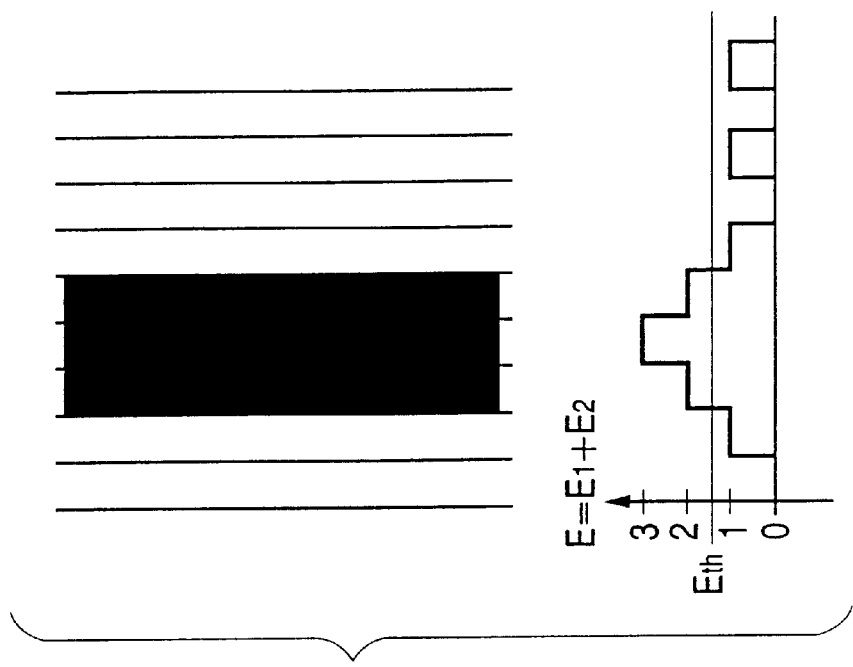
FIG. 9A and FIG. 9B are explanatory diagrams to show another example of an exposure pattern (a lithography pattern) that can be formed in Embodiment 1 of the present invention.
Figure 9A:
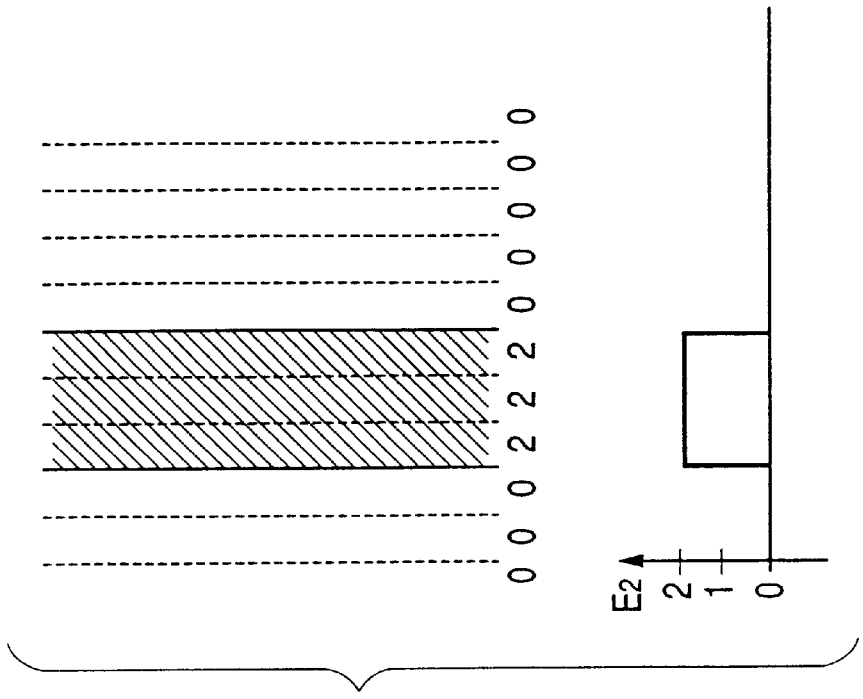

The same principle can also be applied to exposure in the line width equal to three times that of the exposure pattern of FIG. 5, as illustrated in FIGS. 9A and 9B, and that the line width of the lithography pattern finally obtained by the exposure pattern having the line width of four or more times is apparent basically from combination of the exposure pattern having the line width of two times with the exposure pattern having the line width of three times. Therefore, they are not illustrated. It is thus noted that the present embodiment can also form all the lithography patterns that can be realized by the projection exposure.

By controlling the exposure amount distribution (absolute value and distribution shape) in each of the periodic pattern exposure and the projection exposure and the threshold Eth of the resist of the photosensitive substrate as briefly described above, a circuit pattern can be formed in combination of the various types of patterns as illustrated in FIG. 6, FIG. 7B, FIG. 8B, and FIG. 9B and in the minimum line width approximately equal to the resolution (of the pattern of FIG. 7B) of the periodic pattern exposure.

The principle of the multiple exposure method described above can be summarized as follows.

(a-1) A pattern area without the projection exposure (normal pattern exposure), i.e., the periodic exposure pattern below the exposure threshold Eth of the resist disappears after developed.

(a-2) As to a pattern area of the projection exposure where the exposure amount is below the exposure threshold Eth of the resist, an exposure pattern is formed in the resolution of the periodic pattern exposure determined by combination of patterns of the projection exposure and the periodic pattern exposure.

(a-3) When a pattern area of the projection exposure has the exposure amount over the exposure threshold Eth, it is formed as an exposure pattern as it is.

Further, the exposure method has the advantage in that a much larger depth of focus can be obtained than in the case of the normal exposure, because exposure of the periodic pattern exposure of the highest resolution is carried out by the two-beam interference exposure.

In the above description the periodic pattern exposure was carried out first in the order of the periodic pattern exposure and the projection exposure, but the order is not limited to this.

Figure 10:
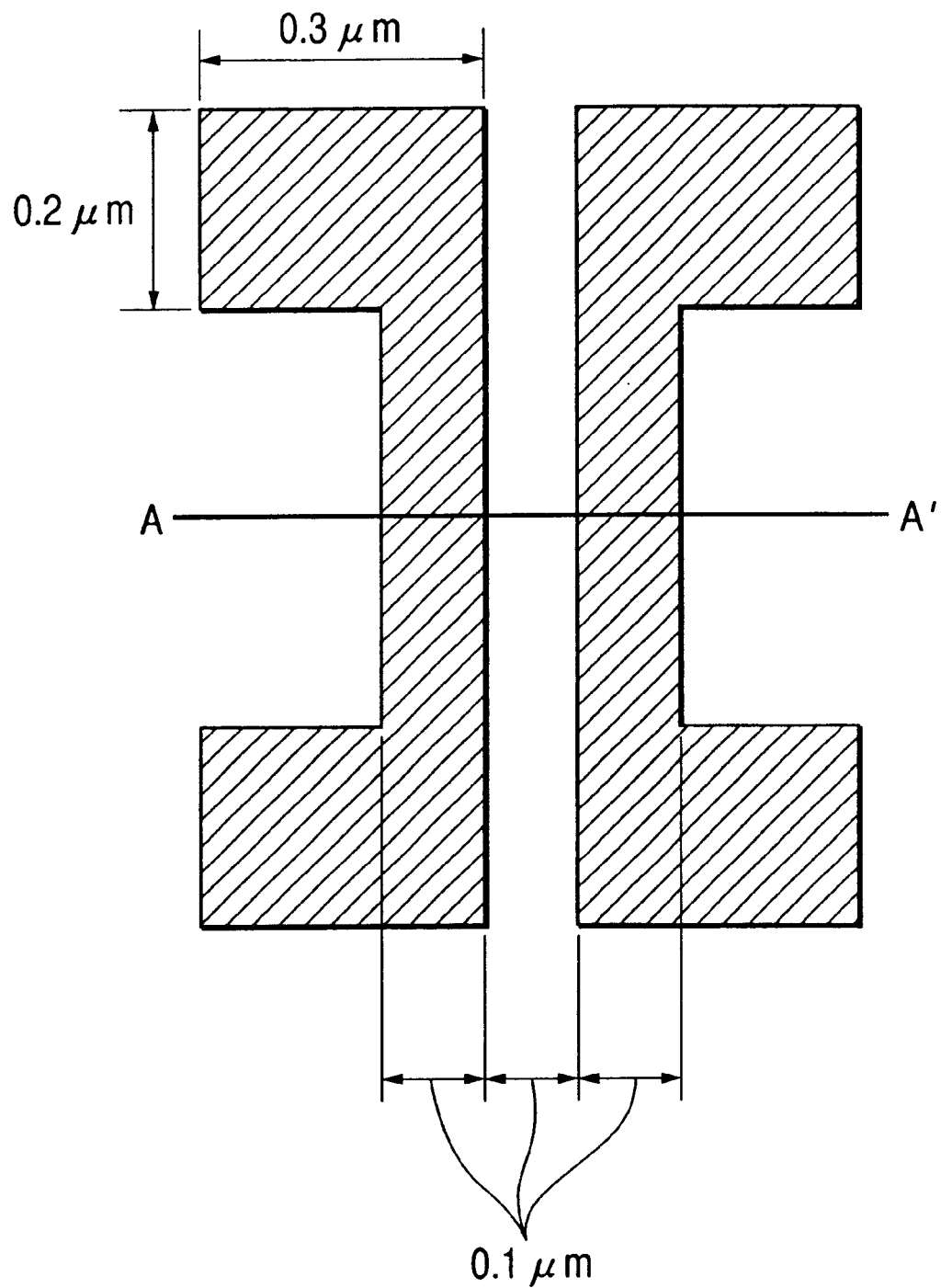
FIG. 10 is an explanatory diagram to show a gate pattern according to Embodiment 2 of the present invention.

FIG. 10 shows a so-called gate type pattern as a circuit pattern (lithography pattern) obtained by use of the above multiple exposure method.

The gate pattern of FIG. 10 has the minimum line width of 0.1 μm in the lateral direction, i.e., in the direction along A–A' in the figure, but the line width of 0.2 μm or more in the longitudinal direction. For forming this two-dimensional pattern in which the high resolution is required only in a one-dimensional direction, according to the present invention, the two-beam interference exposure (periodic pattern exposure) is carried out in only the one-dimensional direction in which such a high resolution is required.

FIGS. 11A to 11C show an example of combination of the two-beam interference exposure only in the one-dimensional direction with the normal projection exposure.

In FIGS. 11A to 11C, FIG. 11A shows a periodic exposure pattern by the two-beam interference exposure only in the one-dimensional direction. The period of this exposure pattern is 0.2 μm, and this exposure pattern corresponds to an L&S pattern having the line width of 0.1 μm. Numerals in the lower part of FIGS. 11A to 11C indicate exposure amounts.

Figure 15:
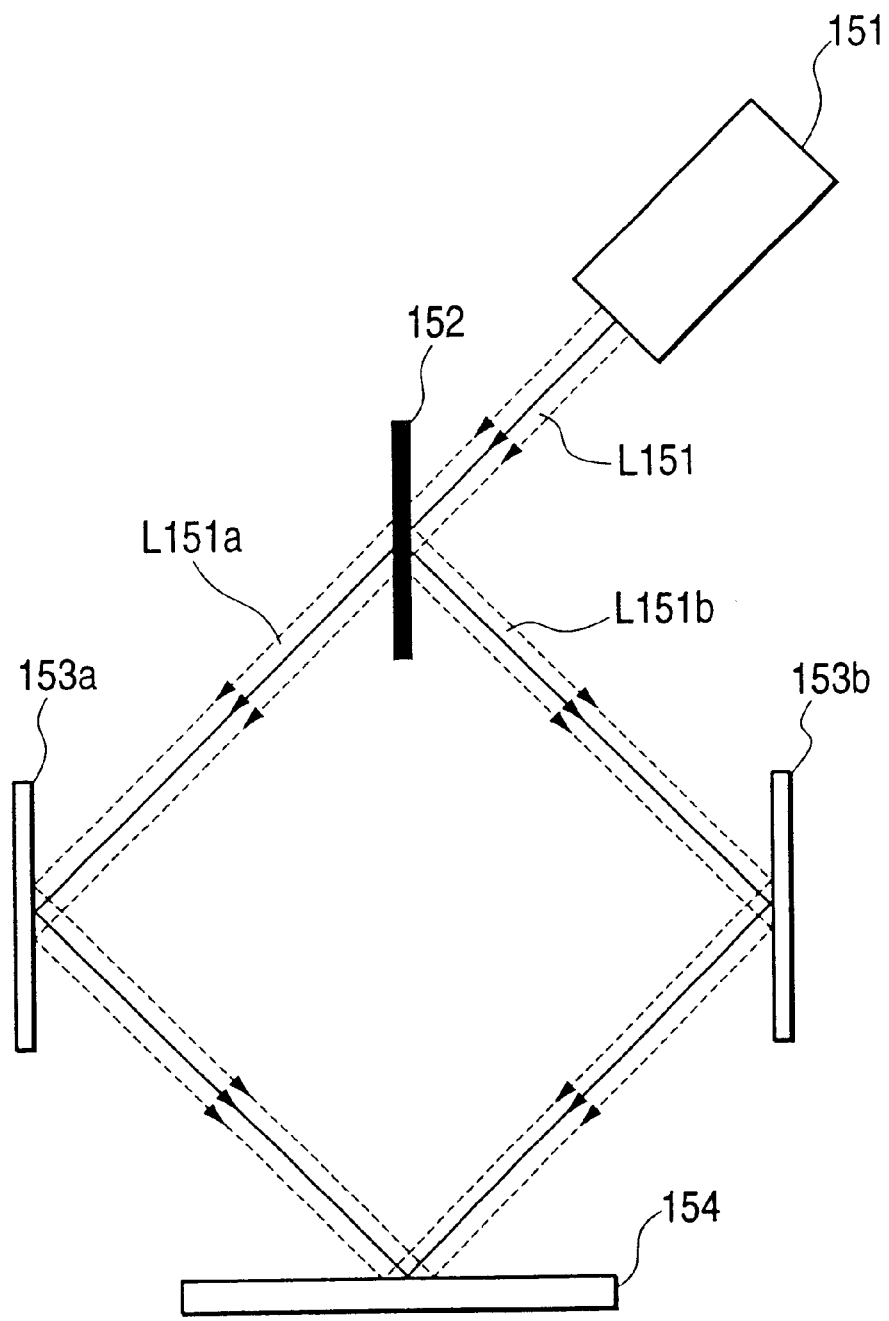
FIG. 15 is a schematic diagram to show an example of the conventional exposure apparatus for two-beam interference.
Figure 16:
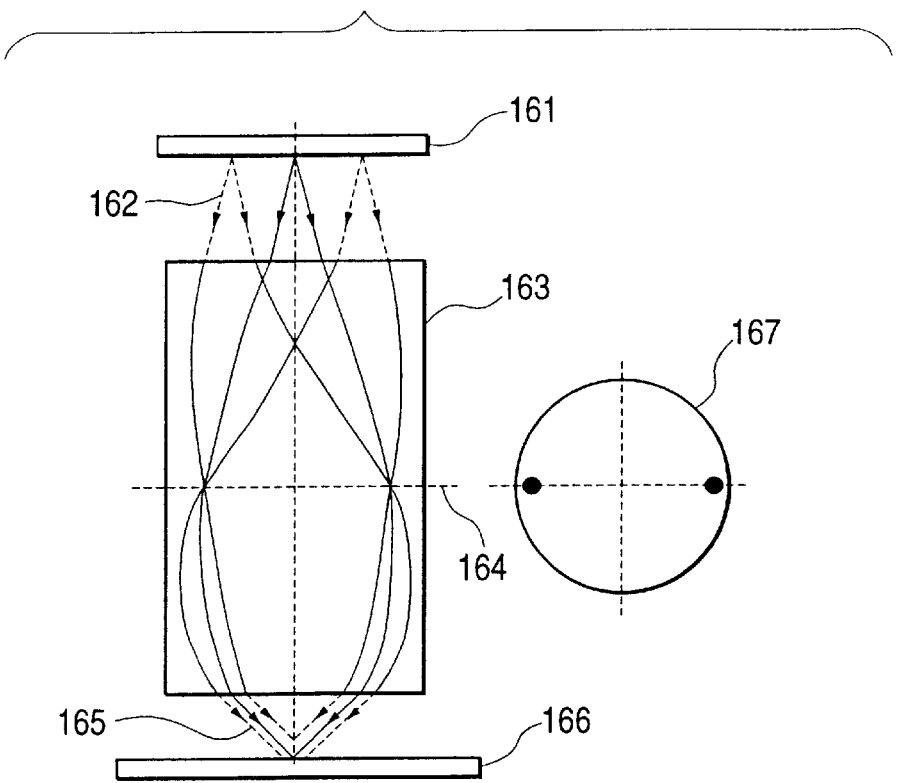
FIG. 16 is a schematic diagram to show an example of the projection exposure apparatus for carrying out the two-beam interference exposure.
Figure 17:
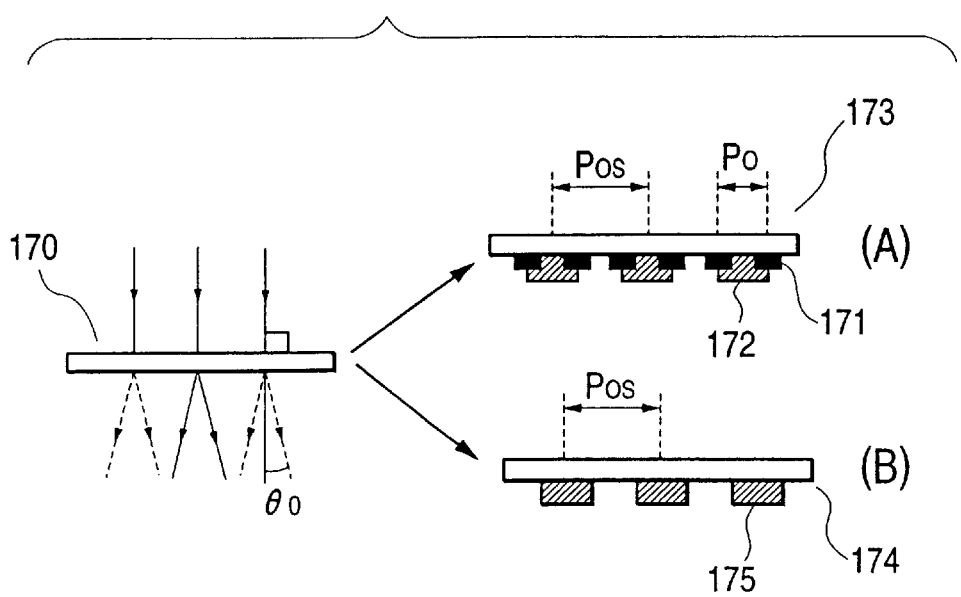
FIG. 17 is an explanatory diagram to show an example of the mask and the illumination method used in the apparatus of FIG. 16.
Figure 18:
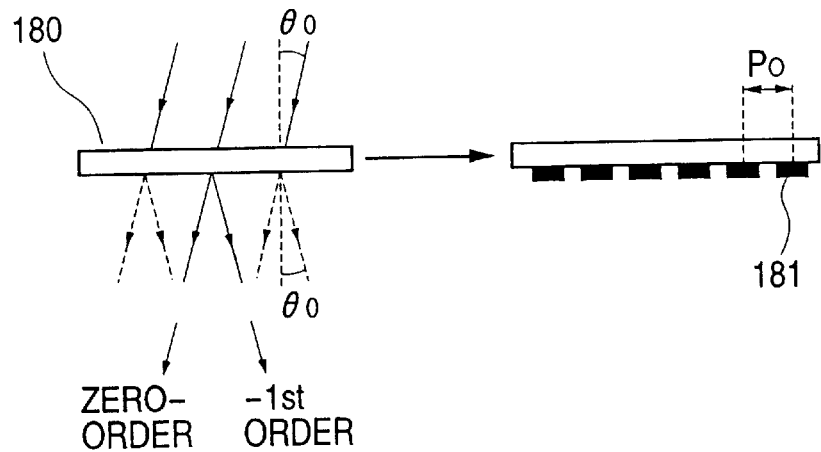
FIG. 18 is an explanatory diagram to show another example of the mask and the illumination method used in the apparatus of FIG. 16.

The exposure apparatus for implementing such two-beam interference exposure includes an interferometer type demultiplexing/multiplexing optical system comprised of the laser 151, half mirror 152, and plane mirrors 153, as illustrated in FIG. 15, or the projection exposure apparatus of the structure as illustrated in FIG. 16 in combination with the mask and illumination method as illustrated in FIG. 17 or FIG. 18.

The exposure apparatus of FIG. 15 will be described. In the exposure apparatus of FIG. 15 two beams to be multiplexed are obliquely incident each at the angle θ to the wafer 154 as described previously and the line width of the interference fringe pattern (exposure pattern) formed on the wafer 154 is one expressed by aforementioned Eq. (3). The relation of the image-side NA of the demultiplexing/multiplexing optical system with the angle θ is NA=sinθ.

The angle θ can be arbitrarily adjusted and set by changing the angle of each of a pair of plane mirrors 153 (153a, 153b) and the line width of each fringe of the interference fringe pattern is decreased by setting a large value as the angle θ by the pair of plane mirrors. For example, when the wavelength of the two beams is 248 nm (the KrF excimer), the interference fringe pattern can be formed with fringes having the line width of about 0.1 μm even at θ=38°.

At this angle NA=sinθ=0.62. It is a matter of course that a higher resolution can be achieved by setting at a larger angle θ than 38°.

The exposure apparatus of FIG. 16 to FIG. 18 will be described next. The exposure apparatus of FIG. 16 is the projection exposure apparatus using a demagnifying projection optical system (comprised of many lenses), for example, of the normal step-and-repeat method or step-and-scan method, and there are presently existing apparatus having the numerical aperture NA of not less than 0.6 at the exposure wavelength 248 nm.

Figure 19:
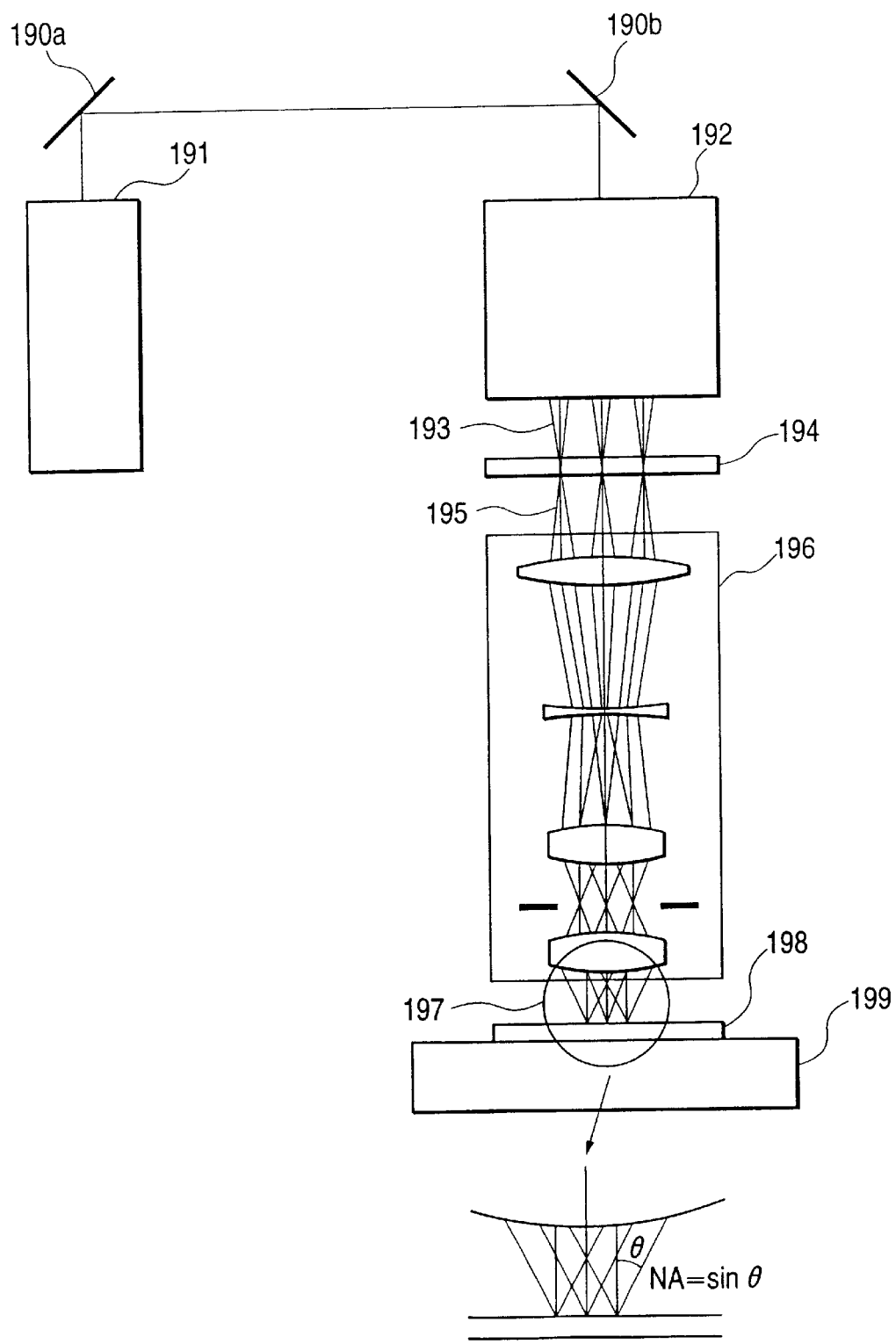
FIG. 19 is a schematic diagram to show the conventional projection exposure apparatus.

In FIG. 16, reference numeral 161 designates a mask, 162 object-side exposure light emerging from the mask 161 and then entering the optical system 163, 163 the projection optical system, 164 an aperture stop, 165 image-side exposure light emerging from the projection optical system 163 and then entering the wafer 166, 166 the wafer being a photosensitive substrate, and 167 is an explanatory diagram to show a pair of black dots at positions of the beams on the pupil plane corresponding to the circular aperture of the stop 164. FIG. 16 is a schematic diagram to show a state in which the two-beam interference exposure is under way. Each of the object-side exposure light 162 and the image-side exposure light 165 is composed of only two bundles of parallel rays, different from the normal projection exposure of FIG. 19.

For carrying out the two-beam interference exposure (periodic pattern exposure) in the normal projection exposure apparatus as illustrated in FIG. 16, the mask 161 and the illumination method thereof can be set as illustrated in FIG. 17 or in FIG. 18. These three examples will be described below.

FIG. 17(A) shows a Levenson type phase shift mask 173, which is a mask in which the pitch PO of light-intercepting portions 171 made of chromium is expressed by Eq. (4) and the pitch POS of phase shifter 172 by Eq. (5).

$$P_O=P/M=2R/M=\lambda/(M\cdot 2NA) \tag{4}$$

$$P_{OS}=2P_O=\lambda/(M\cdot NA) \tag{5}$$

In these equations, M is the projection magnification of the projection optical system 163, P the pitch of the periodic pattern on the wafer (image plane), λ the exposure wavelength, and NA the image-side numerical aperture of the projection optical system 163.

On the other hand, the mask 174 illustrated in FIG. 17(B) is a shifter edge type phase shift mask without the light-intercepting portions of chromium, in which the pitch POS of the phase shifter 175 satisfies above Eq. (5), similar to the Levenson type.

For carrying out the two-beam interference exposure using each phase shift mask of FIG. 17(A) or (B), the so-called coherent illumination with σ close to 0 is carried out with these masks. Specifically, parallel rays are guided from the direction normal to the mask surface 170 (in the direction parallel to the optical axis) as illustrated in FIG. 17 to illuminate the mask 170.

In this case, σ=(numerical aperture of illumination optical system)/(numerical aperture of projection optical system). Under such illumination, 0-order transmitted-diffracted light emerging in the normal direction from the mask 170 cancels each other to vanish, because a phase difference is π between adjacent transmitted beams by the phase shifter 172 (175); whereas two parallel beams of ±1-order transmitted-diffracted light emerge in symmetry with respect to the optical axis of the projection optical system 163 from the mask 170, so that the two object-side exposure beams 165 of FIG. 16 interfere with each other on the wafer 166. Higher-order diffracted light of second and higher orders does not enter the aperture of the aperture stop 164 of the projection optical system 163 and, therefore, does not contribute to imaging.

The mask 180 illustrated in FIG. 18 is a mask in which the pitch PO of the light-intercepting portions 181 of chromium is expressed by Eq. (6), similar to Eq. (4).

$$P_OP/M=2R/M=\lambda/(M\cdot 2NA) \tag{6}$$

In this equation, M is the projection magnification of the projection optical system 163, P the pitch of the periodic pattern on the wafer (image plane), λ the exposure wavelength, and NA the image-side numerical aperture of the projection optical system 163.

The mask without the phase shifter, as illustrated in FIG. 18, is illuminated by oblique incidence illumination with one bundle or two bundles of parallel rays. In this case the incident angle $\theta_0$ of the parallel rays to the mask 180 is set so as to satisfy Eq. (7). In the case of two bundles of parallel rays being used, the mask is illuminated with the beams of parallel rays inclined by $\theta_0$ on the respective sides with respect to the reference of the optical axis.

$$\sin\theta_0 = M/NA \qquad (7)$$

In this equation, M is also the projection magnification of the projection optical system 163 and NA the image-side numerical aperture of the projection optical system 163.

When the mask without the phase shifter, illustrated in FIG. 18, is illuminated by the oblique incidence illumination with the parallel beams satisfying above Eq. (7), two beams appear as the two object-side exposure beams 162 of FIG. 16 from the mask 180, the two beams being the 0-order transmitted-diffracted light traveling straight at the angle $\theta_0$ to the optical axis and the —1-order transmitted-diffracted light traveling along an optical path symmetric with the optical path of the 0-order transmitted-diffracted light with respect to the optical axis of the projection optical system (or traveling at the angle of $-\theta_0$ with respect to the optical axis). These two beams are incident to the aperture part of the aperture stop 164 of the projection optical system 163 to effect imaging.

The above is the technology for effecting the two-beam interference exposure using the normal projection exposure apparatus and, because the illumination optical system of the normal projection exposure apparatus is constructed so as to perform the partially coherent illumination with the value of a being in a certain range, the projection exposure apparatus can be structured so as to perform substantially coherent illumination, for example, by making the unrepresented aperture stop corresponding to this partially coherent illumination of the illumination optical system replaceable with a special aperture stop corresponding to the coherent illumination.

Now let us return to the description of the embodiment illustrated in FIG. 10 and FIGS. 11A to 11C. In the present embodiment the exposure of the gate pattern illustrated in FIG. 11B is effected by the normal projection exposure (normal pattern exposure) (for example, which is carried out under the partially coherent illumination to the mask) carried out subsequent to the aforementioned two-beam interference exposure (periodic pattern exposure).

The upper part of FIG. 11C shows the relative positional relation between the exposure pattern of the two-beam interference exposure and the exposure pattern of the normal projection exposure, and exposure amounts in respective areas of the exposure pattern in the normal projection exposure, and the lower part of the same figure illustrates a map of exposure amounts to the resist of wafer by the normal projection exposure in the resolution of the vertical and horizontal pitch equal to the minimum line width.

The exposure amount distributions in the lower part of FIGS. 11A to 11C are distributions of intensities of exposure on the wafer where the intensity of light incident to the mask is 1.

The exposure amount distribution by the exposure of the periodic pattern of FIG. 11A should be ideally rectangular waves of 1 and 0, but it is actually sine waves composed of only 0-order light and 1-order light, because the pattern of the line width close to the resolution limit is formed by the two-beam interference exposure. The maximum is indicated by $I_0$ and the minimum by $I_1$ among the light amounts of the sine waves. At this time, values of $I_0$ and $I_1$ are determined by $\sigma$ of the illumination condition.

The exposure amount distribution by the normal projection exposure of FIG. 11B indicates typical values in the respective portions. The portions of the minimum line width in the exposure pattern by this projection exposure are not resolved to become unsharp and spread, so that values of light intensities are decreased at the respective points. The exposure amounts are roughly determined in such a manner that those in pattern central portions are b, those on the both sides thereof are d, and those in the central part in which unsharp images come from the both sides are c. Since the line width of double the minimum line width is the line width close to the resolution limit of the projection exposure, areas having such line width are a little unsharp and have the exposure amount a, though it is greater than the values of b, c, and d. These values of a, b, c, and d vary depending upon the illumination condition.

The exposure amount distribution of FIG. 11C is the result of addition of the exposure amounts of the exposure pattern of FIG. 11A and the exposure pattern of FIG. 11B.

A light amount ratio in the exposures of the two-beam interference exposure and the projection exposure differs depending upon the illumination conditions of the respective exposures. The ratio of light amounts of the exposures in the double exposure is defined as an illuminance ratio of the illumination systems as follows:

two-beam interference exposure : projection exposure = 1:k where the value of k is determined as follows.

The exposure amount distribution of FIG. 11C can be expressed by the following equations, using the above exposure amount distributions and light amount ratio.

$$a' = k \times a + I_0$$

$$a'' = k \times a + I_1$$

$$b' = k \times b + I_0$$

$$c'' = k \times c + I_1$$

$$d' = k \times d + I_1$$

For obtaining the desired gate pattern, relations need to be obtained with the threshold $I_c$ of light sensitivity of the resist. For example, where the resist is of the negative type, the relations are as follows.

$$a' > I_c$$

$$a'' > I_c$$

$$b' > I_c$$

$$c' < I_c$$

$$d' < I_c$$

It is desirable that differences among a', a", and b' be small and that c' have a large difference from them, particularly, from b'. Solving these equations, the optimal light amount ratio can be obtained in each illumination condition. Particularly, the following two equations related to the microscopic pattern are important.

When the resist is of the negative type, $$k \times b + I_0 > I_c \, .$$

$$k \times c + I_1 < I_c \, .$$

When the resist is of the positive type, $k \times b + I_1 < I_c$.

$k \times c + I_0 > I_c$.

When the resist is of the positive type, the magnitude relation of the exposure amount distributions is inverse and the inequality signs are reversed with respect to the resist threshold $I_c$. However, the optimal light amount ratio can be obtained likewise.

Figure 12:
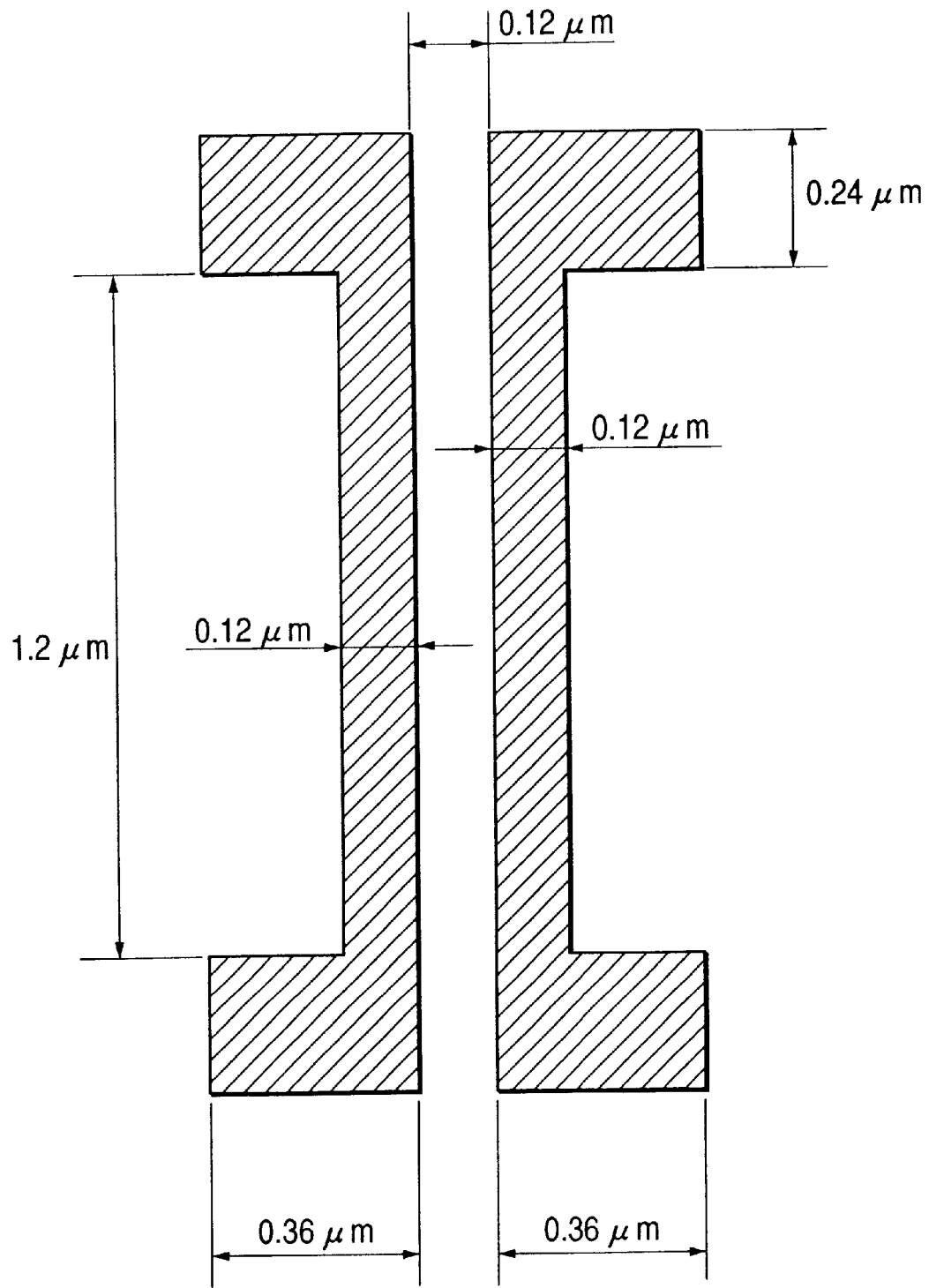
FIG. 12 is a diagram to explain a gate pattern.

Next described is how the microscopic circuit pattern of FIG. 12 is formed by carrying out the two-beam interference exposure and the normal projection exposure described above by use of the illumination methods different from each other. In the present embodiment there is no developing step between the two-beam interference exposure and the normal projection exposure. Therefore, exposure amounts are summed up in overlap areas of the exposure patterns of the respective exposures, so that a new exposure pattern is generated of exposure amounts (distribution) after the summation.

FIG. 12, FIGS. 13A and 13B, and FIGS. 14A, 14B show a specific example where the KrF excimer stepper of the wavelength 248 nm was used. A negative resist was exposed to the gate pattern having the minimum line width of 0.12 μm, as illustrated in FIG. 12, by the normal exposure with a normal mask, and was then exposed to the periodic pattern so as to overlap with the minimum line width, using the phase shift mask of the Levenson type.

NA of the projection lens was 0.6, and σ of the illumination system was 0.3 in the exposure with the Levenson mask. In the normal mask exposure, the illumination employed was that with σ=0.3, 0.6, 0.8 and the annular zone illumination with σ=0.6 to 0.8.

In the case of the exposure of the periodic pattern by the two-beam interference with the phase shift mask or the like, the coherent illumination is one having the value of σ close to zero, but a too small value is not practical, because an exposure dose per unit time becomes small, so as to lengthen the time necessary for the exposure.

During the periodic pattern exposure σ is desirably not more than 0.3. Therefore, the maximum σ=0.3 was employed for the exposure with the Levenson mask.

In the normal exposure, it is common practice to employ the partially coherent illumination, in which larger σ improves repeatability of complicated shape and widens the depth. This tendency becomes more prominent in the so-called annular zone illumination where illuminance distribution is lower inside than outside, but there is the drawback of a drop of contrast.

Figure 13A:
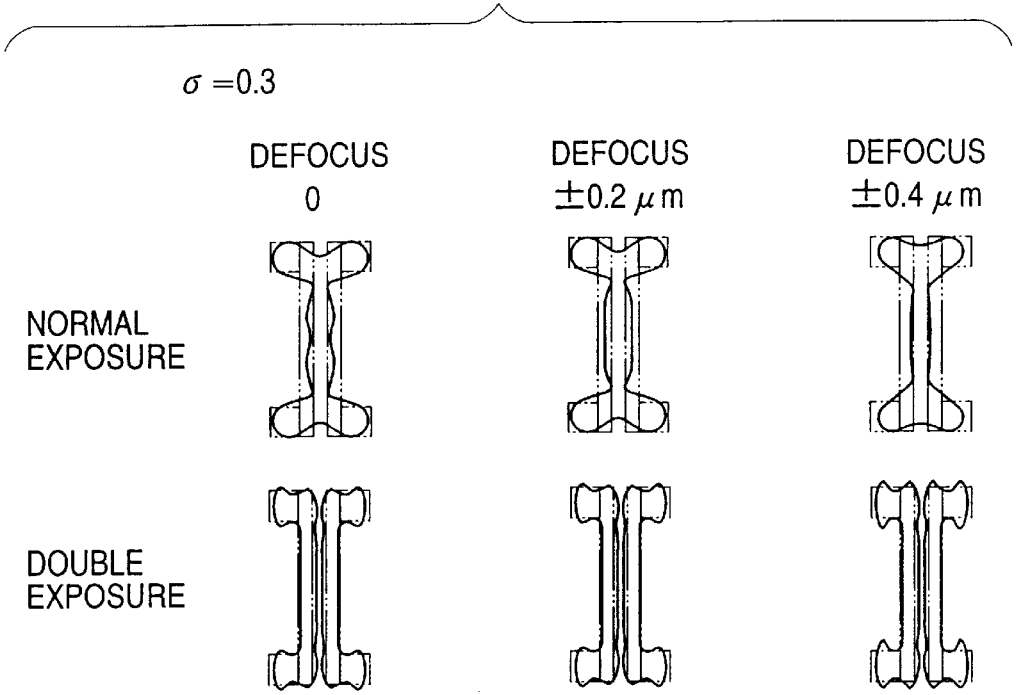
FIG. 13A and FIG. 13B are explanatory diagrams to show gate patterns formed.

When double exposure is carried out under the same illumination condition in which σ of the normal exposure is 0.3 equal to σ of the periodic pattern exposure, as illustrated in FIG. 13A, the gate pattern is resolved in the range of defocus 0±0.2 μm, but the line pattern portions are winding and constricted portions could be the cause of disconnection, which is thus not preferable.

Figure 13B:
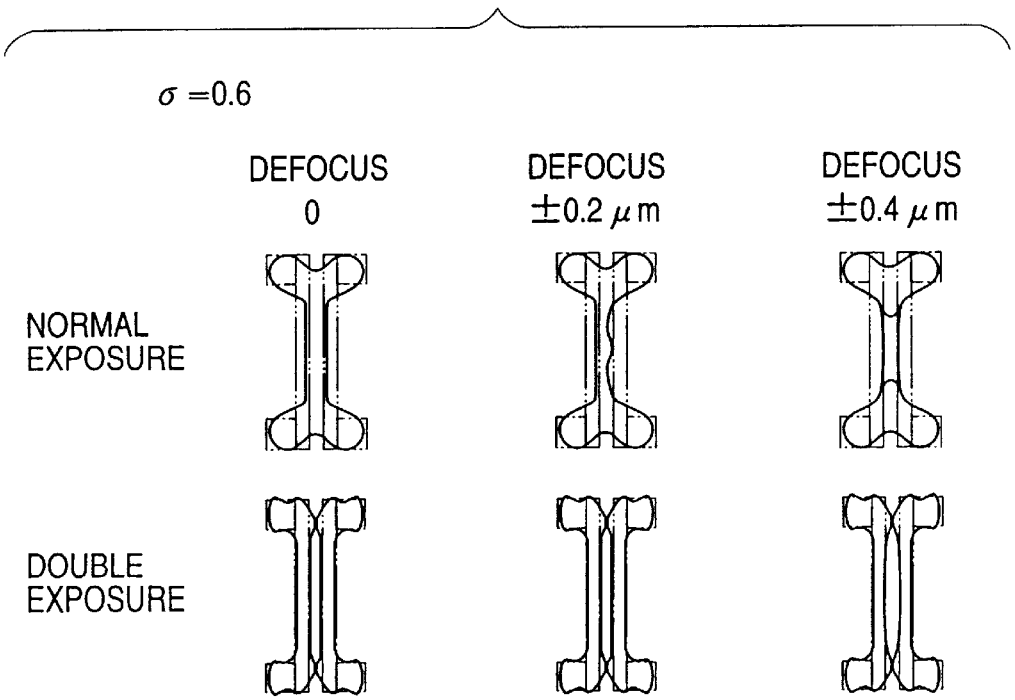

In the normal pattern exposure it is preferable to set σ=0.6 or higher. When σ of the normal exposure is 0.6, the gate pattern is resolved in the range of defocus 0±0.4 μm, as illustrated in FIG. 13B, and the winding issue is overcome in the line pattern portions. The exposure amount ratio of the normal exposure and the periodic pattern exposure was set to normal exposure:periodic pattern exposure=1.5:1.

Figures 14A, 14B:
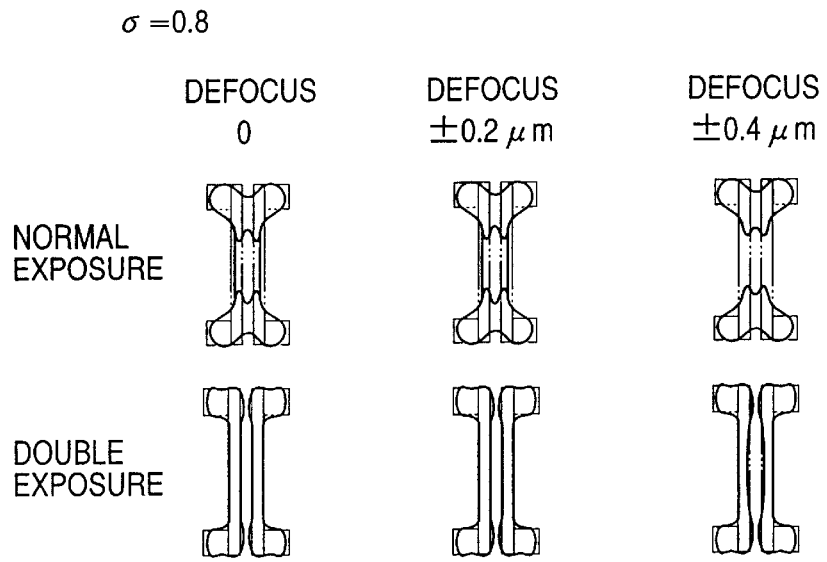
FIG. 14A and FIG. 14B are explanatory diagrams to show gate patterns formed.

When σ of the normal exposure is as large as 0.8 as illustrated in FIG. 14A, the repeatability of complex shape is slightly better. The exposure amount ratio of the normal exposure and the periodic pattern exposure was set to normal pattern exposure:periodic pattern exposure=2:1. It is preferable to set the exposure amount of the normal pattern exposure two or more times greater than that in the periodic pattern exposure.

FIG. 14B shows two-dimensional intensity distributions where the normal exposure was carried out under the annular zone illumination, the illuminance was 1 in the region from the ring inside of 0.6 to the ring outside of 0.8, and the illuminance was 0 in the region of the ring inside of 0.6 or less. The exposure amount ratio of the normal exposure and periodic pattern exposure was set to normal exposure:periodic pattern exposure=2.5:1.

In the annular zone illumination the repeatability of complex shape is better and the depth is wider than in the case of σ=0.8. Good images were obtained in the range of defocus of ±0.4 μm and below.

As described above, the microscopic circuit pattern can be formed by the double exposure with the periodic pattern exposure. Since the microscopic pattern in the normal exposure pattern has low light intensity and low contrast, it is normally not resolved; however, when it is subject to the periodic pattern exposure with high contrast to effect double exposure so as to be superimposed, the contrast is enhanced to permit the microscopic pattern to be resolved.

On the other hand, the large pattern over the resolution in the normal exposure pattern is also superimposed over the intensity of the periodic pattern exposure, so as to enhance the contrast, whereby an image of sharp edge can be formed where the line width is an integral multiple of the line width of the periodic pattern exposure. The exposure method of the present invention permits the circuit pattern having the microscopic line width, for example, of 0.12 μm to be formed, for example, using the projection exposure apparatus having the illumination optical system capable of switching the illumination conditions so as to vary σ and the light amount ratio of illuminance.

For obtaining the light amount ratio of the periodic pattern exposure and the normal pattern exposure, optimal values were calculated among combinations of illumination conditions according to the aforementioned computation equations.

[Illumination condition 1] σ=0.3 in the periodic pattern exposure and σ=0.3 in the normal pattern exposure Listed below are the exposure amount distribution by the periodic pattern exposure illustrated in the lower part of FIG. 11A and the exposure amount distribution (best focus) by the normal projection exposure illustrated in the lower part of FIG. 11B.

The optimum is achieved when $I_0=0.80$, $I_1=0.23$, a=1.31, b=0.34, c=0.61, d=0.09, and k=1.0.

Then we obtain a'=2.11, a"=1.54, b'=1.21, c'0.89, and d'=0.32.

For comparison hereinafter, they are normalized as follows where the maximum a' is normalized to 1.

a'=1.0, a"=0.73, b'=0.57, c'=0.42, d'=0.15, $I_0$=0.38

[Illumination condition 2] σ=0.3 in the periodic pattern exposure and σ=0.6 in the normal pattern exposure The optimum is achieved when $I_0=0.80$, $I_1=0.23$, a=1.25, b=0.44, c=0.53, d=0.13, and k=1.5.

Then we obtain a'=2.68, a"=2.11, b'=1.46, c'=1.03, and d'=0.43.

For comparison hereinafter, they are normalized as follows where the maximum a' is normalized to 1.

a'=1.0, a"=0.79, b'=0.55, c'=0.38, d'=0.16, $I_0$=0.30

[Illumination condition 3] σ=0.3 in the periodic pattern exposure and σ=0.8 in the normal pattern exposure The optimum is achieved when $I_0=0.80$, $I_1=0.23$, a=1.20, b=0.48, c=0.47, d=0.16, and k=2.0.

Then we obtain a'=3.20, a"=2.63, b'=1.76, c'=1.17, and d'=0.55.

For comparison hereinafter, they are normalized as follows where the maximum a' is normalized to 1.

a'=1.0, a"=0.82, b'=0.55, c'=0.37, d'=0.17, $I_0$=0.25

[Illumination condition 4] σ=0.3 in the periodic pattern exposure, and σ=0.8 in the normal pattern exposure under annular zone illumination where the illuminance distribution of σ not more than 0.6 inside (inside the annular zone) was zero.

The optimum is achieved when $I_0$=0.80, $I_1$=0.23, a=1.10, b=0.47, c=0.36, d=0.19, and k=2.5.

Then we obtain a'=3.55, a"=2.98, b'=1.98, c'=1.13, and d'=0.71.

For comparison hereinafter, they are normalized as follows where the maximum a' is normalized to 1.

a'=1.0, a"=0.84, b'=0.56, c'=0.32, d'=0.20, $I_0$=0.23.

In the discussion so far, the threshold of the resist was 1.5 when the maximum exposure amount was 3. Therefore, the resist threshold becomes 0.5 when normalized with respect to the maximum exposure amount 1.

It is seen from these normalized exposure amount distributions that a', a", b' are larger than the normalized resist threshold 0.5 while c', d', $I_0$ are smaller than the threshold.

Since development leaves only portions where the exposure amount is over the resist threshold, only the portions of the exposure amounts a', a", and b' are left as a pattern after the development. Therefore, the gray portion in the lower part of FIG. 11C is the shape after the development.

In general, the appropriate exposure amounts in the exposure of normal exposure pattern are approximately double those in the exposure of periodic pattern, and there is the optimal exposure amount ratio depending upon the combination of the illumination condition in the exposure of normal exposure pattern with the illumination condition in the exposure of periodic pattern, which is calculated according to the aforementioned computation equations.

The following was verified from the result of computation as to combinations of various illumination conditions according to the aforementioned computation equations. In cases where σ=0.3 in the periodic pattern exposure and the illumination condition a in the normal pattern exposure is smaller than 0.8, it is preferable to make the exposure amounts in the normal pattern exposure two or less times greater than those in the periodic pattern exposure.

In cases where σ=0.3 in the periodic pattern exposure and the illumination condition in the normal pattern exposure is the annular zone illumination in which the width of the annular zone is small, it is preferable to make the exposure amounts in the normal pattern exposure two or more times greater than those in the periodic pattern exposure.

In cases where the illumination condition σ in the periodic pattern exposure is smaller than 0.3, it is preferable to make the exposure amounts in the normal pattern exposure two or more times greater than those in the periodic pattern exposure.

Figure 20:
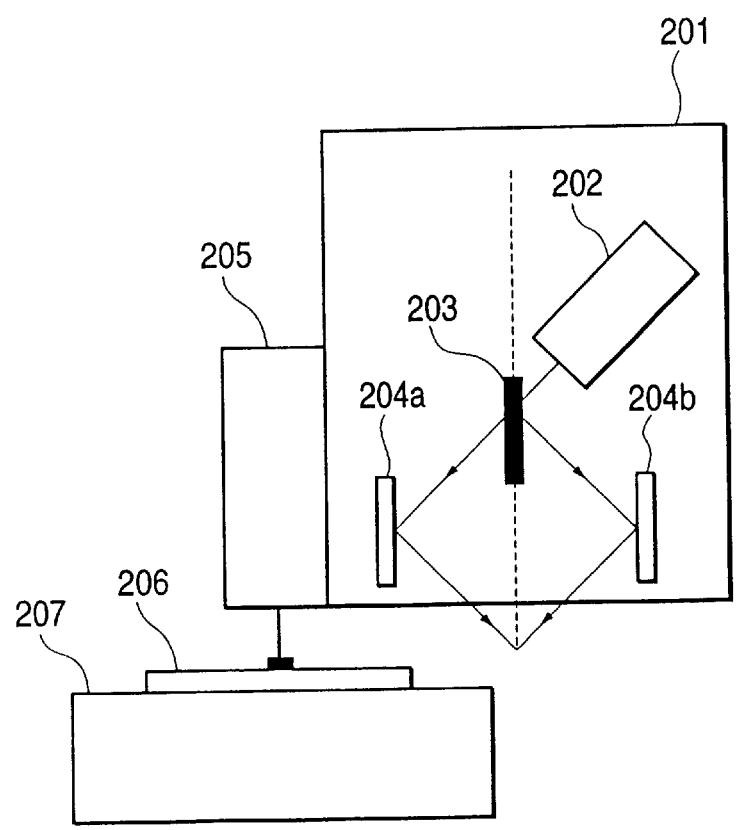
FIG. 20 is a schematic diagram to show an example of the two-beam interference exposure apparatus of the present invention.

FIG. 20 is a schematic diagram to show an example of the exposure apparatus for the two-beam interference exposure.

In FIG. 20, reference numeral 201 designates an optical system for the two-beam interference exposure, the basic structure of which is the same as the optical system of FIG. 15. Numeral 202 denotes a KrF or ArF excimer laser, 203 a half mirror, 204 (204a, 204b) plane mirrors, and 205 an off-axis type positioning optical system capable of detecting the positional relation with the optical system 201 as a fixed or an appropriate base line (amount), which observes a positioning mark for two-beam interference on the wafer 206 to detect the position thereof. Numeral 206 represents a wafer being a photosensitive substrate, and 207 an XYZ stage capable of moving in a plane perpendicular to the optical axis of the optical system 201 and in the direction of the optical axis thereof, the position of which is controlled accurately by use of a laser interferometer or the like. Since the structure and function of the apparatus 205 and XYZ stage 207 are well known, the detailed description thereof is omitted herein.

Figure 21:
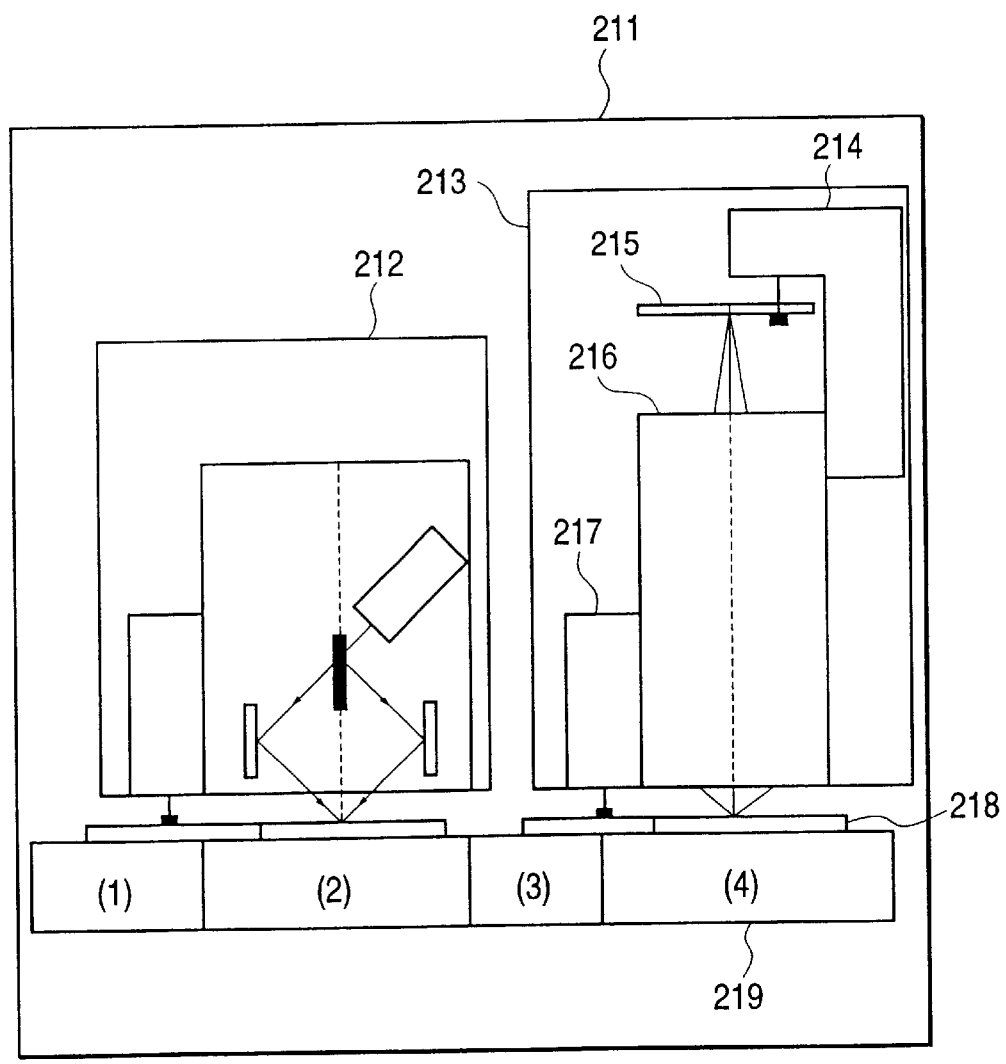
FIG. 21 is a schematic diagram to show an example of the high-resolution exposure apparatus of the present invention.

FIG. 21 is a schematic diagram to show an exposure apparatus of a high resolution composed of the exposure apparatus for the two-beam interference and the normal projection exposure apparatus.

In FIG. 21, reference numeral 212 denotes the two-beam interference exposure apparatus provided with the optical system 201 and the apparatus 205 of FIG. 20, and 213 the normal projection exposure apparatus equipped with an illumination optical system not illustrated, a reticle positioning optical system 214, a wafer positioning optical system (off-axis positioning optical system) 217, and a projection optical system 216 for projecting the circuit pattern of the mask 215 at a demagnification ratio onto the wafer 218.

The reticle positioning optical system 214 observes a positioning mark on the mask 215 to detect the position thereof. The wafer positioning optical system 217 observes a positioning mark for both the projection exposure and the two-beam interference exposure on the wafer 206 to detect the position thereof. Since the structure and function of the optical systems 214, 216, and 217 are well known, the detailed description thereof is omitted herein.

In FIG. 21 numeral 219 designates one XYZ stage used in common to the two-beam interference exposure apparatus 212 and the projection exposure apparatus 213, this stage 219 being movable in a plane perpendicular to each of the optical axes of the apparatus 212, 213 and in the direction of the optical axes. The position in the X, Y directions is controlled accurately by use of the laser interferometer or the like.

The stage 219 holding the wafer 218 is fed to the position (1) of FIG. 21 where the position thereof is measured accurately. Then the stage is fed, based on the measurement result, to the exposure position of the apparatus 212 indicated by the position (2), at which the two-beam interference exposure is effected on the wafer 218. After that, the stage is fed to the position (3) where the position thereof is measured accurately. Then the stage is fed to the exposure position of the apparatus 213 indicated by the position (4), at which the projection exposure is effected on the wafer 218.

In the apparatus 213, the off-axis positioning optical system 217 can be replaced by an unrepresented TTL positioning optical system for observing the positioning mark on the wafer 218 through the projection optical system 216 to detect the position thereof, or by an unrepresented TTR positioning optical system for observing the positioning mark on the wafer 218 through the projection optical system 216 and the mask (reticle) 215 to detect the position thereof.

Figure 22:
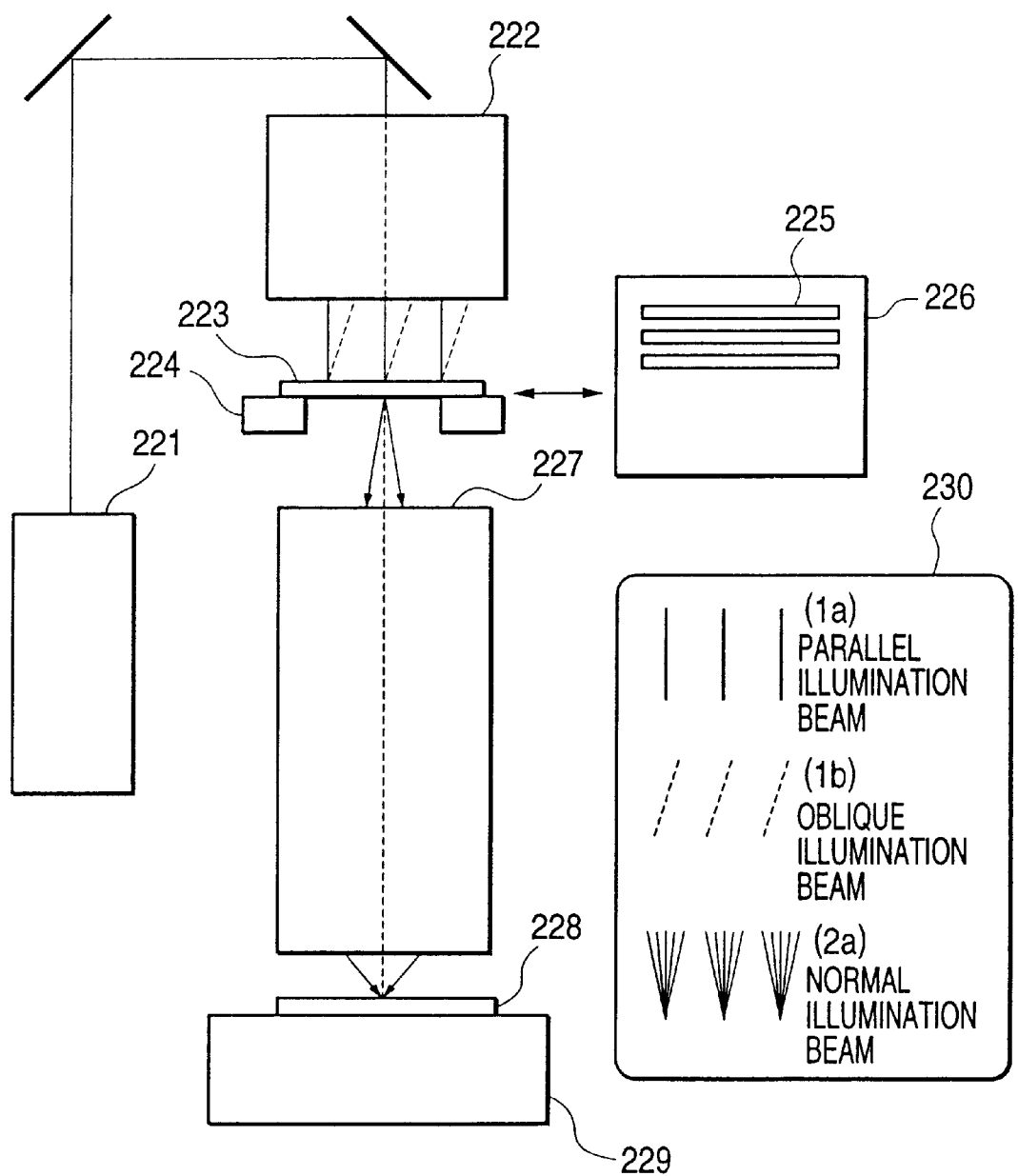
FIG. 22 is a schematic diagram to show an example of the high-resolution exposure apparatus of the present invention.

FIG. 22 is a schematic diagram to show an exposure apparatus of a high resolution capable of carrying out both the two-beam interference exposure and the normal projection exposure.

In FIG. 22, reference numeral 221 designates a KrF or ArF excimer laser, 222 an illumination optical system, 223 a mask (reticle), 224 a mask stage, 227 a projection optical system for projecting the circuit pattern of mask 223 at a demagnification ratio onto the wafer 228, and 225 a mask (reticle) changer which is provided for selectively supplying either one of a normal reticle and the aforementioned Levenson phase shift mask (reticle) or edge shifter type mask (reticle) or periodic pattern mask (reticle) without the phase shifter, onto the stage 224.

The mask stage also has the function of rotating the mask, based on information preliminarily written on the mask, such as a bar code or the like, in order to make the direction of the microscopic pattern parallel to the direction of the periodic pattern.

In FIG. 22 numeral 229 designates one XYZ stage used in common to the two-beam interference exposure and the projection exposure, this stage 229 being movable in a plane perpendicular to the optical axis of the optical system 227 and in the direction of the optical axis thereof. The position of the stage 229 in the X, Y directions is controlled accurately by use of the laser interferometer or the like.

The apparatus of FIG. 22 is also provided with the unrepresented reticle positioning optical system and wafer positioning optical system (the off-axis positioning optical system, the TTL positioning optical system, or the TTR positioning optical system described in FIG. 21).

The illumination optical system 222 of the exposure apparatus of FIG. 22 is structured so as to switch the partially coherent illumination with large a to the partially coherent illumination with small a, and vice versa; in the case of the partially coherent illumination with small a, the aforementioned illumination light of (1a) or (1b) illustrated in block 230 is supplied to one of the aforementioned Levenson type phase shift reticle or edge shifter type reticle or periodic pattern reticle without the phase shifter, and in the case of the partially coherent illumination with large σ, the illumination light of (2a) illustrated in block 230 is supplied to the desired reticle. Switching from the partially coherent illumination with small σ to the partially coherent illumination with large σ is achieved normally by replacing an aperture stop placed immediately after a fly's eye lens of the optical system 222 with a stop for coherent illumination having an aperture diameter sufficiently smaller than that of the aperture stop.

The exposure wavelengths of the periodic pattern exposure and the normal exposure in the double exposure in the exposure method and exposure apparatus described above are both not more than 400 nm and preferably not more than 250 nm where the normal exposure is projection exposure. The KrF excimer laser (approximately 248 nm) or the ArF excimer laser (approximately 193 nm) is used in order to obtain the light of the exposure wavelength of not more than 250 nm.

Various devices can be produced using the exposure method and exposure apparatus described above; for example, the semiconductor chips such as IC, LSI, and so on, the display elements such as the liquid crystal panels etc., the detecting elements such as the magnetic heads etc., the image pickup elements such as CCD etc., and so on.

Now let us explain the pattern computing method and pattern display method of the present invention for obtaining the mask patterns for the double exposure described above.

The present invention is characterized in that when a circuit pattern is formed on the photosensitive substrate by multiple exposure (which is exposure of one area on the photosensitive substrate to light patterns different from each other without intervention of the developing step) of a micro-line pattern and a rough pattern, three parameters out of the following four data parameters are inputted as known data into multiple exposure computing means (optimization operation means):

micro-line pattern data (or micro-line pattern image data obtained through the exposure apparatus),
rough pattern data (or rough pattern image data obtained through the exposure apparatus),
resist characteristic data (characteristic parameter),
forming pattern data (circuit pattern); and one remaining data is computed by the multiple exposure computing means and is displayed on forming pattern display means (forming pattern handling means).

Figure 23:
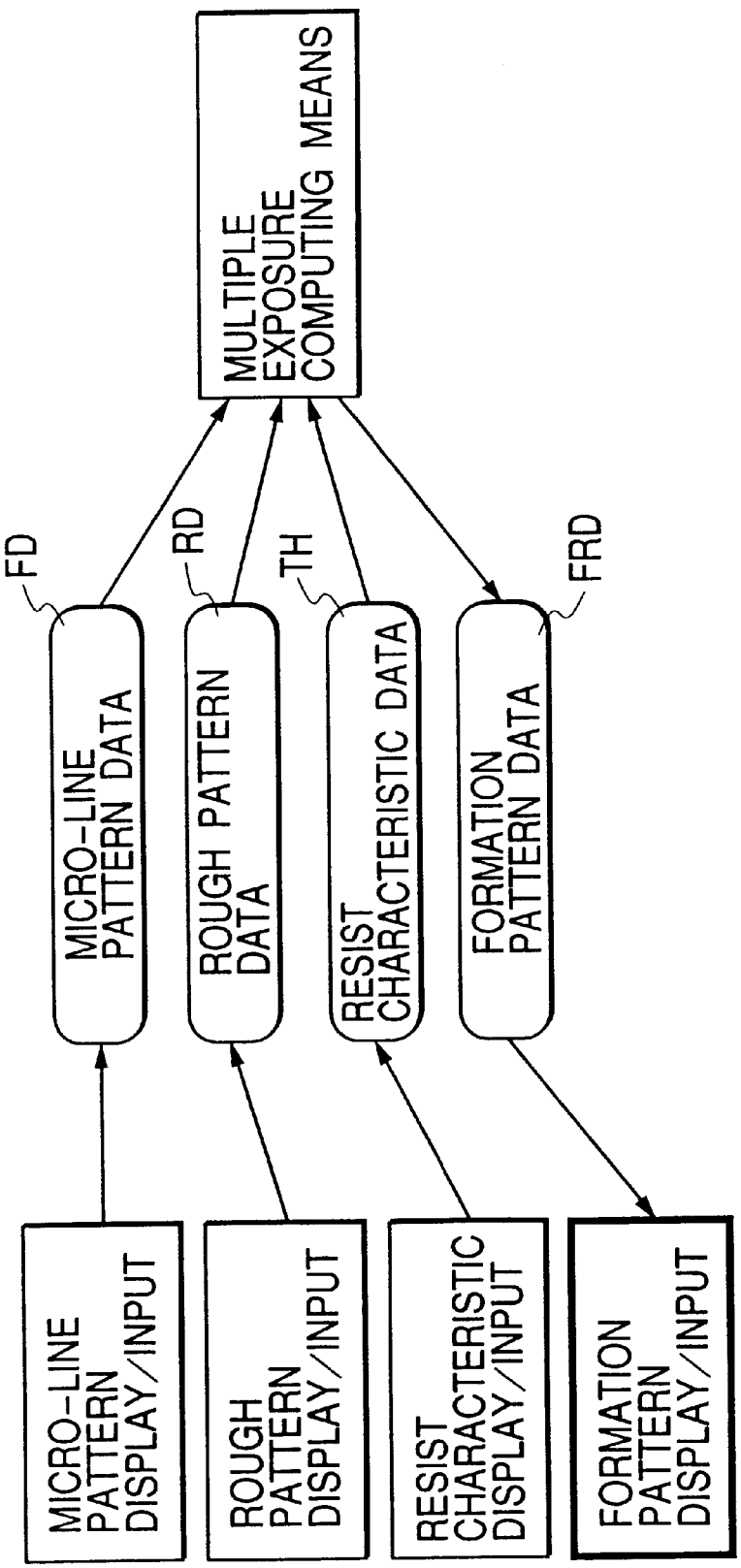
FIG. 23 is a block diagram of major part of Embodiment 1 of the pattern computing apparatus and pattern computing method according to the present invention.

FIG. 23 is a block diagram of main part of Embodiment 1 of the pattern creating apparatus of the present invention. The present embodiment shows a method for obtaining the unknown forming pattern data, based on the three known data of the micro-line pattern data, the rough pattern data, and the resist characteristic data (characteristic parameter).

In the present embodiment the desired data is inputted from various display/input means (handling means) into the multiple exposure computing means in order to obtain the desired pattern image (the forming pattern data) on the photosensitive substrate (wafer) by the multiple exposure.

More specifically, the operation is carried out as follows.

(a-1) The micro-line pattern data FD (shape, pitch, exposure amount, etc.) is inputted from the micro-line pattern display/input means (micro-line pattern handling means) into the multiple exposure computing means.

(a-2) The rough pattern data RD (data and exposure amounts based on the shape of the circuit pattern such as the gate pattern or the like) is inputted from the rough pattern display/input means (rough pattern handling means) into the multiple exposure computing means.

(a-3) The resist characteristic data (characteristic parameters, for example, the threshold of resist, the gamma characteristic (the relation of film thickness after development to exposure amount), etc.) TH is inputted from the resist characteristic display/input means (characteristic parameter handling means) into the multiple exposure computing means.

The multiple exposure computing means performs an operation to clarify what pattern is formed on the photosensitive substrate (wafer) when the multiple exposure is carried out based on these various data FD, RD, and TH.

Then the multiple exposure computing means supplies the forming pattern data FRD thus computed, to the forming pattern display/input means. The forming pattern display/input means displays the forming pattern gained by the multiple exposure computing means.

Figure 24:
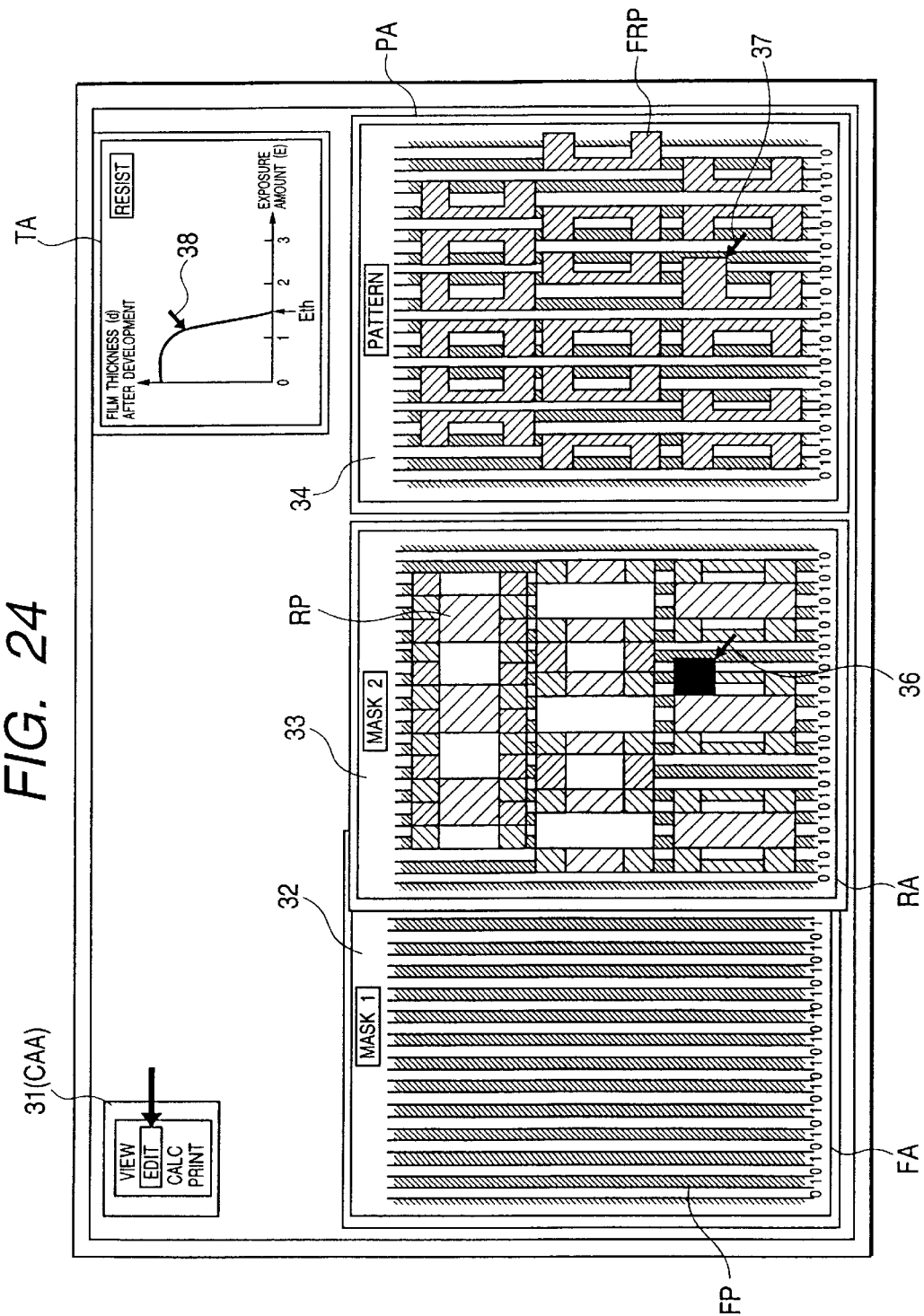
FIG. 24 is an explanatory diagram to show a screen display in Embodiment 1 of the pattern computing apparatus and pattern computing method according to the present invention.

FIG. 24 is a schematic diagram to show a screen display method for displaying the pattern by the display means (the forming pattern display/input means) in the present embodiment.

In FIG. 24, numeral 31 indicates a menu window. An operator can move the pointer on the screen by an input instructing device such as a mouse or the like and select a menu item in the window by an operation of clicking, pull-down, or the like to give the input.

The menus items include VIEW-display (confirmation), EDIT-edit (input), CALC-calculation (optimization operation), and PRINT-printing. It is a matter of course that any other menu item than these can also be added arbitrarily.

With a click on VIEW-display (confirmation) only the display is given, but no edit etc. is allowed. Of course, all the data (pattern data, resist characteristic data, etc.) is computed without contradiction.

EDIT-edit (input) is for input of each mask pattern and the resist characteristic and the input is made by selecting either one window. With EDIT sequential operation is always carried out; that is, with input of the micro-line pattern, the rough pattern, and the resist characteristic value, the forming pattern computed by the computing means is displayed in real time in a forming pattern window according to the input data.

With a click on CALC-calculation (optimization operation), an aimed forming pattern can be inputted. In addition to the aimed forming pattern, the micro-line mask pattern and resist characteristic parameter can also be inputted, for example, and then the rest rough pattern is computed by reverse operation to be displayed in a rough pattern window. The two inputs except for the forming pattern can be selected arbitrarily.

With a click on PRINT-printing the result of the display on the screen is subjected to appropriate layout adjustment etc. to be outputted to an output device such as a printer, or to an image file or the like.

The following is more detailed description including an actual GUI (graphical user interface).

The state of FIG. 24 is a selected state of EDIT and a state in which input of the rough pattern indicated by MASK2 is being carried out. The input of the rough pattern is being carried out by modifying the shape of a graphic image in the rough pattern by pulling down a cursor of 36 by means of the mouse, i.e., by moving the cursor while selecting one corner of a rectangular shape with depressing a button.

At this time, according to the function block diagram illustrated in FIG. 23, the sequential operation, which is the operation for computing the forming pattern data based on computation with the micro-line pattern data, rough pattern data, and resist characteristic parameter by the computing means, is carried out in real time and changing states are simultaneously displayed as a result in a forming pattern display/input window PA in FIG. 24.

This state is indicated by cursor 37 in the display part PA. As the cursor 36 is moved, the cursor 37 also moves therewith and the forming pattern indicated by the cursor 37 also varies at the same time.

Likewise, there is another cursor 38 in a resist characteristic display/input window TA and this cursor can be designated by the mouse or the like and moved to change the characteristic graph of the resist being the input value. A curve of the graph can be directly reshaped by the cursor 38 or Eth (resist threshold) can be read by an input dialog not illustrated or the like.

The resist characteristic inputted in this way is transferred to the computing means to be computed and the forming pattern varied is displayed in real time, as in the case of the input of rough data described above.

FA is a display section for displaying the micro-line pattern FP (MASK1) based on the micro-line pattern data FD, and RA a display section for displaying the rough pattern RP (MASK2) based on the rough pattern data RD.

The display section RA displays both the rough pattern RP and the micro-line pattern FP so as to help the operator readily recognize the positional relation between the rough pattern RP and the micro-line pattern FP displayed in the display section FA. PA is a display section for displaying the forming pattern FRP based on the forming pattern data FRD.

The display section PA displays both the micro-line pattern FP and the forming pattern FRP so as to help the operator readily recognize the positional relation between them. TA is a display section for displaying the gamma characteristic γ based on the resist characteristic data TH.

In the present embodiment various data computed and gained by the pattern computing apparatus of FIG. 23 is computed and displayed in real time in each of these display sections. For example, three data is inputted, one rest data is computed, and these data is displayed in each of the display sections and utilized in the computing stage.

Figure 25:
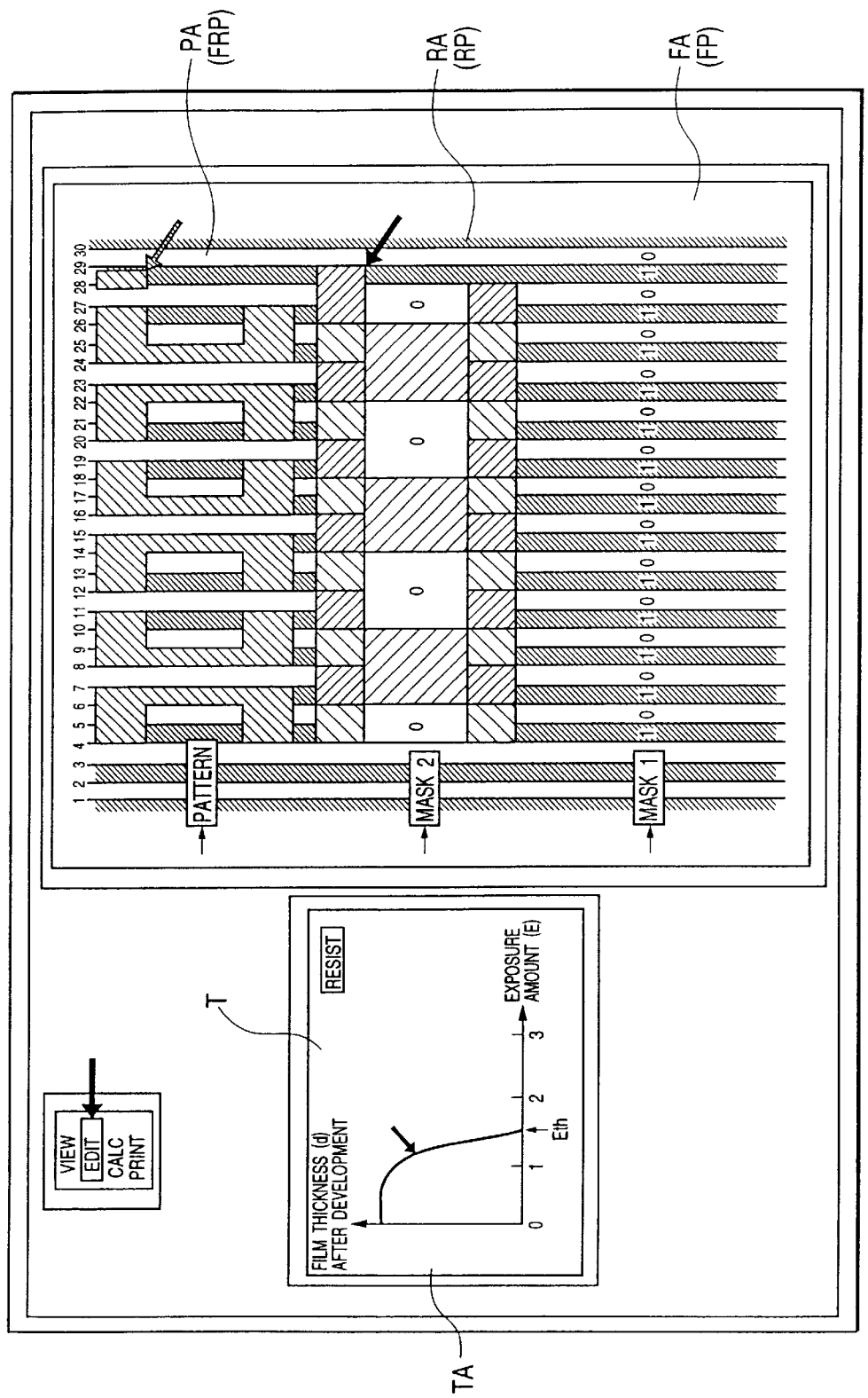
FIG. 25 is an explanatory diagram to show a screen display in Embodiment 1 of the pattern computing apparatus and pattern computing method according to the present invention.

FIG. 25 is a schematic diagram to show another screen display method for display by the display means in the present embodiment. When compared with the display means of FIG. 24, FIG. 25 shows a vertically continuous display on the screen to display the display section FA displaying the micro-line pattern FP (MASK1) based on the micro-line pattern data FD, the display section RA displaying the rough pattern RP (MASK2) based on the rough pattern data RD, and the display section PA displaying the pattern FRP (PATTERN) based on the forming pattern data FRD computed and actually gained by the multiple exposure computing means.

This permits the operator to readily recognize what positional relation is established among the patterns (FP, RP, FRP), on the screen.

The effect of the computation (particularly, the optimization operation) of the present invention will be described with the example of FIG. 25. FIG. 25 is the display indicating the micro-line pattern FP represented by MASK1 in the figure, the rough pattern RP represented by MASK2, and the forming pattern FRP represented by PATTERN in one window so as to facilitate easy recognition of the positional relation (overlay) among them.

The present invention demonstrates its great effect, for example, where the design is carried out in such a way that PATTERN (object forming pattern) and MASK1 (micro-line pattern) are inputted and MASK2 (rough exposure pattern) is the result to be gained. The reason is as follows. Since input PATTERN and MASK1 both have symmetry, i.e., since the gate pattern of the basic unit of PATTERN is symmetric with respect to the center line and the periodic pattern of MASK1 is also symmetric with respect to the center line, it is normally common to consider that the pattern of MASK2 is also symmetric with respect to the center line, from intuition. This is because the multiple exposure and the operation of filtering with the resist threshold seem not so complex and not to destroy the symmetry with respect to the center line.

The actual answer is, however, a clearly asymmetric pattern as indicated by MASK2 in the figure. This is due to such a restriction that the size of blocks in one pattern where a halftone is used for the rough pattern is double the period of the micro-line pattern (i.e., the resolution of the rough exposure in the multiple exposure is half of the resolution of the micro-line exposure).

This example teaches us that it is difficult for a designer to intuitively find out an answer even to the operation based on simple addition and that it is necessary to use total inspection (to divide the pattern into meshes and search for those fitting the restriction condition in all combinations) or the optimization operation (a specific algorithm, for example, a search using the simulated annealing method or the like), making use of the computing ability after the computation.

The present invention provides the system for carrying out the design of the mask pattern etc. necessary for formation of pattern by the multiple exposure and the present invention achieves the effect of efficient design within short time.

Figure 26:
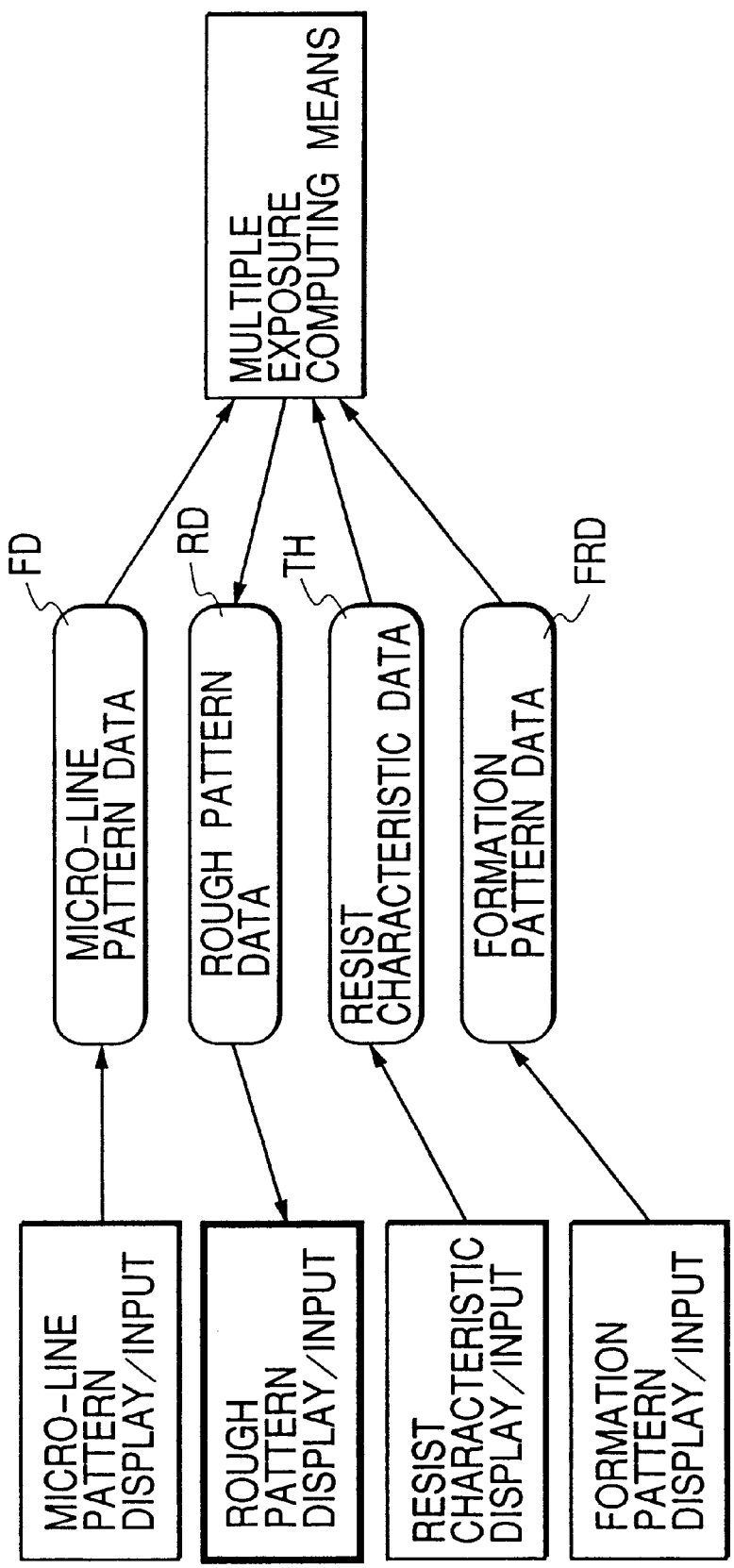
FIG. 26 is a block diagram of major part of Embodiment 2 of the pattern computing apparatus and pattern computing method according to the present invention.

FIG. 26 is a block diagram of major part of Embodiment 2 of the pattern computing apparatus according to the present invention. The present embodiment is constructed in such structure that the multiple exposure computing means accepts the following input.

(b-1) The micro-line pattern data FD is inputted from the micro-line pattern display/input means (micro-line pattern handling means) into the computing means.

(b-2) The resist characteristic data TH is inputted from the resist characteristic display/input means (characteristic parameter handling means) into the computing means.

(b-3) A pattern of an actually expected shape, i.e., the forming pattern data FRD obtained on the photosensitive substrate (wafer) is inputted from the forming pattern display/input means (forming pattern handling means) into the computing means.

Based on these various data FD, TH, FRD, the multiple exposure computing means (optimization operation means) computes the rough pattern data RD for gaining the forming pattern FRP based on the forming pattern data FRD by the multiple exposure.

Then the rough pattern data RD is outputted to the rough pattern display/input means. The rough pattern display/input means displays the pattern RP based thereon in the screen. For example, in FIG. 24 or FIG. 25, the rough pattern RP is displayed in the screen.

The present embodiment is adapted to calculate one rest data from three arbitrary data out of the four data (parameters), these three data at this time being arbitrary.

Figure 27:
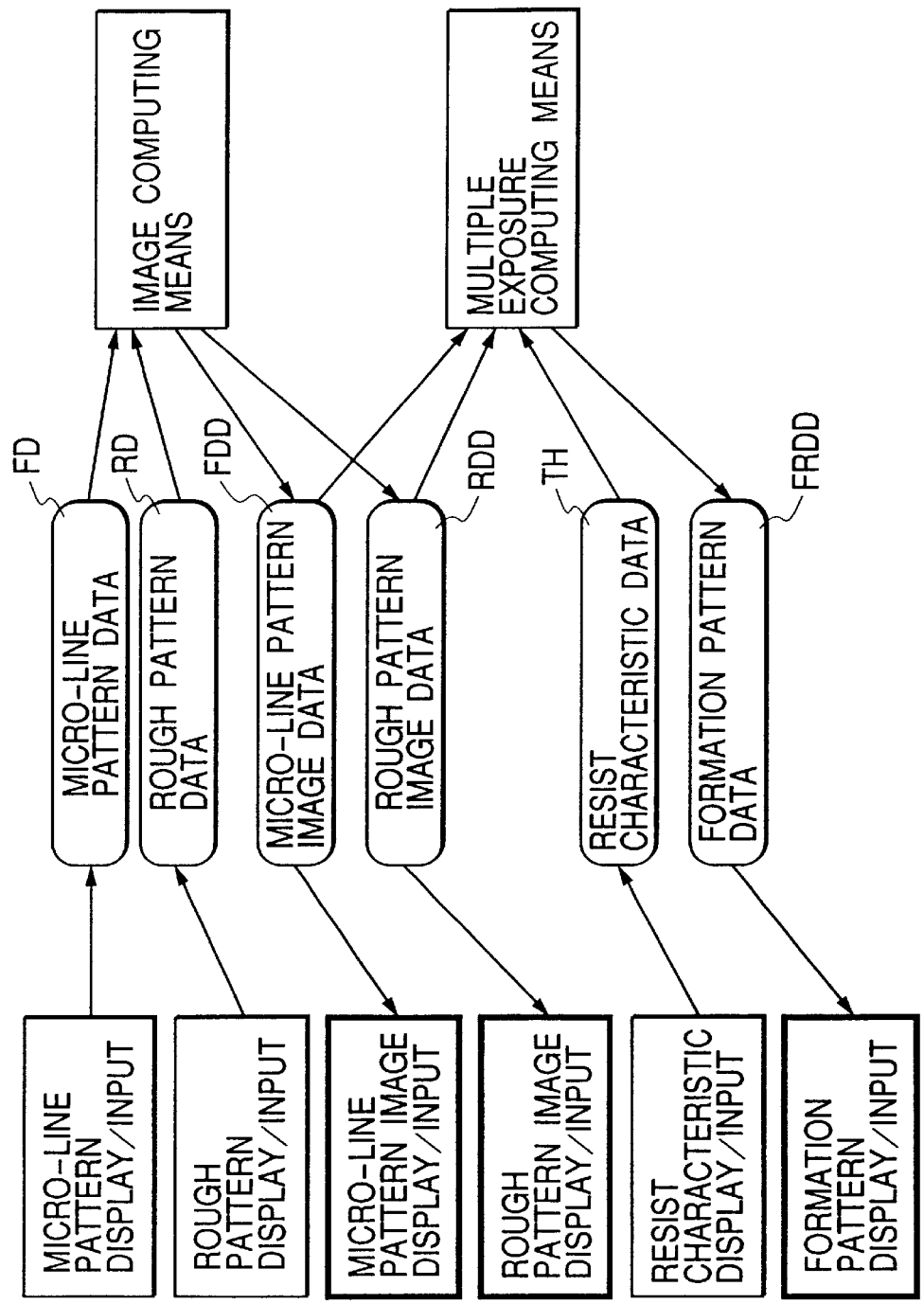
FIG. 27 is a block diagram of major part of Embodiment 3 of the pattern computing apparatus and pattern computing method according to the present invention.

FIG. 27 is a block diagram of major part of Embodiment 3 of the pattern computing apparatus and pattern computing method according to the present invention. The present embodiment is further provided with image computing means, when compared with Embodiments 1, 2 of FIG. 23 and FIG. 26, and is adapted to compute what pattern image (micro-line pattern image data or rough pattern image data) is obtained through the actual exposure apparatus, from the micro-line pattern data and the rough pattern data. The multiple exposure computing means gains the forming pattern data, using such data.

Specifically, the operation is carried out as follows.

(c-1) The micro-line pattern data FD is inputted from the micro-line pattern display/input means into the image computing means.

(c-2) The rough pattern data RD is inputted from the rough pattern display/input means into the image computing means.

(c-3) The image computing means computes the micro-line pattern image data FDD and the rough pattern image data RDD each to be gained actually through the exposure apparatus, from the micro-line pattern data FD and the rough pattern data RD, and outputs these image data to the multiple exposure computing means, the micro-line pattern image date FDD to micro-line pattern image display/input means, and the rough pattern image date RDD to rough pattern image display/input means.

(c-4) The micro-line pattern image display/input means displays the micro-line pattern image data FDD or/and the pattern thereof in the screen.

(c-5) The rough pattern image display/input means displays the rough pattern image data RDD or/and the pattern thereof in the screen.

(c-6) The resist characteristic data TH is inputted from the resist characteristic display/input means into the multiple exposure computing means.

(c-7) The multiple exposure computing means computes the forming pattern data FRDD to be obtained on the photosensitive substrate (wafer) by the multiple exposure, from the micro-line pattern image data FDD, the rough pattern image data RDD, and the resist characteristic data TH, and outputs the data to the forming pattern display/input means.

(c-8) The forming pattern display/input means displays the forming pattern data FRDD computed by the multiple exposure computing means or/and the pattern thereof in the screen.

Each of the micro-line pattern display/input means and the micro-line pattern image display/input means constitutes one element of the micro-line pattern handling means. Each of the rough pattern display/input means and the rough pattern image display/input means constitutes one element of the rough pattern handling means.

Figure 28:
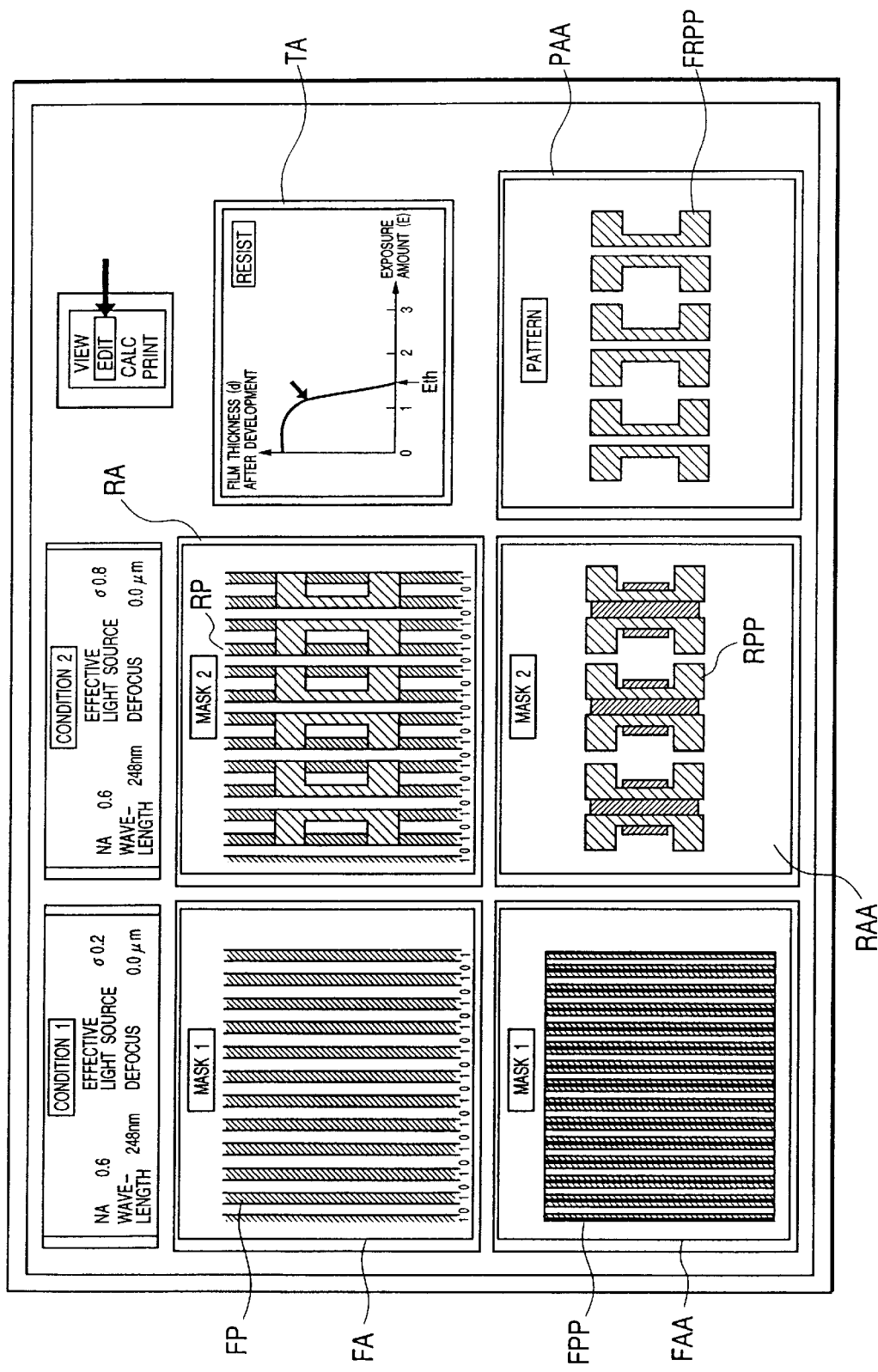
FIG. 28 is an explanatory diagram to show a screen display in Embodiment 2 of the pattern computing apparatus and pattern computing method according to the present invention.

FIG. 28 is a schematic diagram of a screen display method for display by the display means (forming pattern display/input means) in the present embodiment.

In FIG. 28, FA is a display section for displaying the micro-line pattern FP (MASK1) based on the micro-line pattern data FD, and RA is a display section for displaying the rough pattern RP (MASK2) base on the rough pattern data RD.

The display section RA displays both the rough pattern RP and the micro-line pattern FP of the display section FA so as to help the operator readily recognize the positional relation between them. PA is a display section for displaying the forming pattern FRP based on the forming pattern data FRD. TA is a display section for displaying the gamma characteristic y based on the resist characteristic data TH.

FAA is a display section for displaying the micro-line pattern image data FDD (IMAGE1) based on the micro-line pattern data FD, RAA a display section for displaying the rough pattern image data RDD (IMAGE2) based on the rough pattern data RD, and PAA a display section for displaying the forming pattern FRPP based on the forming pattern data FRDD. The present embodiment is adapted to compute the various data gained by the apparatus illustrated in FIG. 27 and display the data and patterns in the respective display sections in real time.

FIG. 29 is a block diagram of major part of Embodiment 4 of the pattern computing apparatus and pattern computing method according to the present invention. The present embodiment is different from Embodiment 3 of FIG. 27 only in the parameters computed by the image computing means, the parameter computed by the multiple exposure computing means, and the finally expected parameter (rough pattern data RD), and its basic pattern computing method and pattern display method are the same.

The present embodiment is adapted to input the forming pattern data expected to obtain on the photosensitive substrate and to gain a parameter of an ideal circuit pattern (rough pattern data) in the design stage.

(d-1) The micro-line pattern data FD is inputted from the micro-line pattern display/input means into the image computing means.

(d-2) The resist characteristic data TH is inputted from the resist characteristic display/input means into the multiple exposure computing means.

(d-3) A pattern of an actually expected shape, i.e., the forming pattern data FRDD to be gained on the photosensitive substrate (wafer) is inputted from the forming pattern display/input means into the multiple exposure computing means.

(d-4) The image computing means computes the micro-line pattern image data FDD to be obtained actually through the exposure apparatus, from the micro-line pattern data FD, and outputs this image data FDD to the multiple exposure computing means and to the micro-line pattern image display/input means.

(d-5) The micro-line pattern image display/input means displays the micro-line pattern image data FDD or/and the pattern thereof in the screen.

(d-6) The multiple exposure computing means computes the rough pattern image data RDD to be gained through the exposure apparatus by the multiple exposure, from the micro-line pattern image data FDD, the forming pattern data FRDD, and the resist characteristic data TH, and outputs the data to the rough pattern image display/input means and to the image computing means.

(d-7) The rough pattern image display/input means displays the rough pattern image data RDD or/and the pattern thereof in the screen.

(d-8) The image computing means computes the micro-line pattern image data FDD after pass through the exposure apparatus, from the micro-line pattern image data FD, and outputs the data to the micro-line pattern image display/input means.

Further, the image computing means computes the rough pattern data RD (corresponding to the designed value) before pass through the exposure apparatus, from the rough pattern image data RDD, and outputs the data to the rough pattern display/input means.

(d-9) The micro-line pattern image display/input means displays the micro-line pattern image data FDD or/and the pattern thereof in the screen.

(d-10) The rough pattern display/input means displays the rough pattern data RD in the screen.

In the present embodiment the finally expected parameter was the rough pattern data RD, but, without having to be limited to this, any parameter can be arbitrarily selected, based on input of data of predetermined parameters.

Figure 30B:
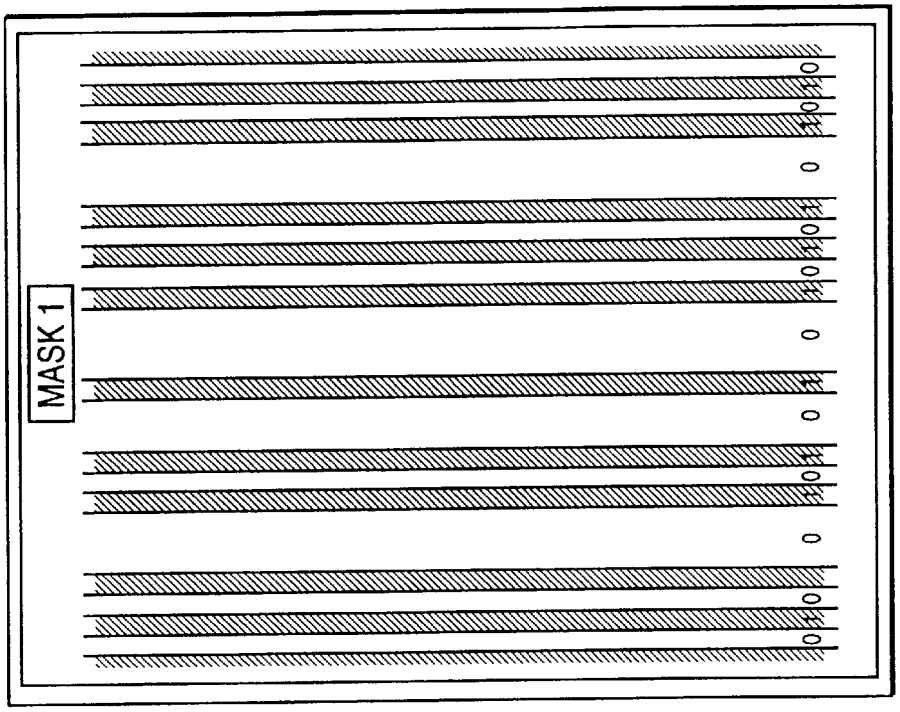
FIG. 30A and FIG. 30B are explanatory diagrams of micro-line patterns according to the present invention.
Figure 30A:
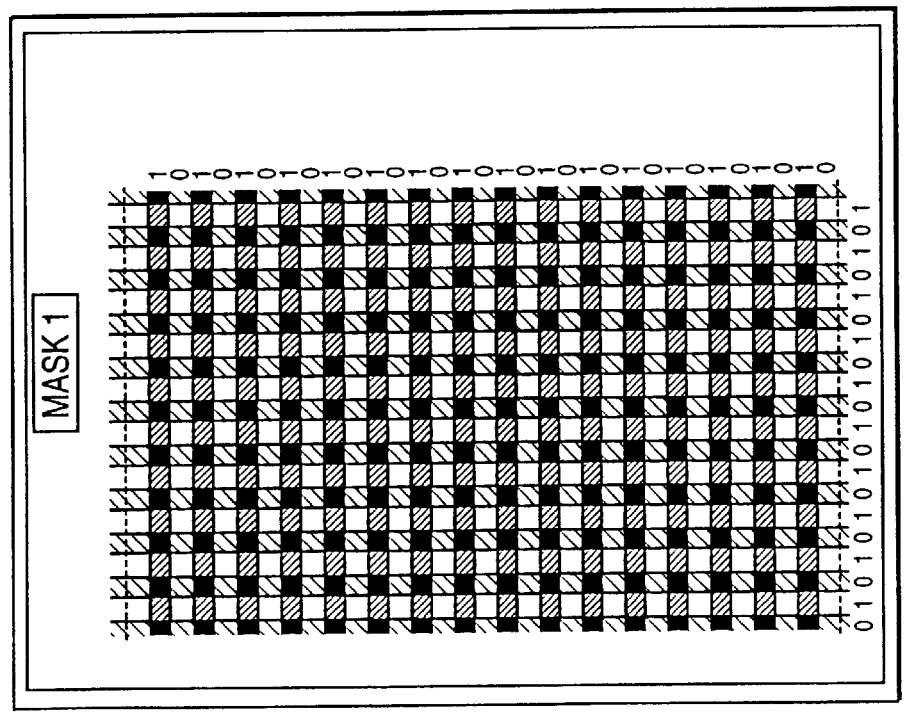

In each of the above embodiments the micro-line pattern does not always have to be the periodic pattern, but it may be a two-dimensional pattern or a double pattern; for example, a checkerboard pattern as illustrated in FIG. 30A or a pattern in which lines are arranged at irregular pitch, as illustrated in FIG. 30B.

The software of the present invention is programmed based on the above computing methods. Further, a memory medium of the present invention stores the software programmed based on the above computing methods.

Described below are some other embodiments of the present invention. Each embodiment can employ the pattern creating apparatus described above as occasion may demand. A first additional embodiment is a creating method of mask data corresponding to the multiple exposure technology described in Japanese Laid-open Patent Application No. 11-1403085, the creating method of mask data having a first step of preparing fine-line pattern data (Nor) corresponding to a fine-line pattern desired to form after exposure, a second step of carrying out a logical operation between Levenson pattern data (LEV) of a Levenson type phase shift mask (see FIG. 17(A)) for formation of a periodic pattern, and Nor, a fourth step of determining whether data extracted by the logical operation satisfies a design rule of a rough mask pattern, a fifth step of revising the extracted data according to the result of the determination in the fourth step, and a sixth step of setting a mask transmittance in each area for the data resulting from the logical operation or for the data obtained through the fifth step.

A second additional embodiment is a creating method of mask data corresponding to the multiple exposure technology as described in aforementioned Japanese Laid-open Patent Application No. 11-1403085, the creating method of mask data having a first step of preparing fine-line pattern data (Nor) corresponding to a fine-line pattern desired to form after exposure, a second step of carrying out a logical operation between the aforementioned Levenson pattern data (LEV) and Nor, a third step of grouping data generated in the second step in accordance with set values of transmittances of a mask, a fourth step of determining whether the grouped data satisfies a design rule of a rough mask pattern, a fifth step of revising the grouped data in accordance with the result of the determination in the fourth step, a sixth step of setting a mask transmittance in each area for the grouped data obtained after the fourth and fifth steps, a seventh step of carrying out a logical operation with Nor after the sixth step and determining whether the desired fine-line pattern can be formed, a step of revising the pattern of data and setting of transmittances formed in the sixth step, based on the result of the determination in the seventh step, and a repeating operation step of repeating the fourth to seventh steps to find out a solution satisfying the both conditions of the design rule of the rough mask pattern and the setting of mask transmittances.

In the above methods, the second step includes either one of a step of preparing first operation data by carrying out an AND operation of LEV and Nor, for example, a step of preparing second operation data by excluding the first operation data from LEV, a step of preparing third operation data by excluding the first operation data from Nor, and a step of preparing fourth operation data by carrying out an OR operation of the first, second, and third data and thereafter carrying out an inversion operation thereof. The pattern revising method for satisfying the design rule of the rough mask pattern is a method of reducing or enlarging the data or a method of moving one side of data at a portion conflicting with the rule.

The most of the methods of the present invention can be executed by a computer and, therefore, a data preparing person needs only to prepare and input data of the same shape as the pattern finally desired to form on the resist (target pattern data). Generation of the mask pattern data thereafter can be automatically carried out by the computer according to the above procedures, and the optimal mask pattern can be created efficiently even in the design of large-scale semiconductor integrated circuits.

Specific examples will be described referring to the drawings.

Figure 31:
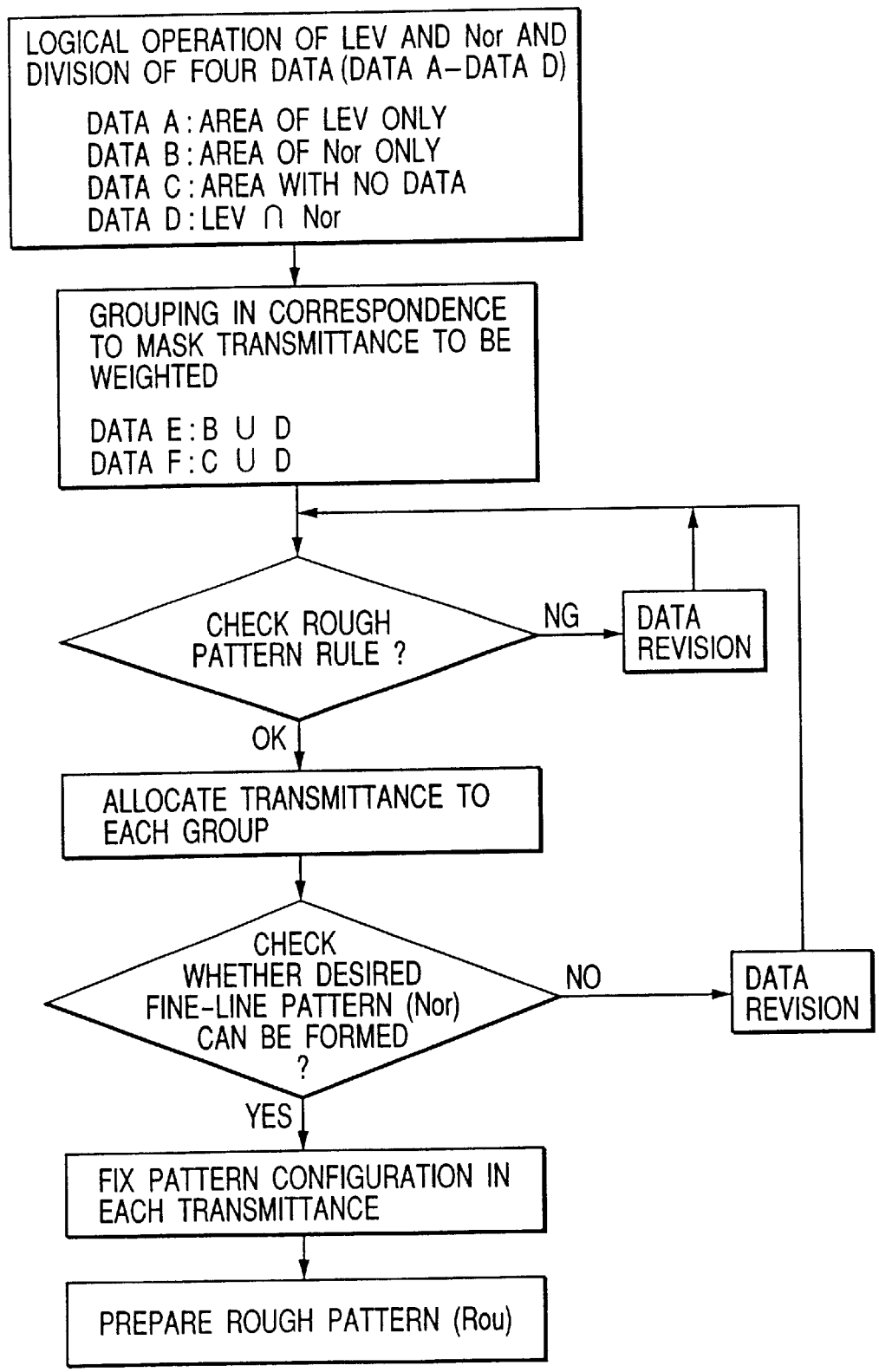
FIG. 31 is a flowchart to show a rough pattern data preparing method according to an embodiment of the present invention.
Figure 32B:
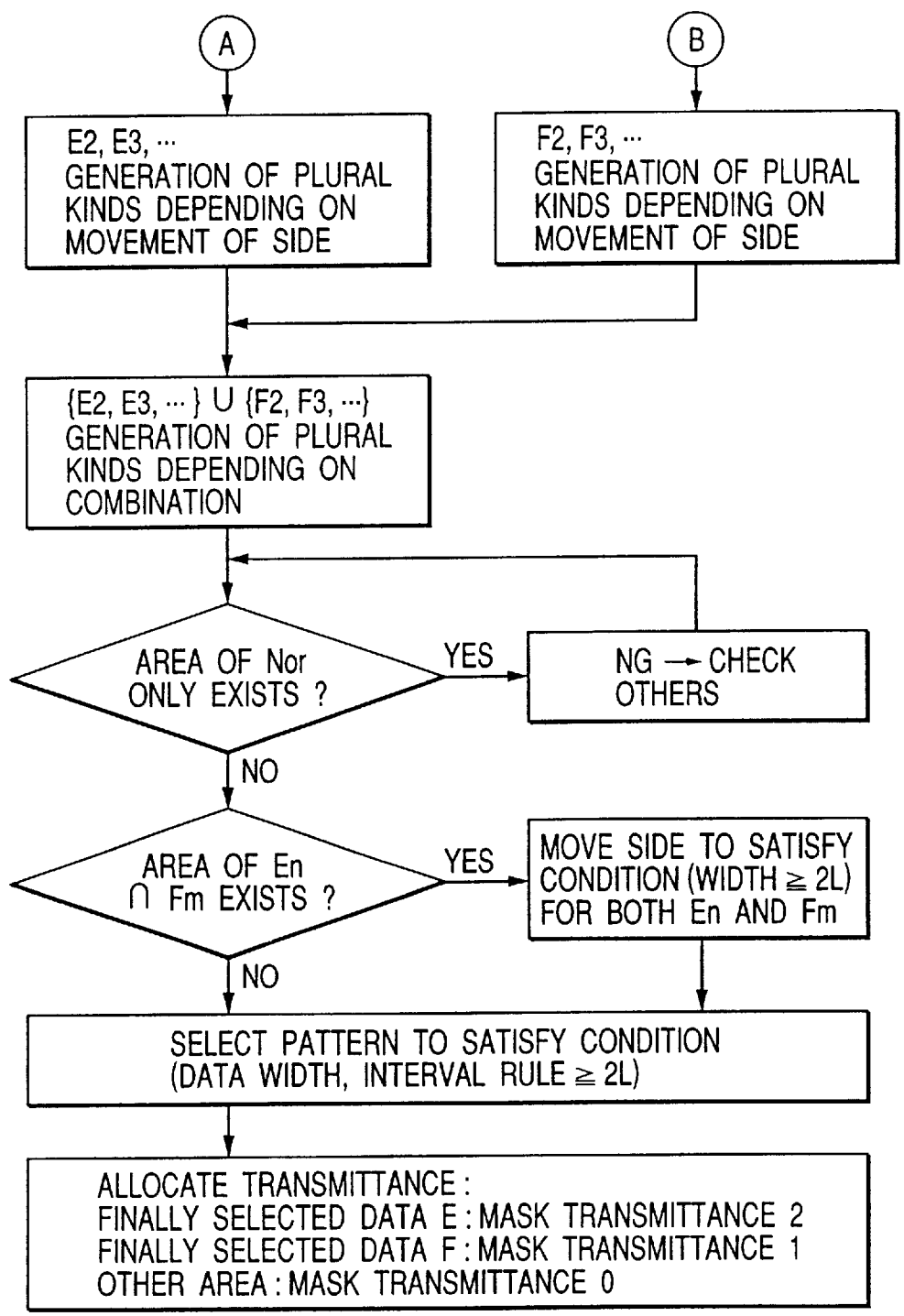
FIG. 32 which is composed of FIGS. 32A and 32B are flowcharts to show the more detailed flow of the preparing method of FIG. 31.

FIG. 31 is a flowchart to show a rough pattern data preparing method according to an embodiment of the present invention and FIGS. 32A and 32B are flowcharts to show the preparing method in more detail.

Figure 33:
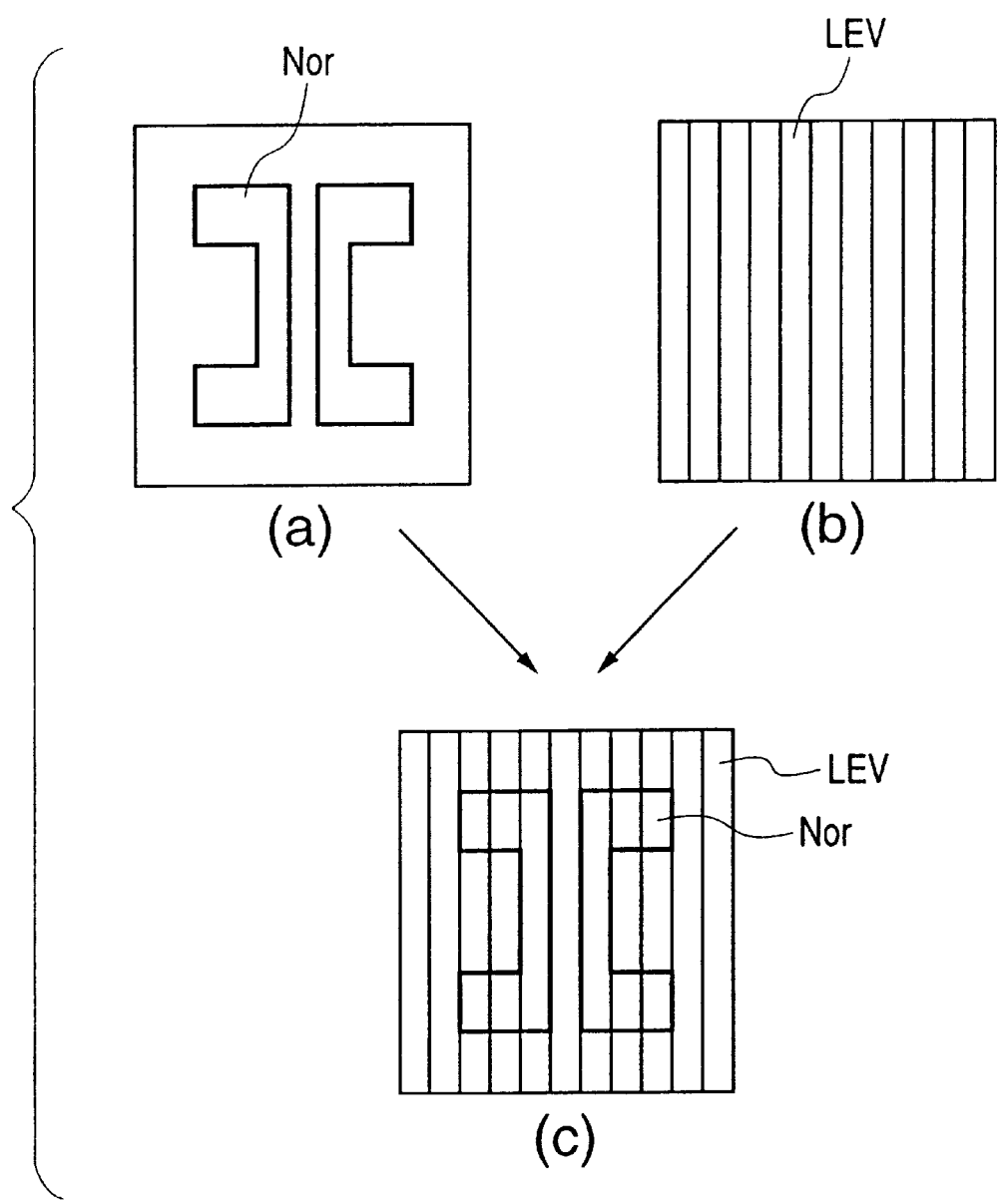
FIG. 33 is an explanatory diagram to show the relationship between a Levenson pattern and a target pattern.

This example is a preparing method of rough pattern Rou, as illustrated in FIG. 33, using the Levenson pattern LEV having the line width L (light transmitting portions) and the spacing S (light intercepting portions) both equal to L (the pitch 2L, where L is, for example, 0.10 $\mu$m) as the micro-line pattern, the preparing method of rough pattern Rou being adapted to form the target pattern (a circuit pattern desired to form finally) Nor by superposition thereof with the Levenson pattern. The Levenson pattern LEV is printed in light amounts below the exposure threshold of the photoresist, for example, by the aforementioned two-beam interference exposure, and the rough pattern Rou is printed, for example, by use of the normal projection exposure apparatus. Let us assume that portions desired to be left as fine lines in the target pattern Nor are arranged at the pitch 2L or at integral multiples thereof. The light transmitting portions of the rough pattern Rou are set as portions that singly transmit a light amount over the exposure threshold of the photoresist, irrespective of presence or absence of exposure by the Levenson pattern LEV and as portions that transmit a light amount over the exposure threshold of the photoresist first after duplicate exposure with the exposure by the Levenson pattern LEV. The size (each light transmitting portion) and the spacing (light intercepting portions) of the rough pattern Rou are set each to n times L (where n is an integer not less than 2).

The data preparing method of the present example will be explained next referring to FIGS. 31 to 41.

The first step is to prepare data of the pattern Nor in the same shape as that desired to form finally on the photoresist. On this occasion, portions expected to form a fine-line pattern (a pattern having the width or spacing of L) are prepared as data overlapping with the Levenson pattern LEV. Let us assume here that the data of the Levenson pattern LEV is preliminarily inputted.

Figure 34:
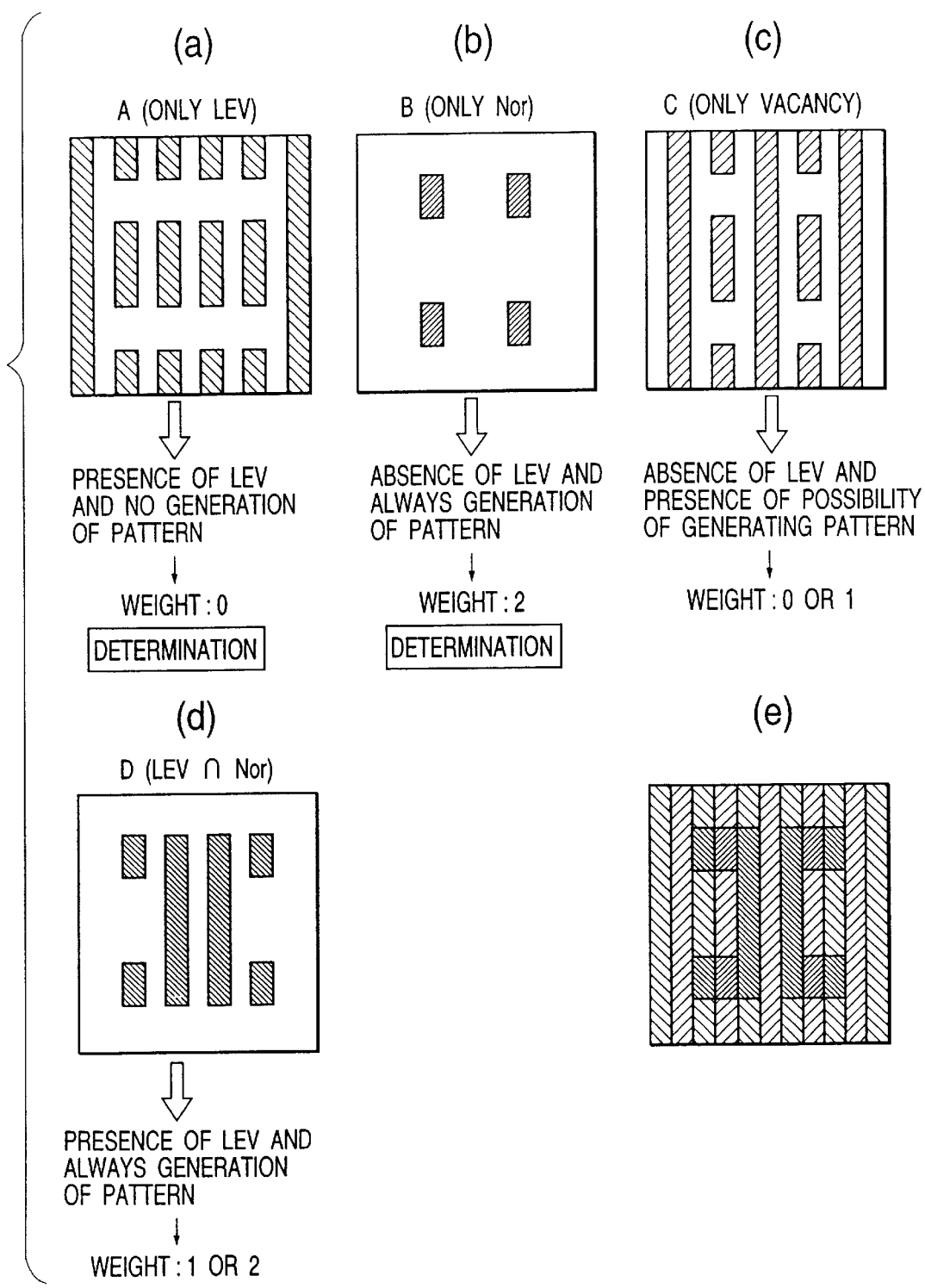
FIG. 34 is an explanatory diagram to show four types of weight areas obtained by logical operations of Levenson pattern data and target pattern data.

Four operations described below are carried out using the two types of data to divide the data into four types of data as illustrated in FIG. 34.

Data A=LEV−D
Data B=Nor−D
Data C=the whole−(A OR B OR D)
Data D=LEV AND Nor

Let us suppose here that the transmittance of portions without mask data is 0, the transmittance of data areas of the Levenson mask is 1, and the transmittance of the rough pattern mask is 1 or 2 depending upon data areas. Then there appear four types of areas having the transmittance 0, 1, 2, or 3 during the exposure by the combination of the two patterns. When the threshold exposure amount (threshold) is set between the areas with the high transmittances of 2, 3 and the areas with the low transmittances of 0, 1 at this time, the desired pattern is formed on the photoresist corresponding to the combined areas with the high transmittances 2, 3. It is noted that the transmittances 0, 1, 2, and 3 stated here are used just for convenience and have no physical meaning, in order to facilitate the description.

Now let us consider the data A to D under the above setting. Since the data B corresponds to the areas in which the LEV is absent but the pattern is desired to form finally on the resist, the rough pattern mask data of the transmittance 2 must exist there. Since the areas of the data C are portions in which there is no data of LEV and the pattern is not formed finally on the resist, rough pattern mask data of the transmittance 0 or 1 has to exist there. Which transmittance 0 or 1 is to be selected is determined later on so as to satisfy the design rule concerning the width of the rough mask pattern. Since the areas of the data D correspond to areas in which there is the data of LEV and the pattern is desired to form on the resist, rough pattern mask data of the transmittance 1 or 2 has to exist there. Which transmittance 1 or 2 is to be selected is determined later on so as to satisfy the design rule concerning the width of the rough mask pattern.

Figure 35:
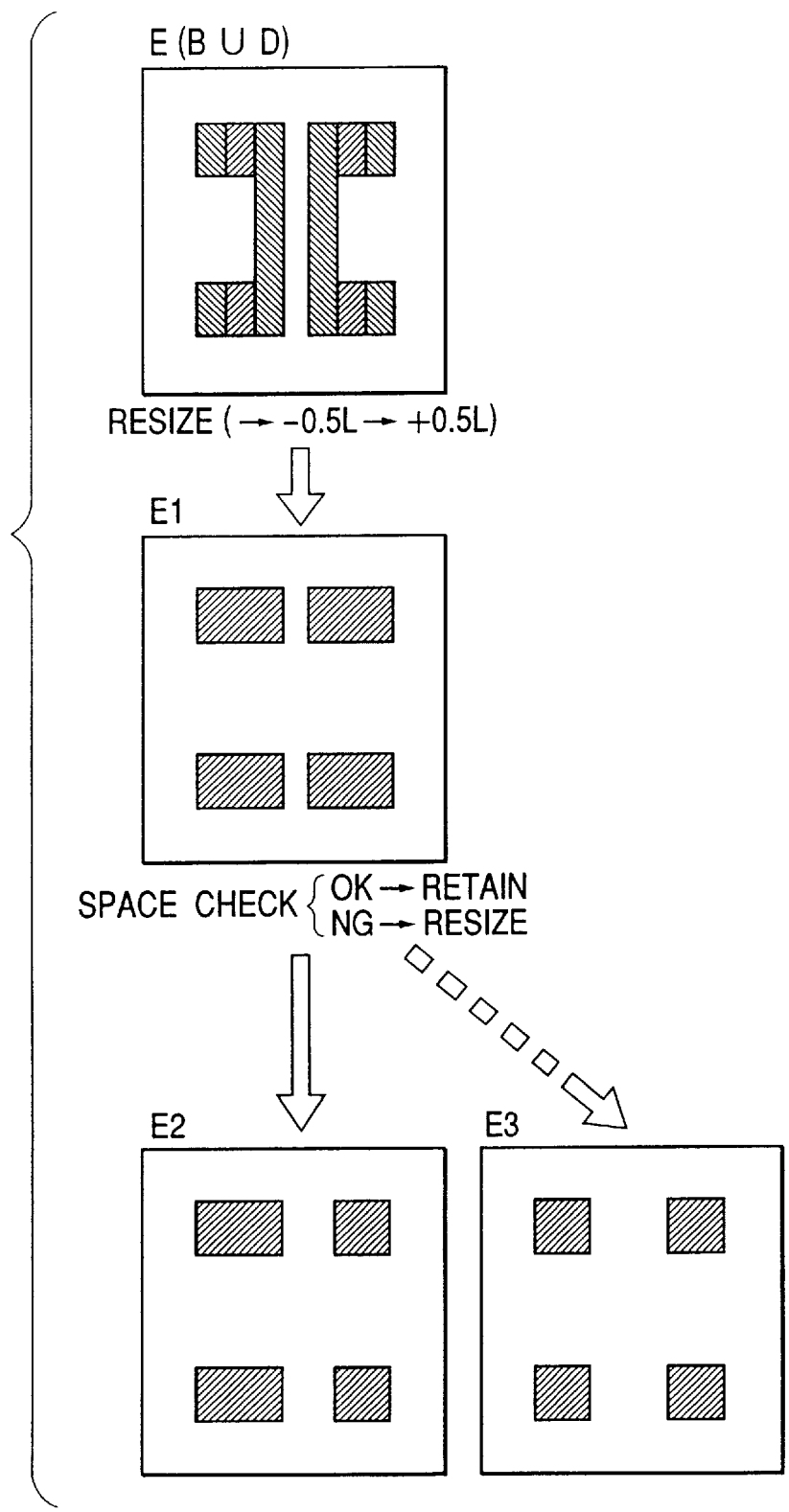
FIG. 35 is an explanatory diagram to show a pattern obtained by grouping areas with a maximum selectable weight and a way of revising it so as to satisfy the design rule of rough mask pattern.
Figure 36:
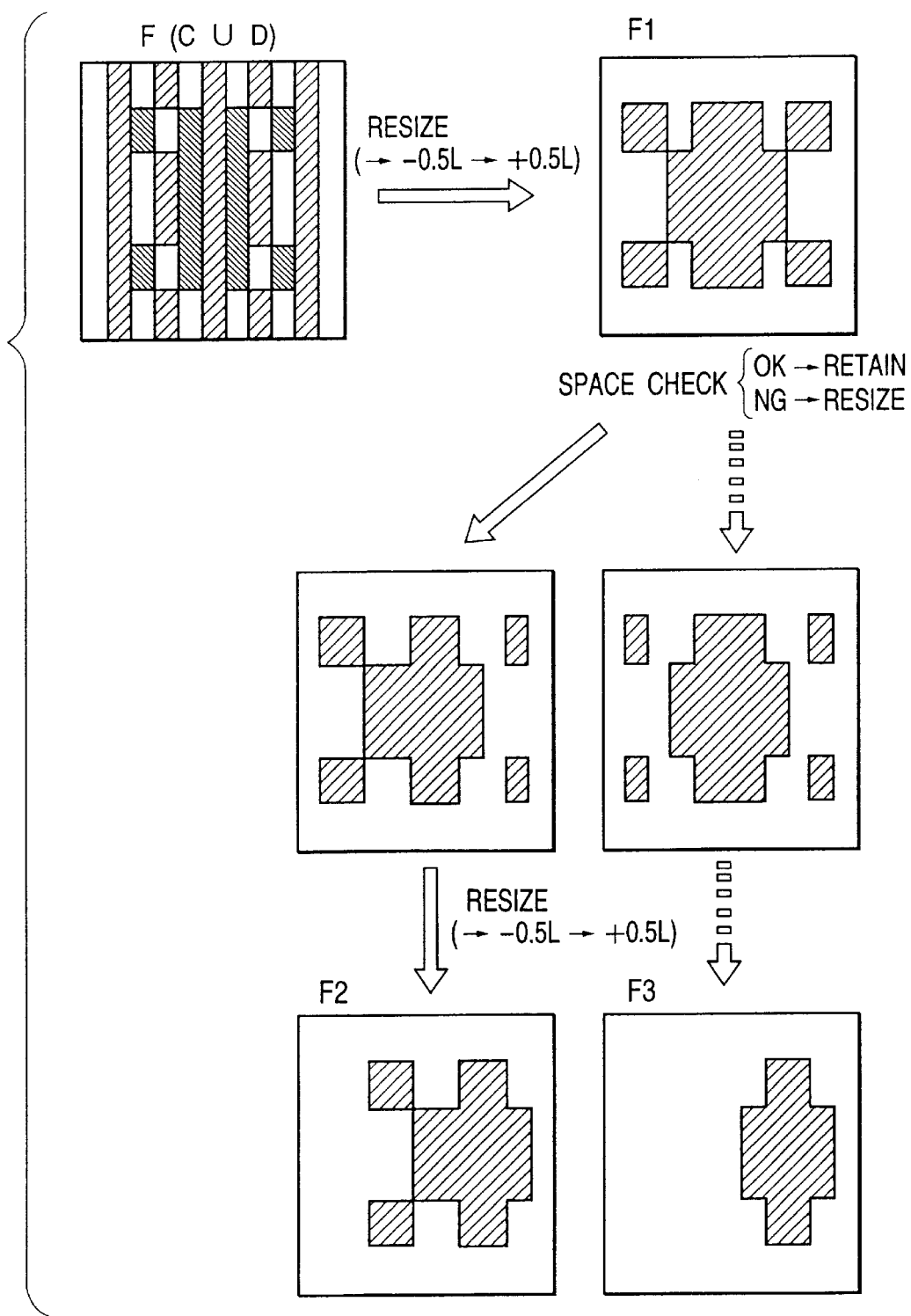
FIG. 36 is an explanatory diagram to show a pattern obtained by grouping areas with a next largest selectable weight to that of FIG. 35 and a way of revising it so as to satisfy the design rule of rough mask pattern.

Then the OR operation of data B and data D is carried out to generate data E (FIG. 35). This region includes all the areas to which the mask transmittance 2 is possibly assigned. Likewise, the OR operation of data C and data D is carried out to generate data F (FIG. 36). This region includes all the areas to which the mask transmittance 1 is possibly assigned.

Then the data E and F is resized so as to satisfy the design rule concerning the width of the rough pattern mask. Let us suppose here that the minimum reference unit L is the width or spacing of the LEV data, or half pitch, that the minimum design rule of the rough pattern mask is two times L, i.e., 2L, and that the minimum design unit is L. At this time the data E and the data F each is reduced by L/2 and thereafter is enlarged by L/2. Namely, each side of the patterns represented by the data E and data F is moved by L/2 toward the inside of each pattern, and each side of the left patterns is then moved by L/2 toward the outside of each pattern this time. This processing eliminates a pattern area having the width L out of the data E and data F and creates new data E1 and F1 comprised of only the areas having the width of not less than 2L, extracted from the data E and data F.

Then it is checked this time whether each of the data E1 and F1 satisfies the rule of the spacing of the rough pattern (not less than 2L). If the rule is not met the data will be revised so as to satisfy the rule of spacing by moving one side or the both sides of the data at the portion of interest by L. After that, since the sides are moved, the like reduction and enlargement operations of data as above are carried out again so as to satisfy the rule of width, thereby generating new data E2 and F2. There are possibilities that a plurality of data E2 and F2 is generated depending upon how to move the sides. FIG. 35 and FIG. 36 also show examples of revised data E3 and F3 different from E2 and F2.

E2 is a candidate for areas to which the mask transmittance 2 is assigned and F2 a candidate for areas to which the mask transmittance 1 is assigned. Therefore, areas (FIG. 37) resulting from OR of E2 and F2 must include all the aforementioned data Nor. The areas of (E2 OR F2) are compared with the data Nor, and a combination of data E2 and data F2 not satisfying the above condition is excluded.

Then areas resulting from AND of the data E2 and data F2 are extracted. These areas are revised into areas of the transmittance 1 or 2 so that each area with the corresponding transmittance being assigned satisfies the design rule of the rough pattern. At this stage an area not satisfying the design rule is eliminated.

The above procedures determine the final shape of the rough pattern and the assignment of transmittances to the respective areas.

Figure 39:
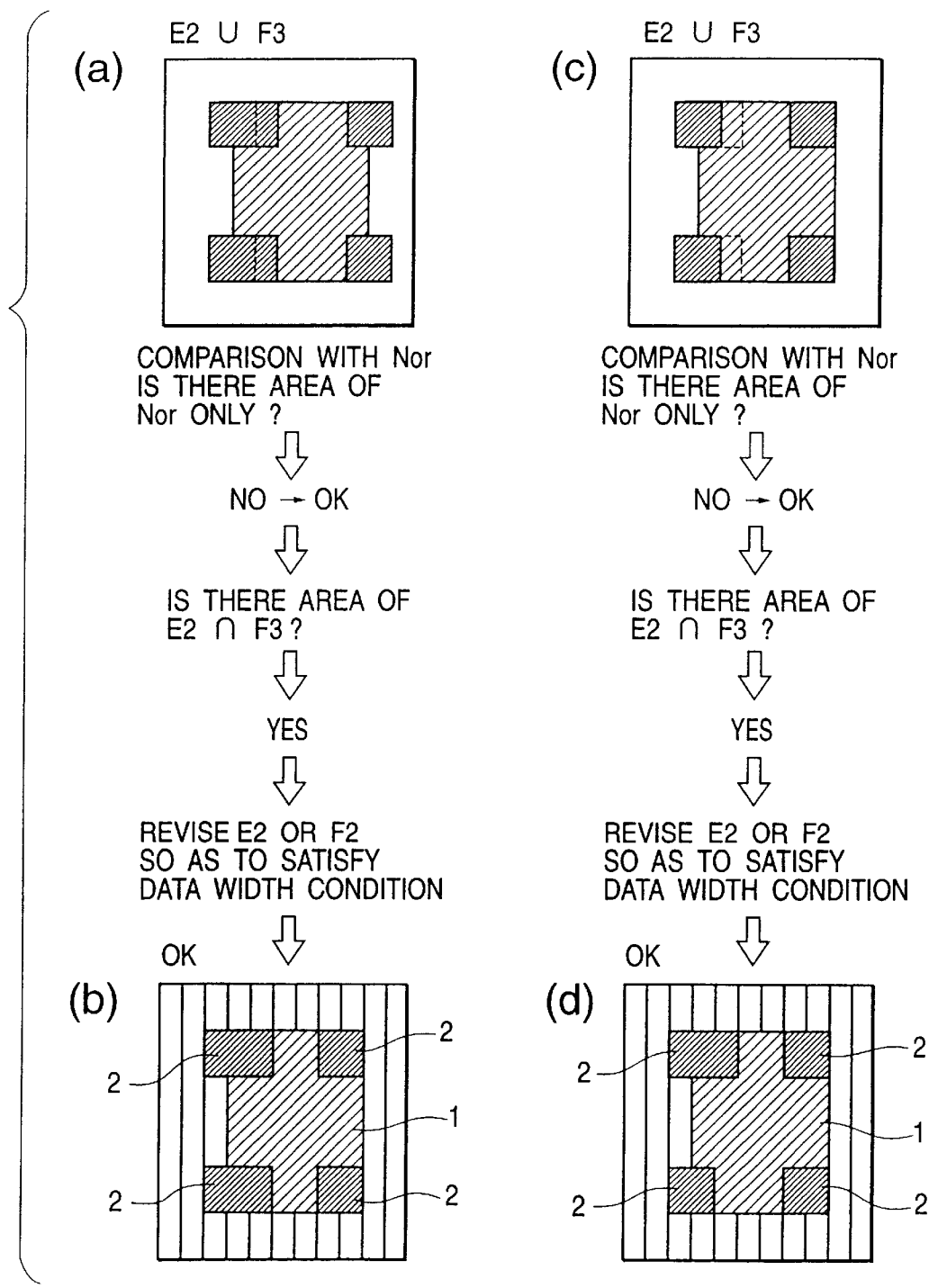
FIG. 39 is an explanatory diagram to show a way up to generation of a third rough mask pattern candidate by combining revised patterns E2 and F3 of FIG. 35 and FIG. 36, resizing each weight area, and setting a transmittance according to the weight of each area.

The final shape of rough pattern and the assignment of transmittances to respective areas are also determined in similar fashion for cases where E3 replaces E2 or F3 replaces F2 (FIGS. 38 and 39). FIG. 40 shows an example in which areas after OR of E3 and F2 fail to include part of the data Nor, which is thus excluded from candidates for the rough pattern. The above operation results in obtaining the three rough pattern candidates illustrated in FIGS. 37 to 39 in the present example. At the stage of synthesis of E2 (or E3) and F2 (or F3), a resultant rough pattern shape differs, depending upon which E2 (or E3) or F2 (or F3) is adopted at a duplicate portion thereof. For example, when OR is made between E2 and F2 with priority to F2, that is, when the pattern F2 is overlaid on the pattern E2, a rough pattern candidate illustrated in FIG. 38(b) is obtained without the revision described above. When the pattern F3 is overlaid on the pattern E2 as illustrated in FIG. 39(c), a rough pattern candidate illustrated in FIG. 39(d) is obtained.

Figure 41:
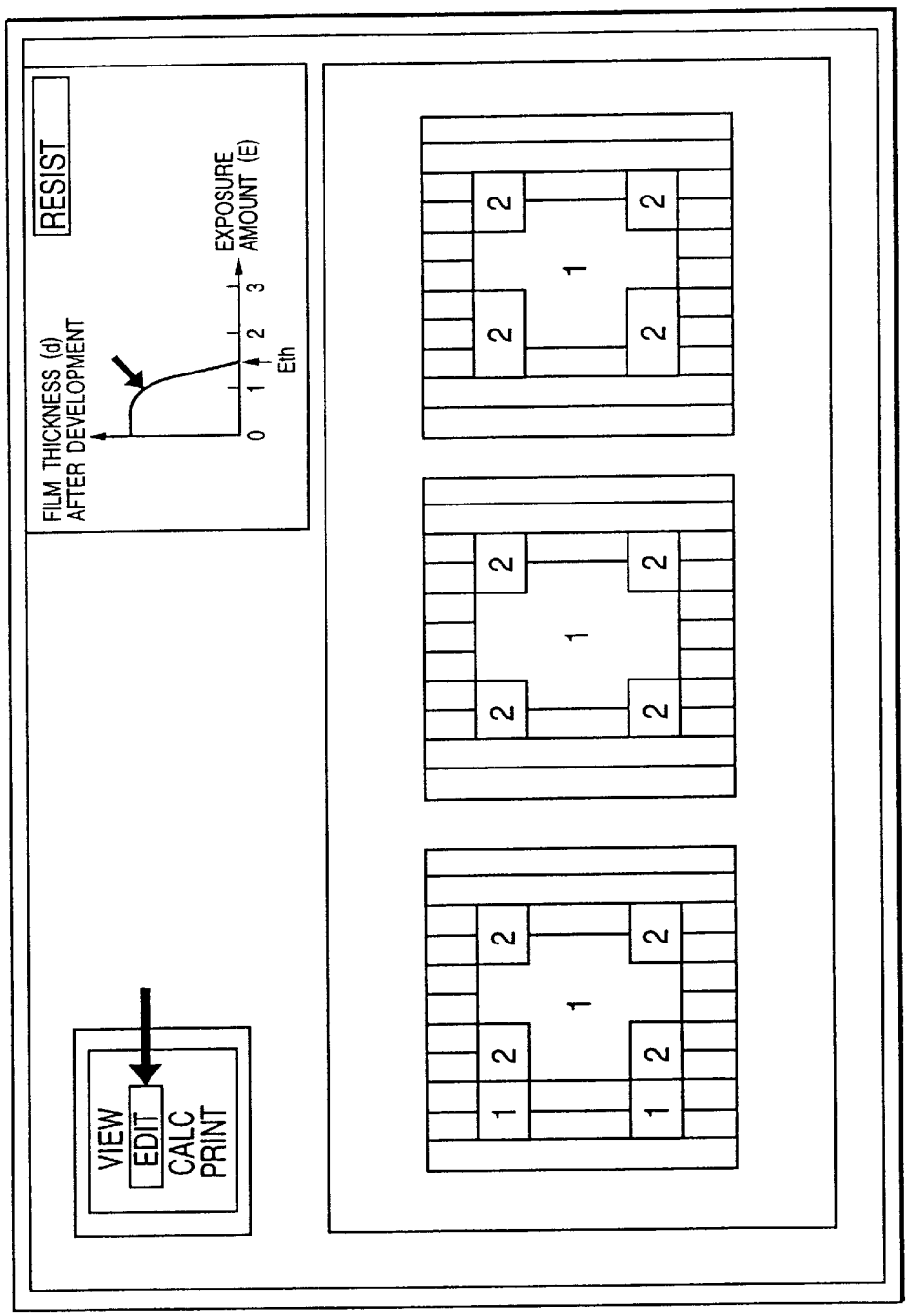
FIG. 41 is an explanatory diagram to show a state of a display of the rough mask pattern candidates of FIG. 37 to FIG. 39 on the display screen.

The resultant rough patterns or rough pattern candidates are displayed on the display, as illustrated in FIG. 41. When a plurality of rough pattern candidates are displayed on the display, the operator can select an arbitrary one of them by a direction command through the input device such as the mouse or the like.

It can also be contemplated that the computer selects one rough pattern, based on an appropriate rule, subsequent to the preparation of these rough pattern candidates. The selection rule in this case can be, for example, (1) better symmetry, (2) smaller data volume (fewer corners), and so on. The optimal rough pattern is the one illustrated in FIG. 38(b), based on this selection rule.

According to the present example, the operation by the data preparing person is only to prepare the data (target pattern data) of the same shape as the pattern desired to form finally on the resist, and the preparation of the rough pattern mask data thereafter is automatically carried out by the computer according to the above procedures; therefore, the optimal pattern can be created at high speed even in the design of large scale semiconductor integrated circuits.

In the design of large-scale logic circuits these years, the circuit designers often carry out the circuit design by logical description without attention to the actual layout pattern. In that case, the circuit designers can design semiconductor integrated circuits using the microscopic pattern according to the "IDEAL exposure technology" by the same techniques as before, by adding the automatic preparation procedure of the rough pattern mask data for the "IDEAL exposure technology" of the present example after the procedure of preparing the physical layout pattern to be formed on the resist, based on the logical description data from the logical description.

Figure 42:
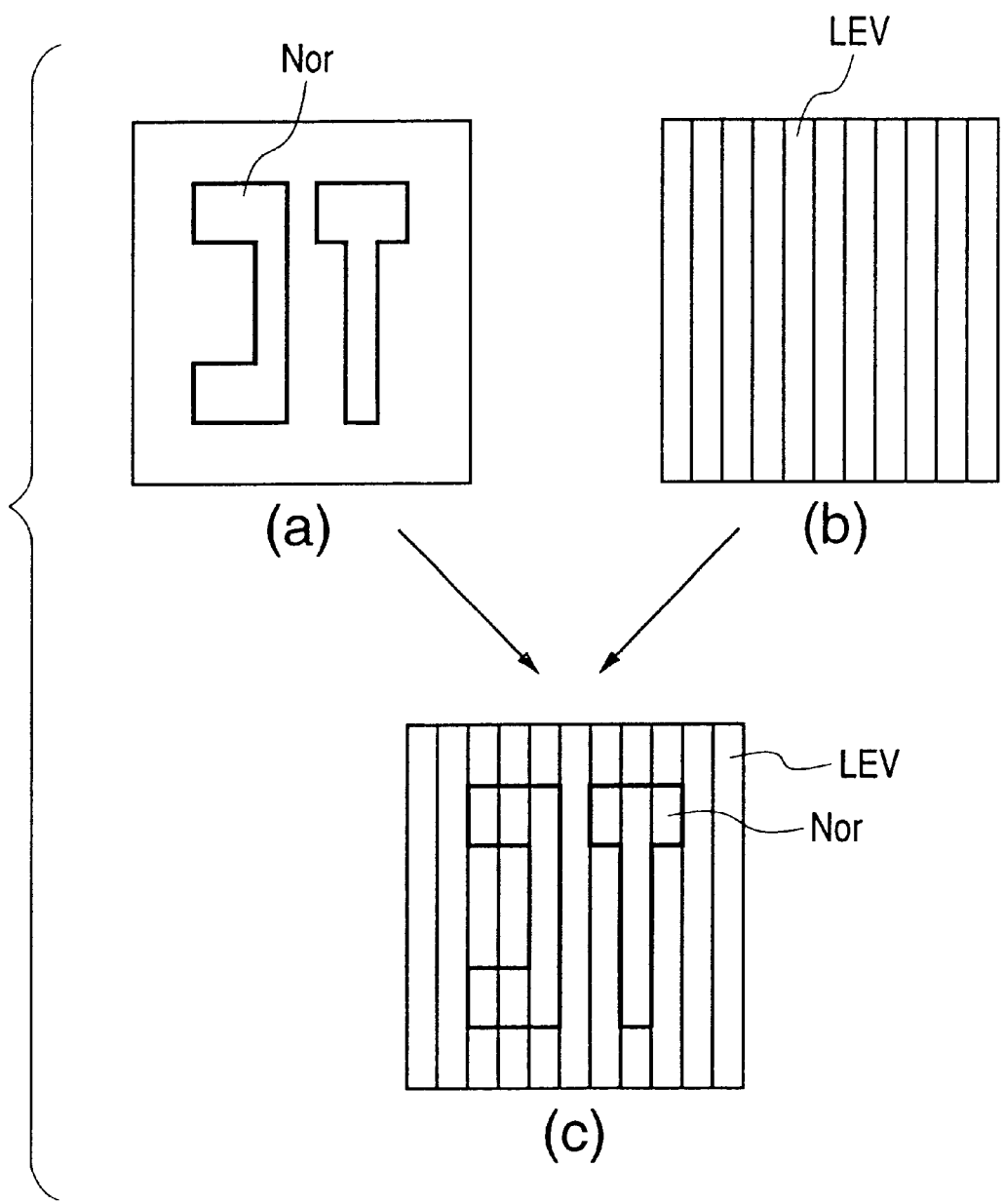
FIG. 42 is a diagram, similar to FIG. 33, to show another embodiment of the present invention.
Figure 43:
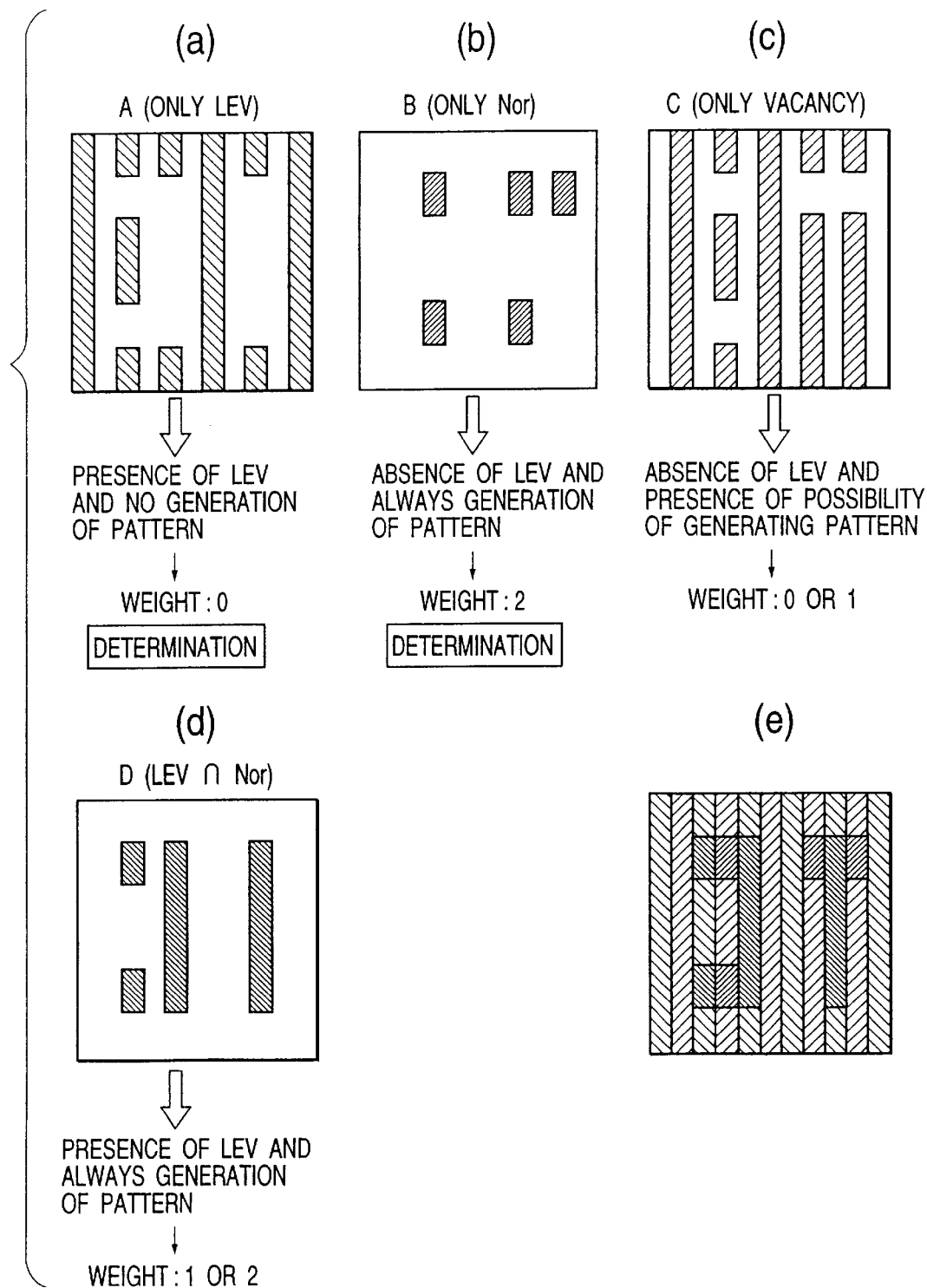
FIG. 43 is a diagram, similar to FIG. 34, to show another embodiment of the present invention.
Figure 44:
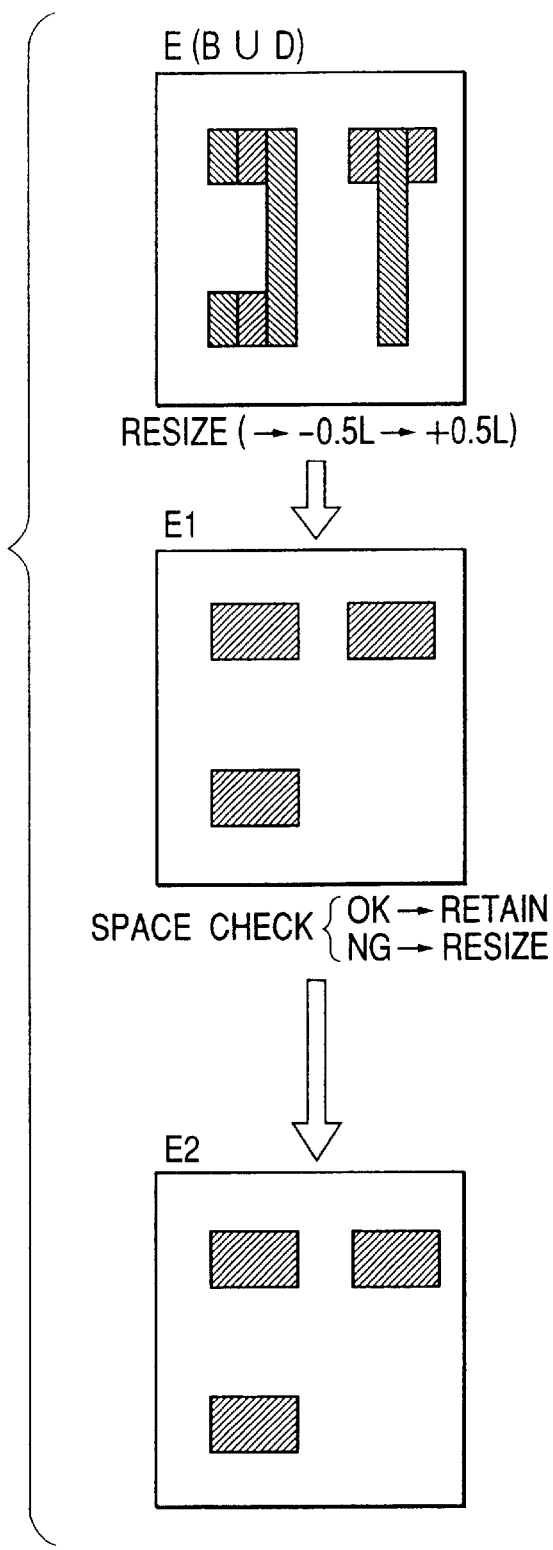
FIG. 44 is a diagram, similar to FIG. 35, to show another embodiment of the present invention.
Figure 45:
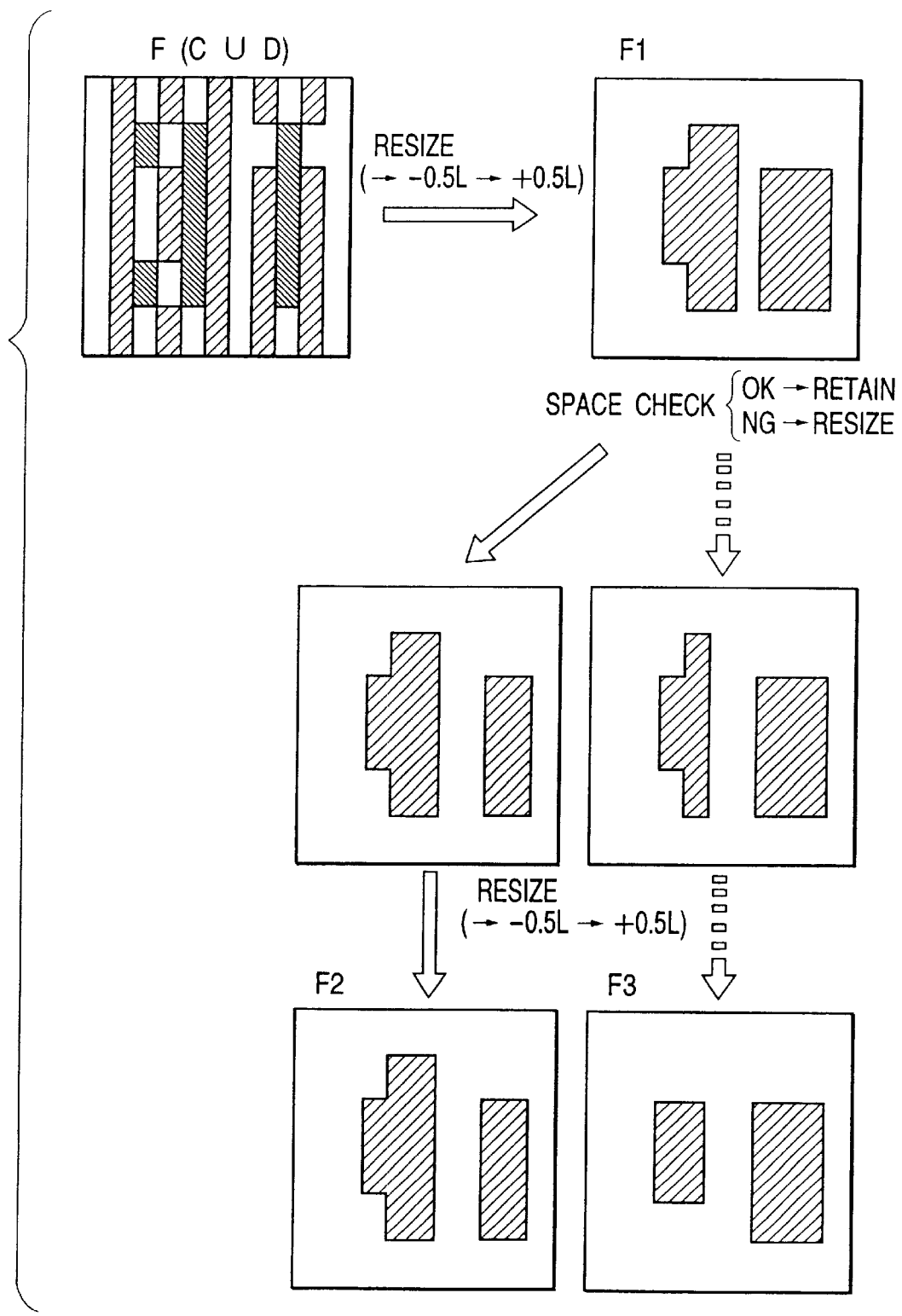
FIG. 45 is a diagram, similar to FIG. 36, to show another embodiment of the present invention.

FIGS. 42 to 46 show procedures for producing rough pattern mask data by applying the algorithm of Example 1 of FIG. 31 to a target pattern (a circuit pattern illustrated in FIG. 42(a)) different from the example of FIG. 38(a). It is seen that the present example also permits the rough pattern data to be generated readily from the circuit pattern desired to form on the resist, as in the aforementioned example.

Figure 46:
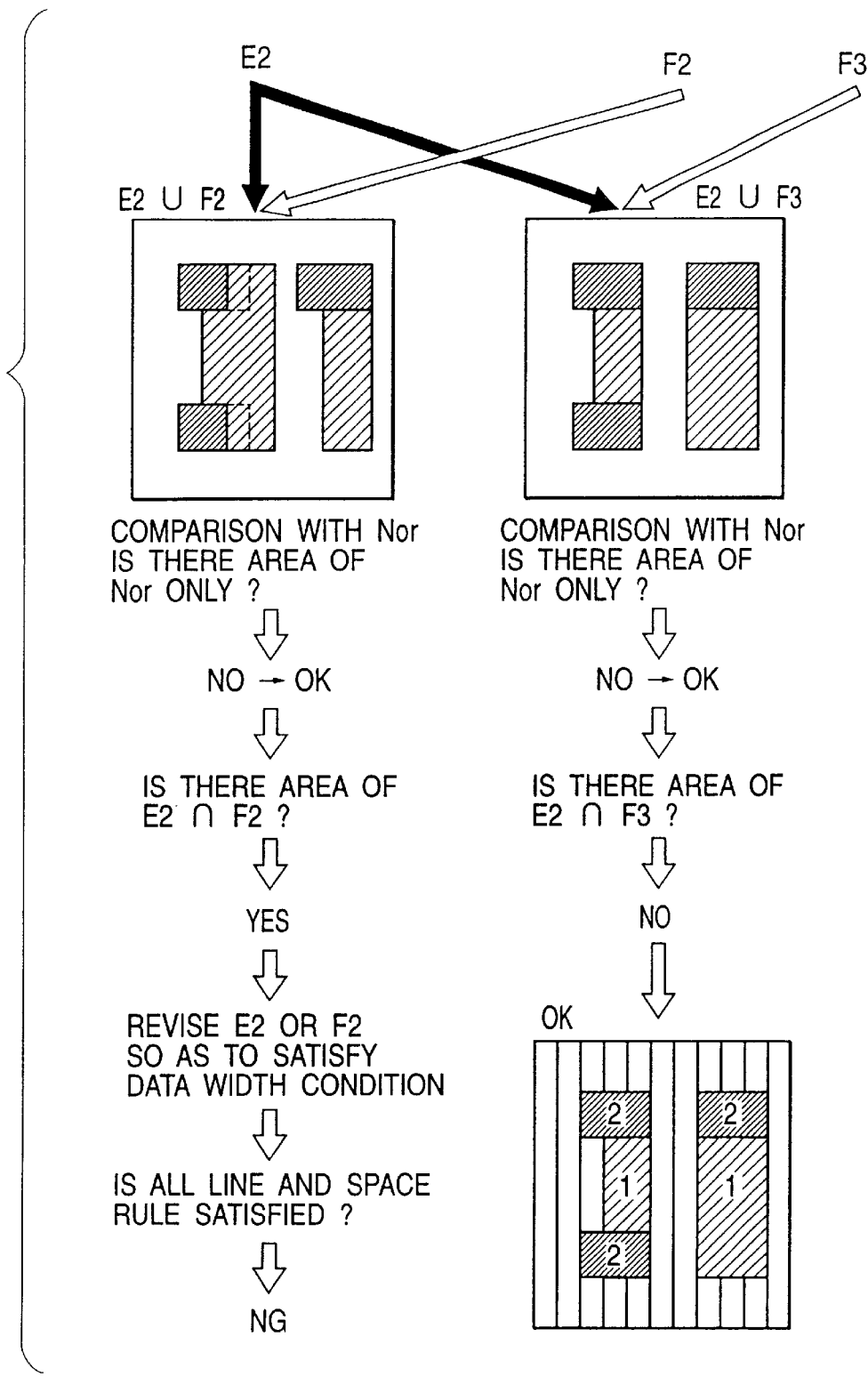
FIG. 46 is an explanatory diagram to show a way up to generation of an appropriate rough mask pattern by combining revised patterns E2 with F2 or F3 of FIG. 44 and FIG. 45, resizing each weight area, and setting a transmittance according to the weight of each area.

In FIG. 46, areas after OR of E2 and F2 includes a place where the space is L, and the pattern is thus eliminated from candidates for the rough mask pattern, because it does not satisfy the design rule of the rough mask pattern.

Figure 47:
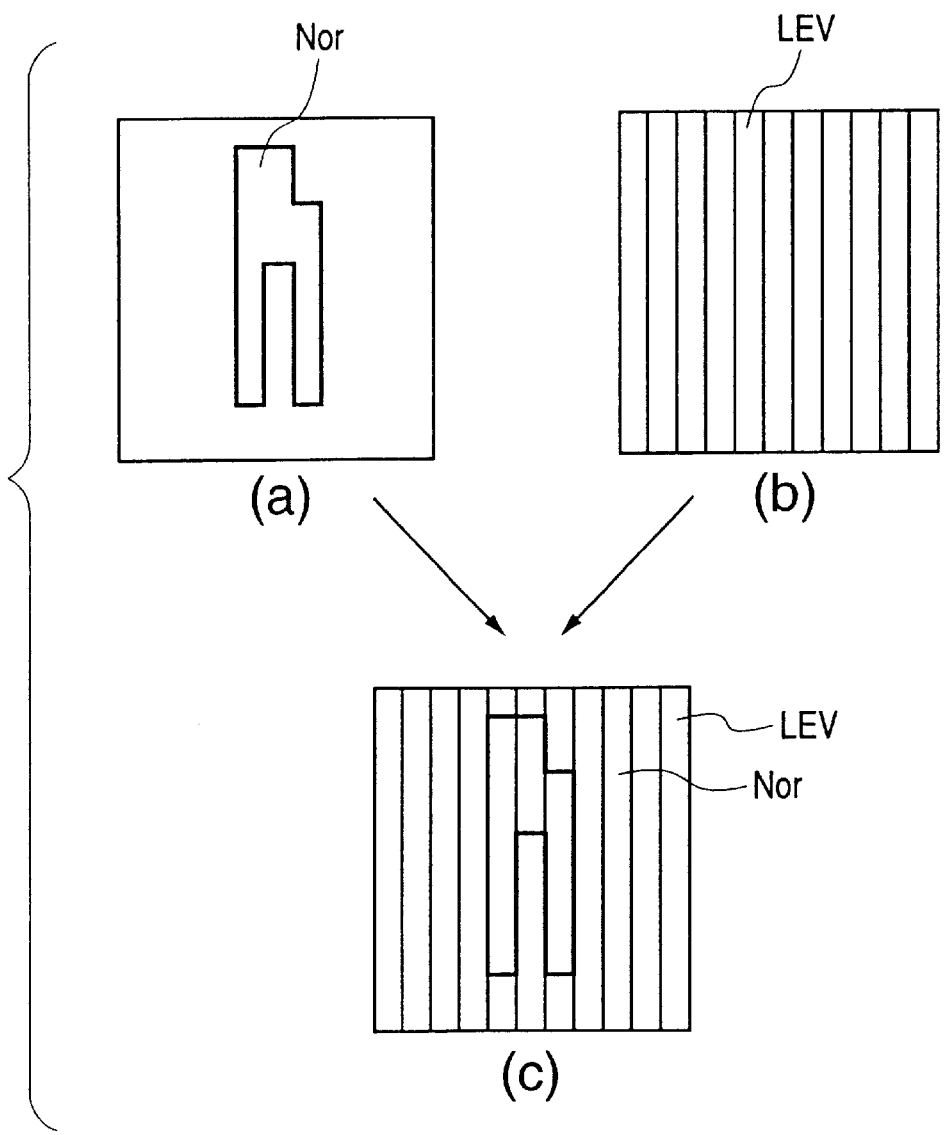
FIG. 47 is a diagram, similar to FIG. 33, to show another embodiment of the present invention.
Figure 48:
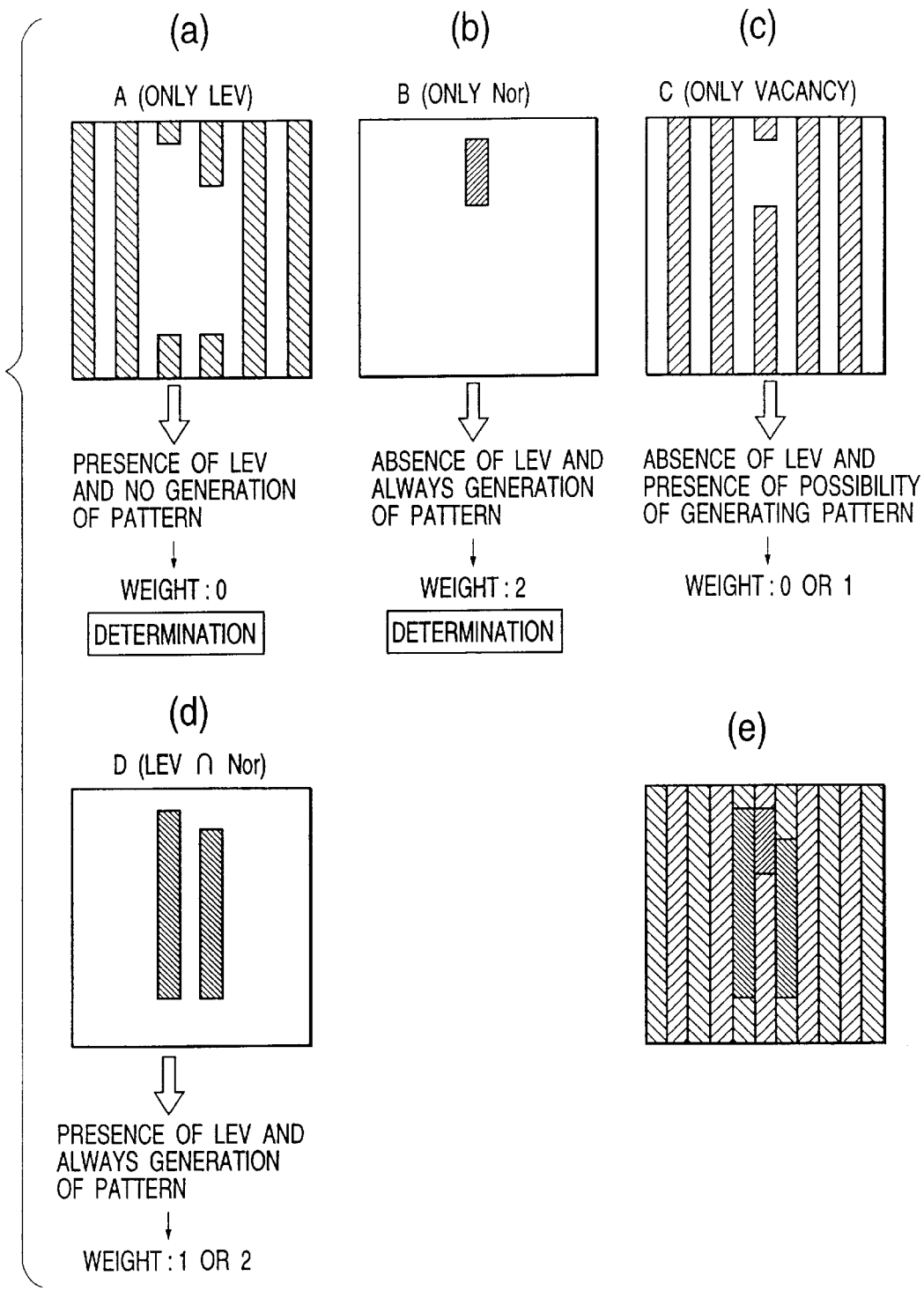
FIG. 48 is a diagram, similar to FIG. 34, to show another embodiment of the present invention.
Figure 49:
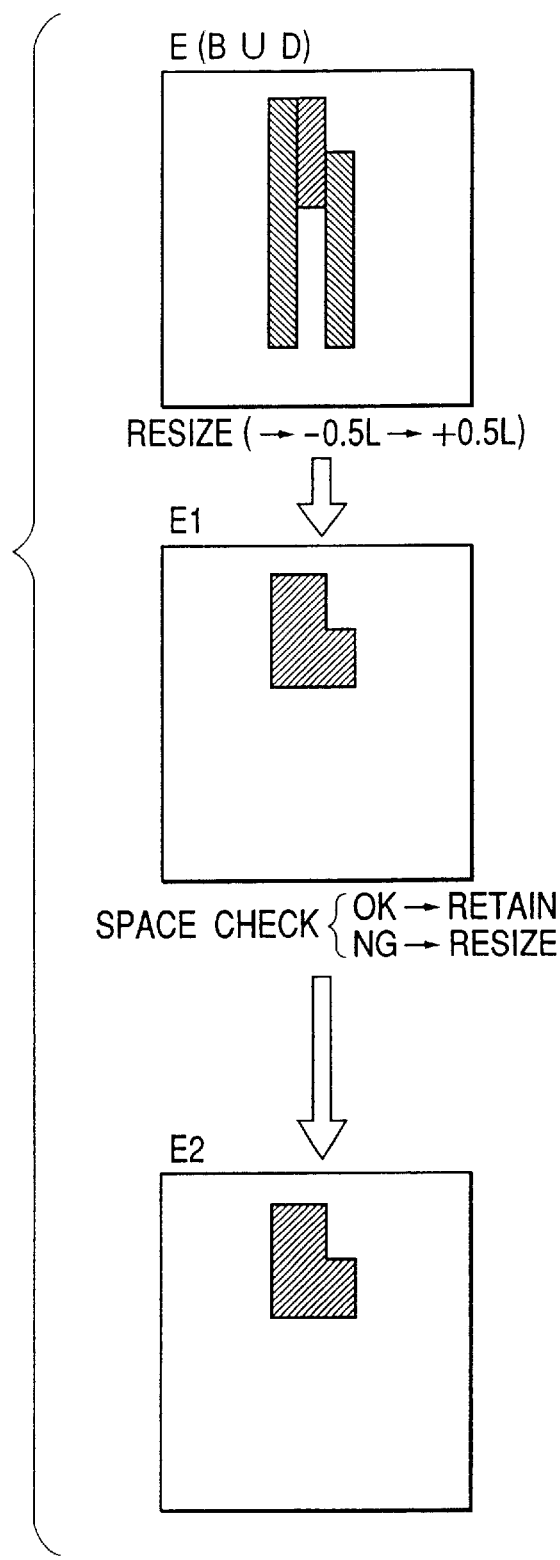
FIG. 49 is a diagram, similar to FIG. 35, to show another embodiment of the present invention.
Figure 50:
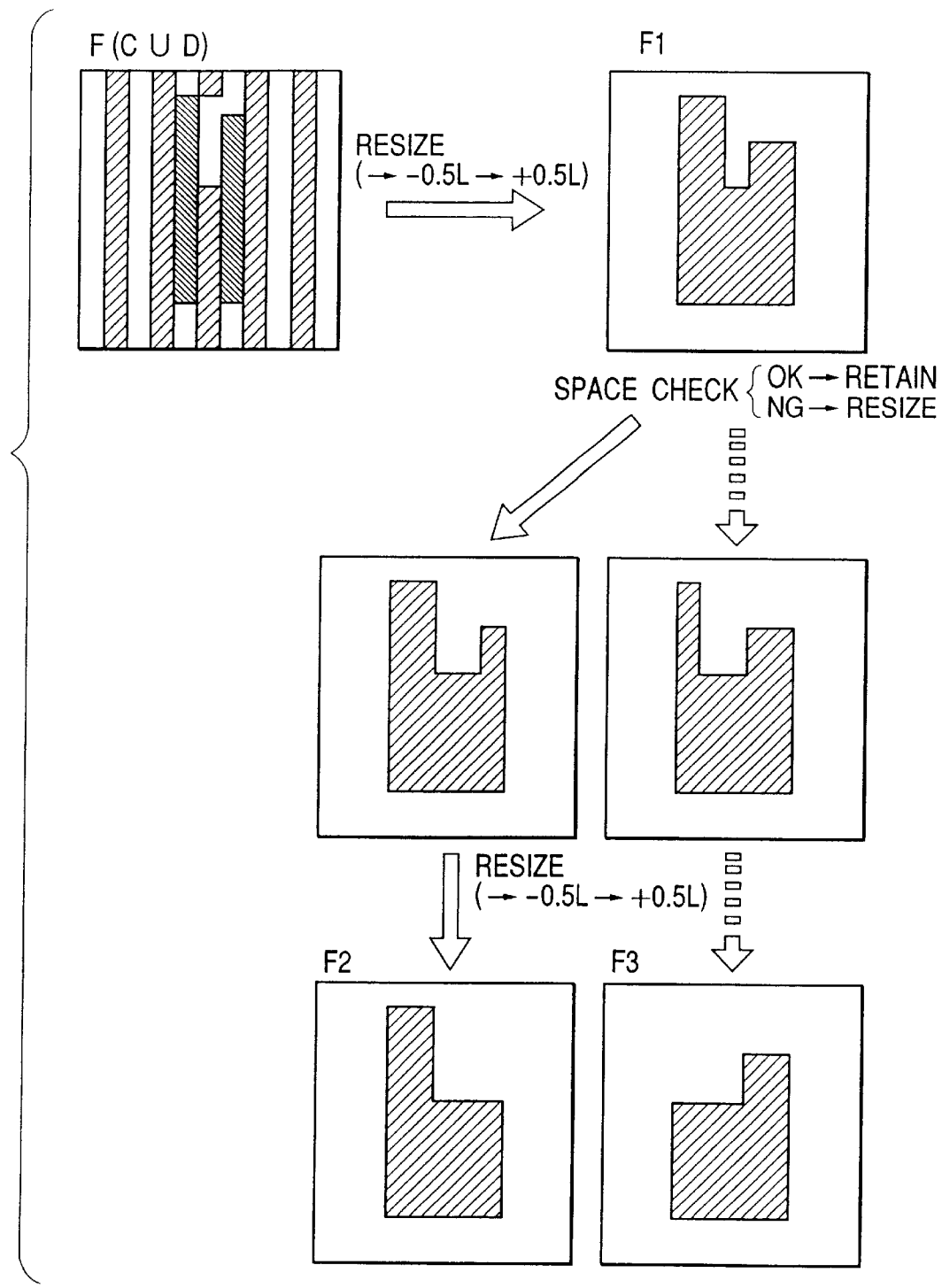
FIG. 50 is a diagram, similar to FIG. 36, to show another embodiment of the present invention.

FIGS. 47 to 51 show procedures for preparing rough pattern mask data by applying the algorithm of Example 1 to a target pattern (FIG. 47(a)) different from FIG. 38(a) and FIG. 42(a). It is also seen that in the present example the rough pattern data can also be generated readily from the pattern desired to form on the resist, as in the two preceding examples.

Figure 51:
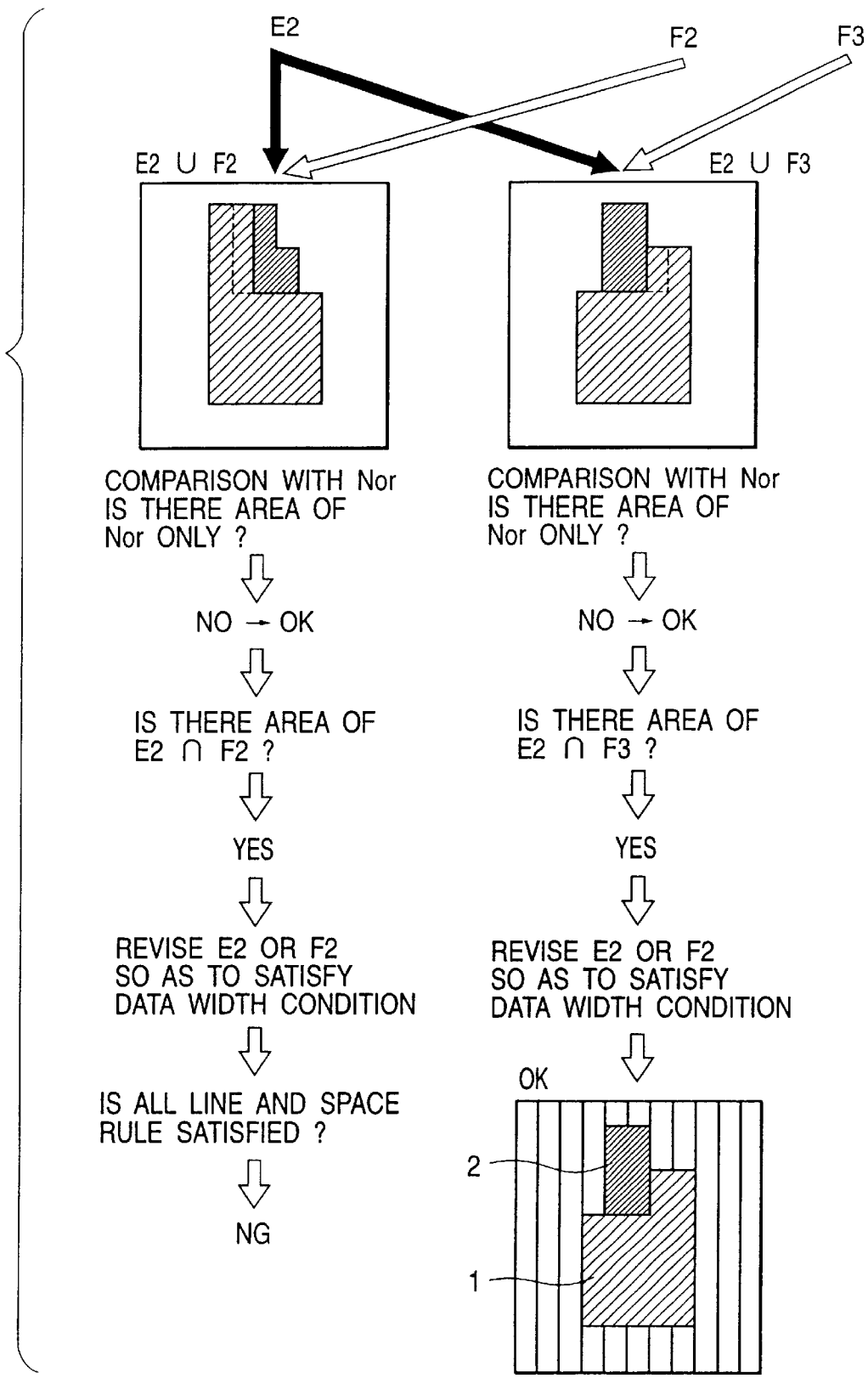
FIG. 51 is a diagram, similar to FIG. 46, to show another embodiment of the present invention.

With the areas resulting from OR of E2 and F2, in FIG. 51, the minimum line width of F2 is L where the minimum line width of E2 is 2L; or the minimum line width of E2 is L where the minimum line width of F2 is 2L. Therefore, the pattern is excluded from candidates for the rough mask pattern, because either case does not satisfy the design rule of the rough mask pattern.

In creation of the mask using the operation result of each example described above, the data can be handled, for example, by assigning a layer capable of being handled on a CAD (Computer Aided Design) tool to each of the data of the different mask transmittances, so as to prepare the mask creating data. Alternatively, the mask creating data may also be prepared by using different branch numbers called data types for the respective transmittances on one layer.

The above examples were described on the presumption that the two-beam interference exposure was carried out using the Levenson pattern as the micro-line pattern, but the micro-line pattern may also be printed by probe writing using near-field light, a laser beam, an electron beam, STM, AFM, or the like. In this case, the probe writing is just to write only portions of the Levenson pattern overlapping with the portions of the transmittance 1 in the rough pattern, with the light amount corresponding to the transmittance 1, so that the writing time can be reduced considerably. In that sense, the optimal rough pattern in the exposure of the micro-line pattern by the probe writing is different from that in the case of the two-beam interference exposure and should include more portions of the transmittance 2 on the rough pattern (for example, FIG. 39(b)). The micro-line pattern does not always have to be limited to the periodic pattern like the Levenson pattern, but it can also be a checkerboard pattern or a pattern resulting from double exposure of orthogonal, microscopic, periodic patterns such as two orthogonal Levenson patterns or the like. Further, the micro-line pattern can also be a pattern in which lines are arranged at irregular pitch.

Still another embodiment of the present invention will be described below. It is a creating method of mask data corresponding to the multiple exposure technology described in Japanese Laid-open Patent Application No. 11-1403085, the creating method of mask data having a first step of preparing fine-line pattern data (Nor) corresponding to a fine-line pattern desired to form after exposure, a second step of carrying out a logical operation between the aforementioned Levenson pattern data (LEV) and Nor, a third step of grouping the data generated in the second step in accordance with set values of transmittances of the mask, a fourth step of determining whether the grouped data satisfies a design rule of a rough mask pattern, a fifth step of revising the grouped data in accordance with the result of the determination in the fourth step, a sixth step of regenerating a pattern from the grouped data after the fourth and fifth steps and setting mask transmittances for respective areas of the grouped data, a seventh step of carrying out a logical operation with Nor after the sixth step and determining whether the desired fine-line pattern can be formed, a step of revising the pattern of the regenerated data and the setting of the transmittances in the sixth step, based on the result of the determination in the seventh step, a repeating operation step of repeatedly carrying out the fourth to seventh steps to find out a solution satisfying the both conditions of the design rule of the rough mask pattern and the setting of the mask transmittances, and an eighth step of, when a plurality of solutions are obtained for the rough mask pattern, computing an image corresponding to each solution of the rough mask pattern and selecting one out of them, based on the obtained image data.

In the above method, the second step includes either one of a step of preparing first operation data, for example, by carrying out an AND operation of LEV and Nor, a step of preparing second operation data by excluding the first operation data from LEV, a step of preparing third operation data by excluding the first operation data from Nor, and a step of preparing fourth operation data by carrying out an OR operation of the first, second, and third data and thereafter carrying out an inversion operation thereof. A pattern revising method for satisfying the aforementioned design rule of the rough mask pattern is the method of reducing and enlarging data, or the method of moving one side of data at a portion conflicting with the rule.

Specific examples will be described referring to the drawings.

Figure 52:
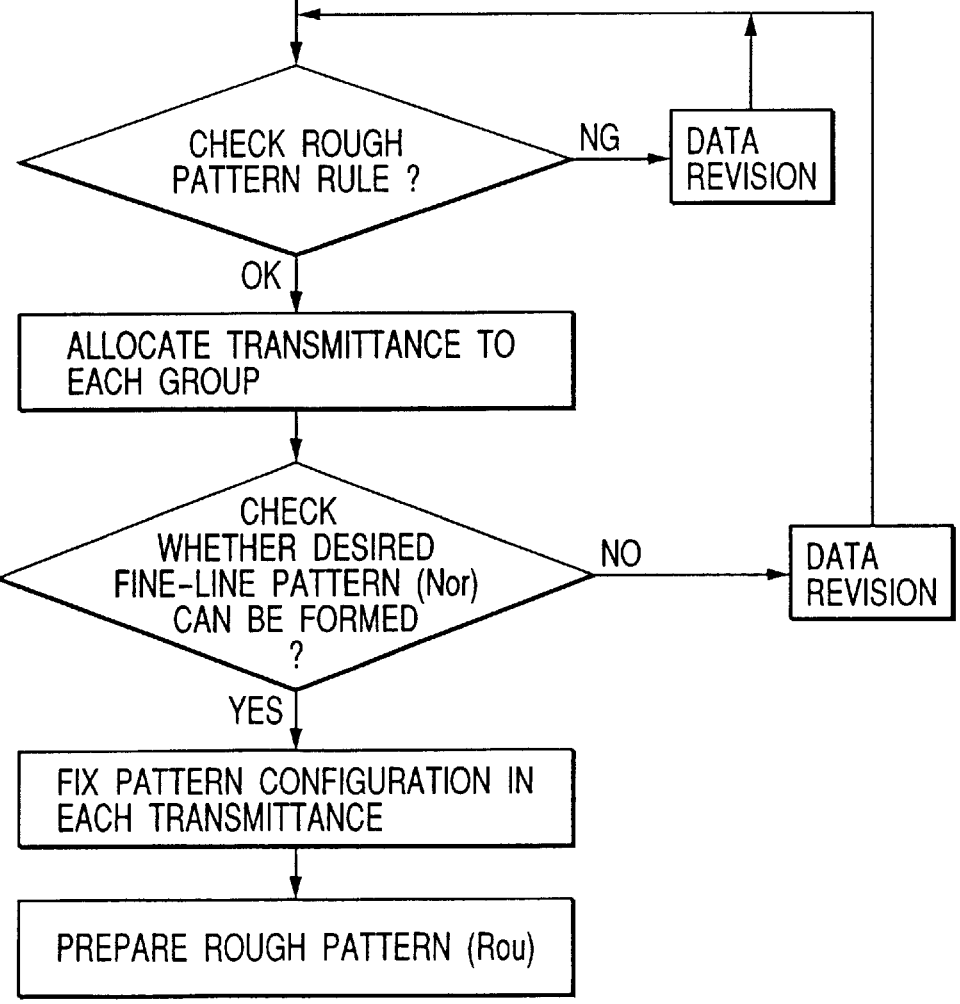
FIG. 52 is a flowchart to show a rough pattern data preparing method according to another embodiment of the present invention.
Figures 53, 53A:
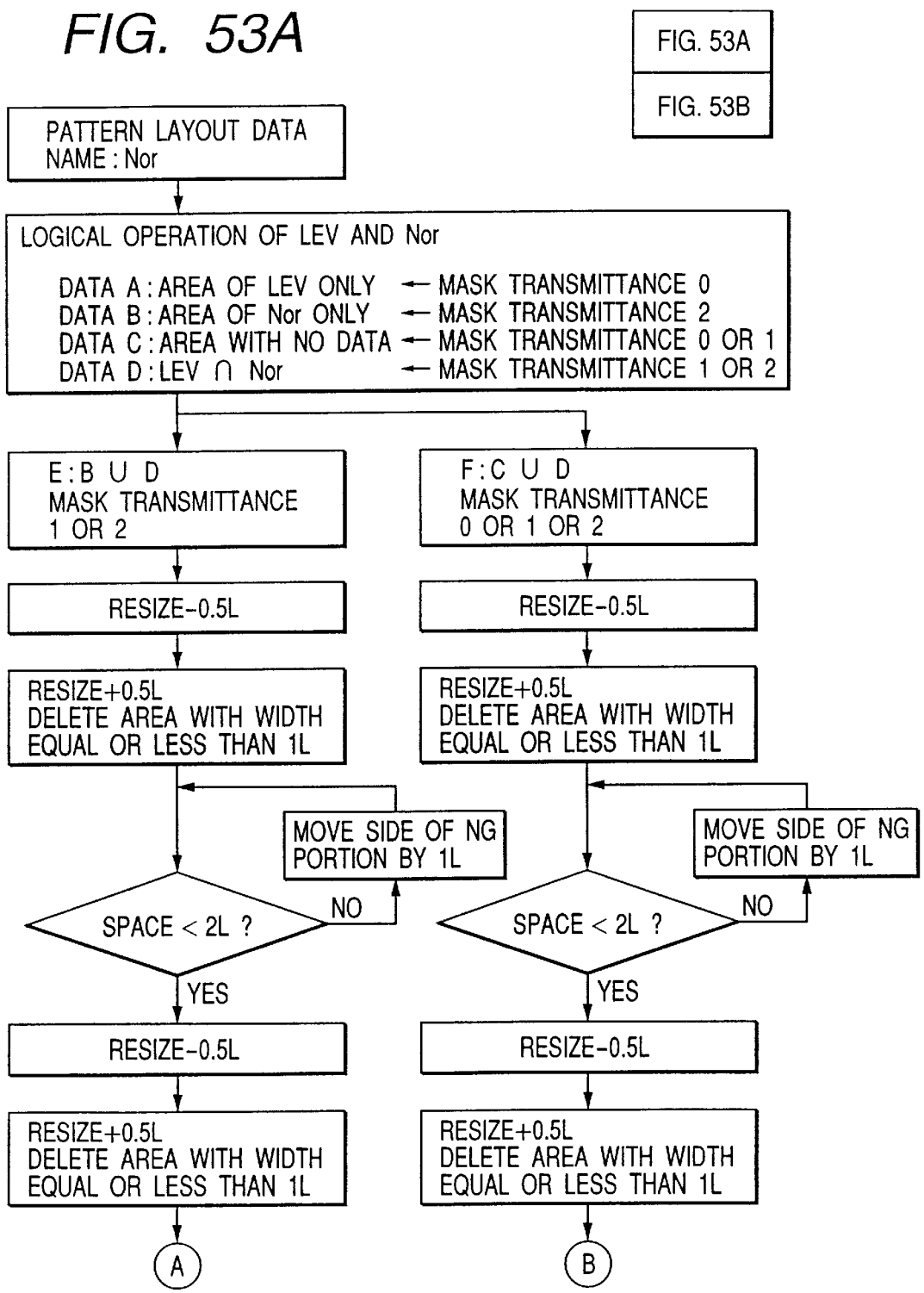
FIG. 53 which is composed of FIGS. 53A and 53B are flowcharts to show the more detailed flow of the preparing method of FIG. 52.
Figure 53B:
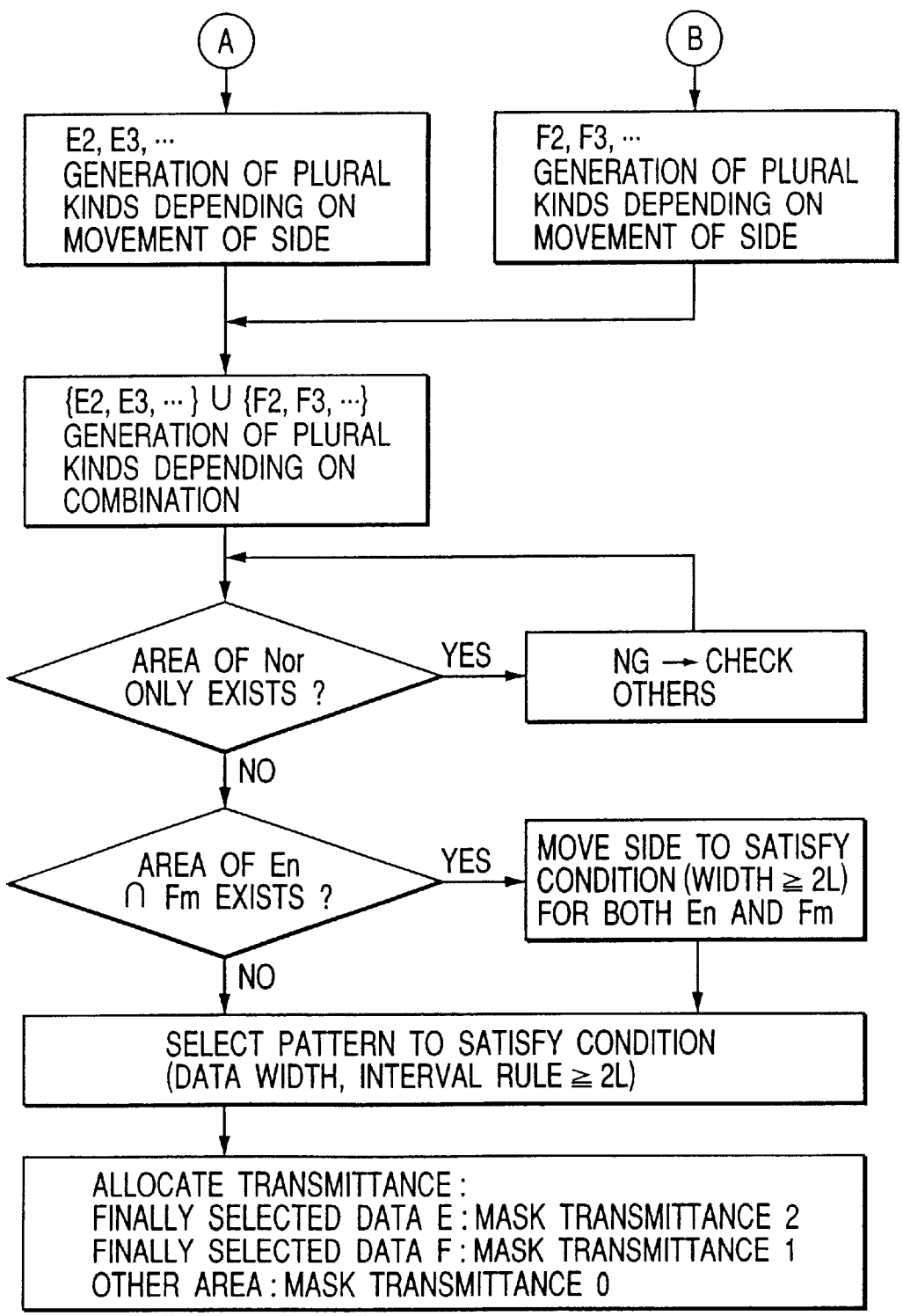

FIG. 52 is a flowchart to show a rough pattern data preparing method according to an embodiment of the present invention and FIGS. 53A and 53B are flowcharts to show the preparing method in more detail.

Figure 54:
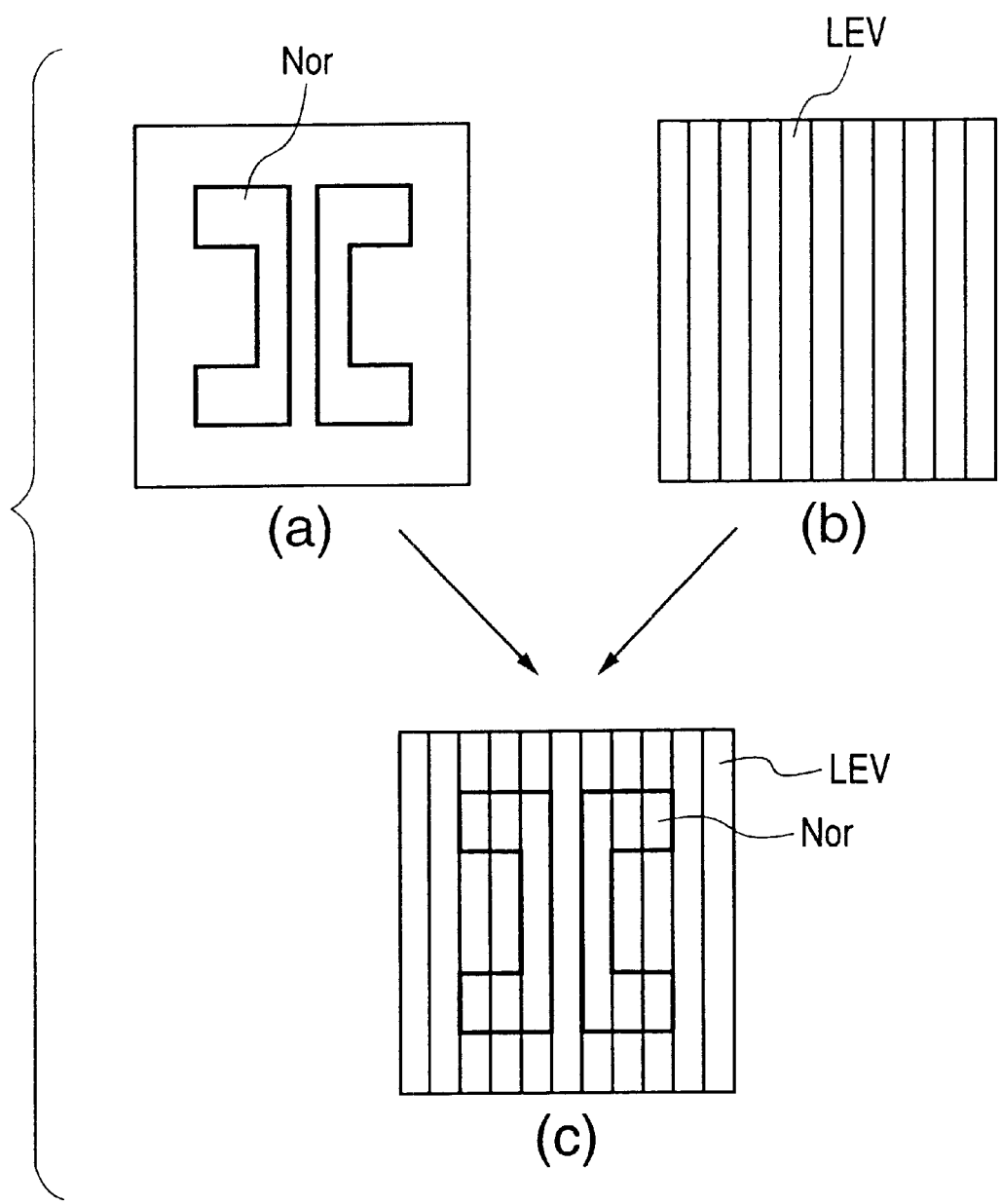
FIG. 54 is an explanatory diagram to show the relationship between a Levenson pattern and a target pattern.

This example is a preparing method of rough pattern Rou, as illustrated in FIG. 54, using the microscopic periodic pattern (Levenson pattern) LEV having the line width (light transmitting portions) and the spacing (light intercepting portions) both equal to L (L&S=L, the pitch 2L, where L is, for example, 0.10 $\mu$m) as the micro-line pattern, the preparing method of rough pattern Rou being adapted to form the target pattern (a pattern desired to form finally) Nor by overlap with the Levenson pattern. The Levenson pattern LEV is printed in light amounts below the exposure threshold of the photoresist, for example, by the aforementioned two-beam interference exposure, and the rough pattern Rou is printed, for example, by use of the normal projection exposure apparatus. Let us assume that portions desired to be left as fine lines in the target pattern Nor are arranged at the pitch 2L or at integral multiples thereof. The light transmitting portions of the rough pattern Rou are set as portions that singly transmit a light amount over the exposure threshold of the photoresist, irrespective of presence or absence of the exposure by the Levenson pattern LEV and as portions that transmit a light amount over the exposure threshold of the photoresist first after duplicate exposure with the exposure by the Levenson pattern LEV. The size (each light transmitting portion) and the spacing (light intercepting portions) of the rough pattern Rou are set each to n times L (where n is an integer not less than 2).

The data preparing method of the present example will be explained next referring to FIGS. 52 to 64.

The first step is to prepare data of the pattern Nor in the same shape as the circuit pattern desired to form finally on the photoresist. On this occasion, portions expected to form a fine-line pattern (a pattern having the width or spacing of L) are prepared as data overlapping with the Levenson pattern LEV. Let us assume that the data of the Levenson pattern LEV is preliminarily inputted.

Figure 55:
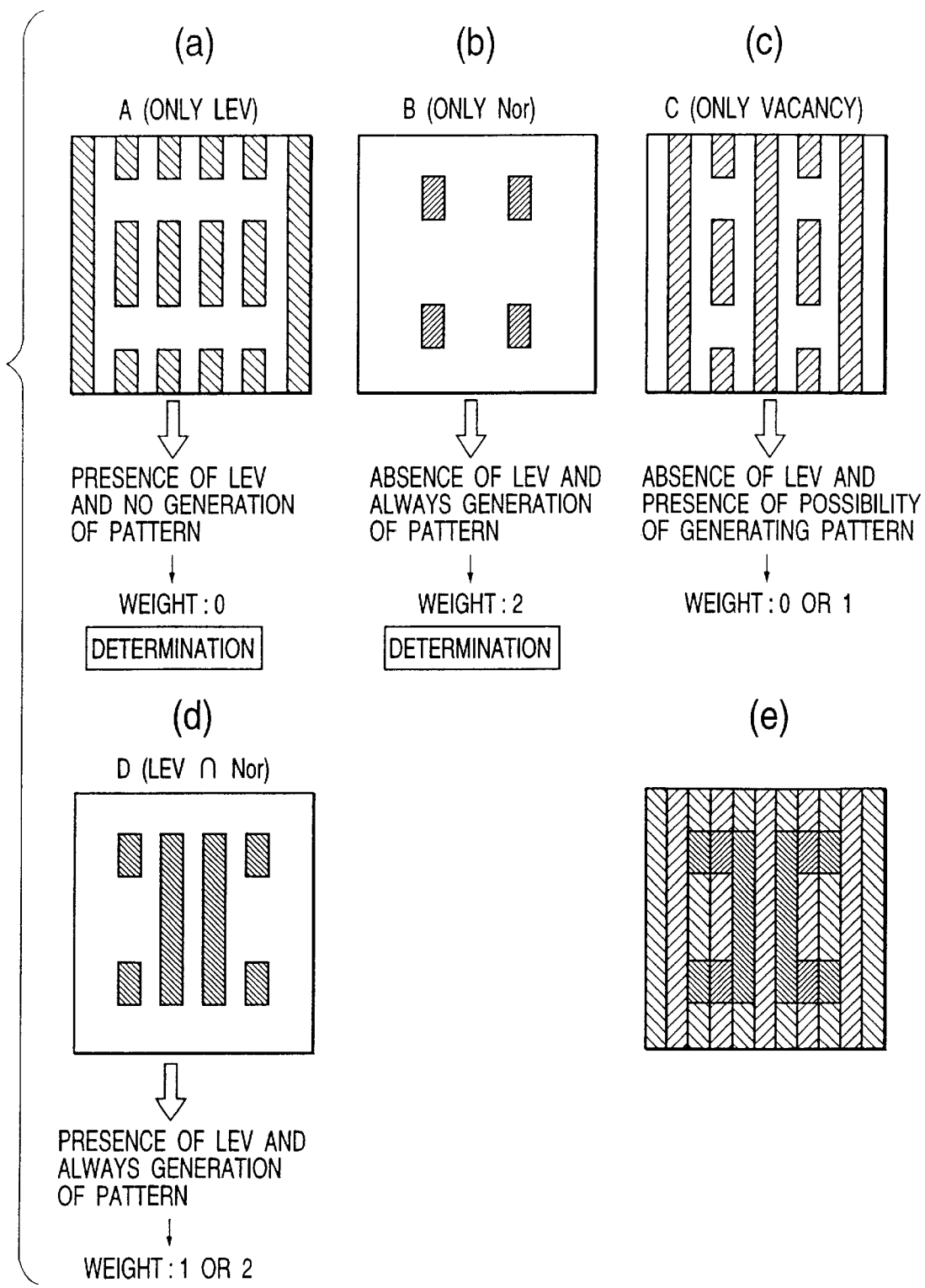
FIG. 55 is an explanatory diagram to show four types of weight areas obtained by logical operations of Levenson pattern data and target pattern data.

Four operations described below are carried out using the two types of data to divide the data into four types of data as illustrated in FIG. 55.

Data A=LEV−D
Data B=Nor−D
Data C=the whole−(A OR B OR D)
Data D=LEV AND Nor

Let us suppose here that the transmittance of portions without mask data is 0, the transmittance of data areas of the Levenson mask is 1, and the transmittance of the rough pattern mask is 1 or 2 depending upon data areas. Then there appear four types of areas having the transmittance 0, 1, 2, or 3 during the exposure by the combination of the two patterns. When the threshold exposure amount is set between the areas with the high transmittances of 2, 3 and the areas with the low transmittances of 0, 1 at this time, the desired pattern is formed on the photoresist corresponding to the combined areas with the high transmittances of 2, 3. It is noted that the transmittances 0, 1, 2, and 3 stated here are used just for convenience and have no physical meaning, in order to facilitate the description.

Now let us consider the data A to D under the above setting. Since the data B corresponds to the areas in which the LEV is absent but the pattern is desired to form finally on the resist, the rough pattern mask data of the transmittance 2 must exist there. Since the areas of the data C are portions in which there is no data of LEV and the pattern is not formed finally on the resist, rough pattern mask data of the transmittance 0 or 1 has to exist there. Which transmittance 0 or 1 is to be selected is determined later on so as to satisfy the design rule concerning the width of the rough mask pattern. Since the areas of the data D correspond to areas in which there is the data of LEV and the pattern is desired to form on the resist, rough pattern mask data of the transmittance 1 or 2 has to exist there. Which transmittance 1 or 2 is to be selected is determined later on so as to satisfy the design rule concerning the width of the rough mask pattern.

Figure 56:
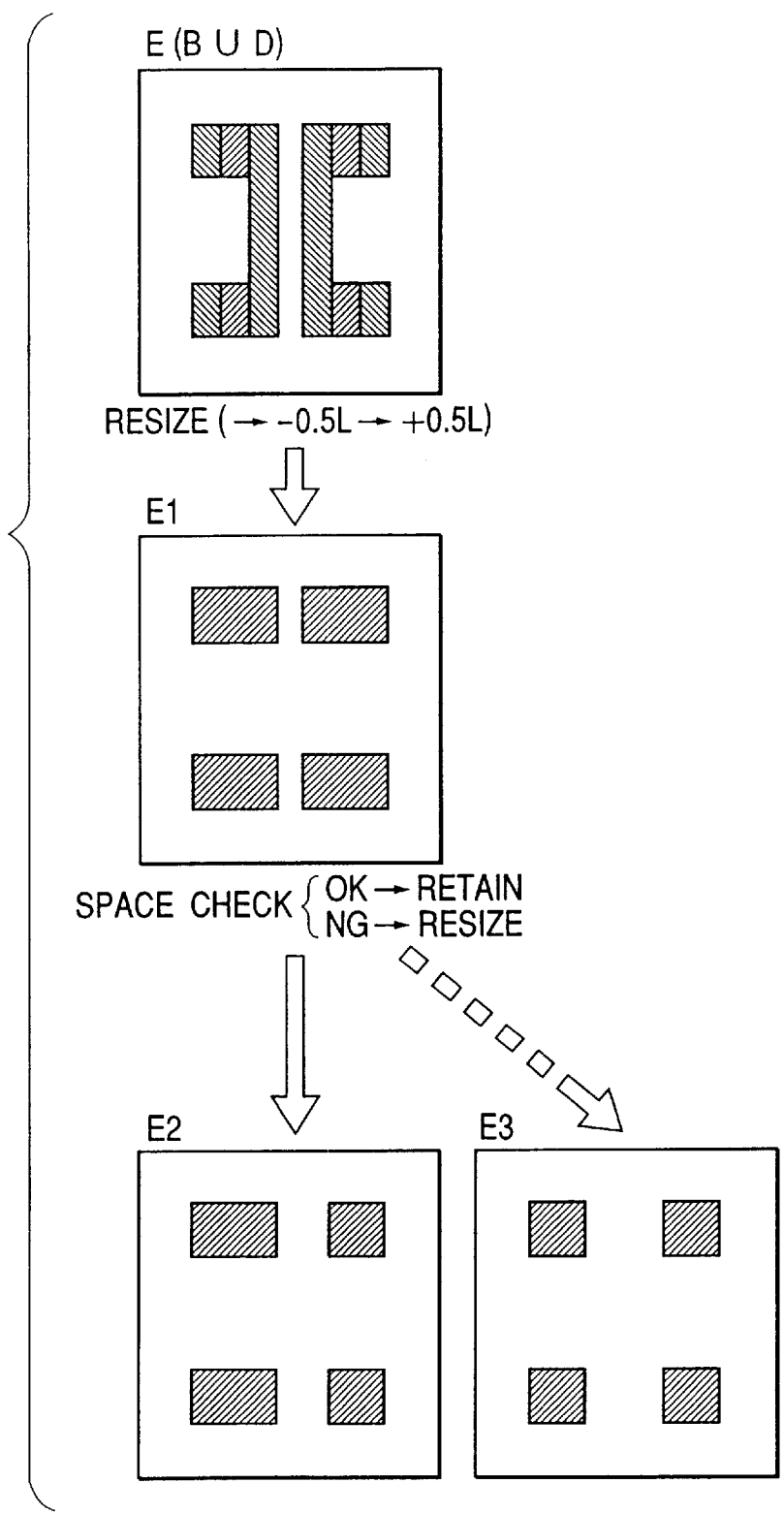
FIG. 56 is an explanatory diagram to show a pattern obtained by grouping areas with a maximum selectable weight and a way of revising it so as to satisfy the design rule of rough mask pattern.
Figure 57:
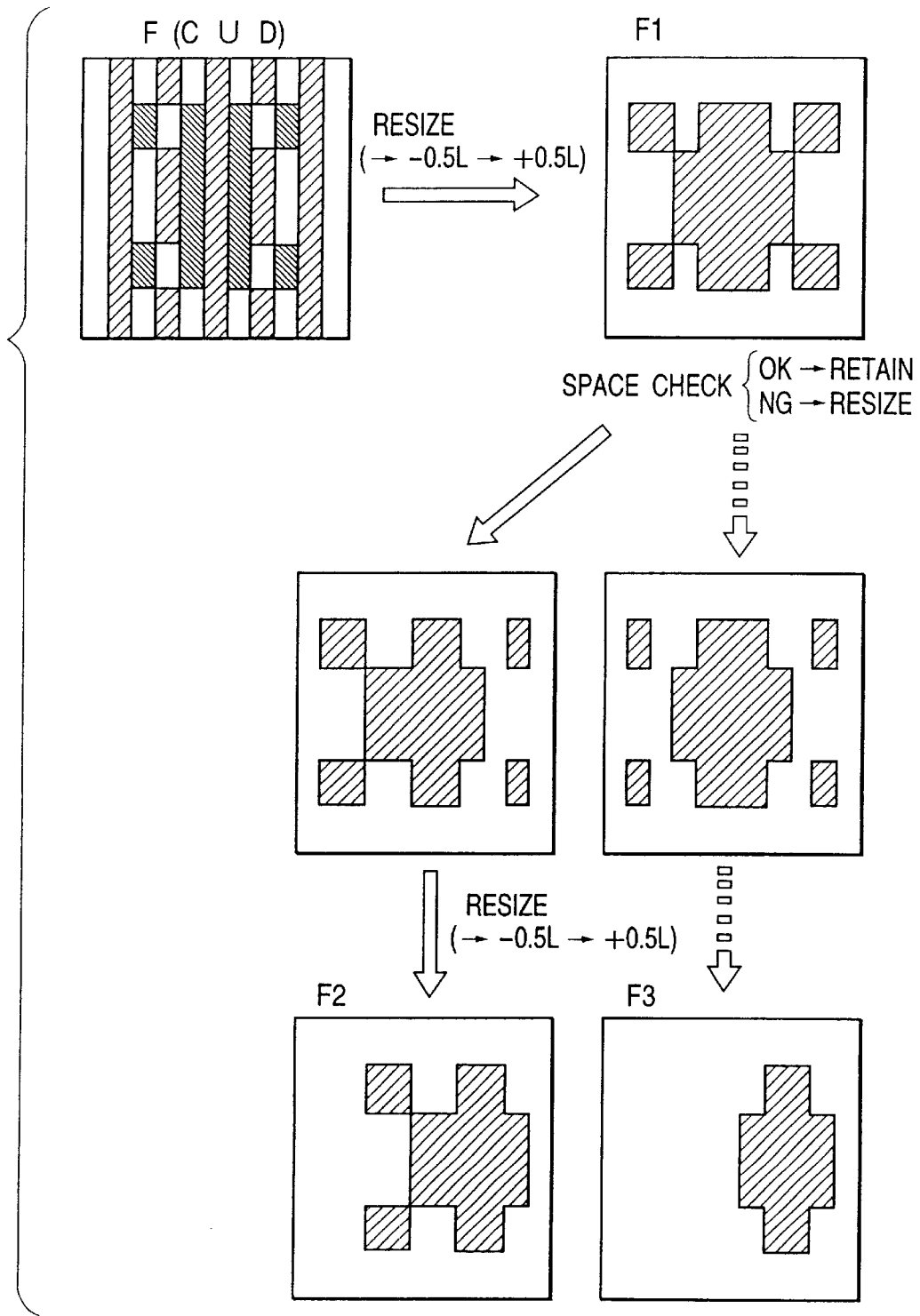
FIG. 57 is an explanatory diagram to show a pattern obtained by grouping areas with a next largest selectable weight to that of FIG. 56 and a way of revising it so as to satisfy the design rule of rough mask pattern.

Then the OR operation of data B and data D is carried out to generate data E (FIG. 56). This region includes all the areas to which the mask transmittance 2 is possibly assigned. Likewise, the OR operation of data C and data D is carried out to generate data F (FIG. 57). This region includes all the areas to which the mask transmittance 1 is possibly assigned.

Then the data E and F is resized so as to satisfy the design rule concerning the width of the rough pattern mask. Let us suppose here that the minimum reference unit L is the width (line) or spacing (space) of the LEV data (Levenson pattern), or half pitch, that the minimum design rule of the rough pattern mask is two times L, i.e., 2L, and that the minimum design unit is L. At this time the data E and the data F each is reduced by L/2 and thereafter is enlarged by L/2. Namely, each side of the patterns represented by the data E and data F is moved by L/2 toward the inside of each pattern, and each side of the left patterns is then moved by L/2 toward the outside of each pattern this time. This processing eliminates a pattern area having the width L out of the data E and data F and creates new data E1 and F1 comprised of only the areas having the width of not less than 2L, extracted from the data E and data F.

Then it is checked this time whether each of the data E1 and F1 satisfies the rule of the spacing of the rough pattern (not less than 2L). If the rule is not met the data will be revised so as to satisfy the rule of spacing by moving one side or the both sides of the data at the portion of interest by L. After that, since the sides are moved, the like reduction and enlargement operations of data as above are carried out again so as to satisfy the rule of width, thereby generating new data E2 and F2. There are possibilities that a plurality of data E2 and F2 is generated depending upon how to move the sides. FIG. 56 and FIG. 57 also show examples of revised data E3 and F3 different from E2 and F2.

E2 is a candidate for the areas to which the mask transmittance 2 is assigned and F2 a candidate for the areas to which the mask transmittance 1 is assigned. Therefore, areas (FIG. 58) resulting from OR of E2 and F2 must include all the aforementioned data Nor. The areas of (E2 OR F2) are compared with the data Nor, and a combination of data E2 and data F2 not satisfying the above condition is excluded.

Then areas resulting from AND of the data E2 and data F2 are extracted. These areas are revised into areas of the transmittance 1 or 2 so that each area with the corresponding transmittance being assigned satisfies the design rule of the rough pattern. At this stage an area not satisfying the design rule is eliminated.

The above procedures determine the final shape of the rough pattern and the assignment of transmittances to the respective areas.

Figure 60:
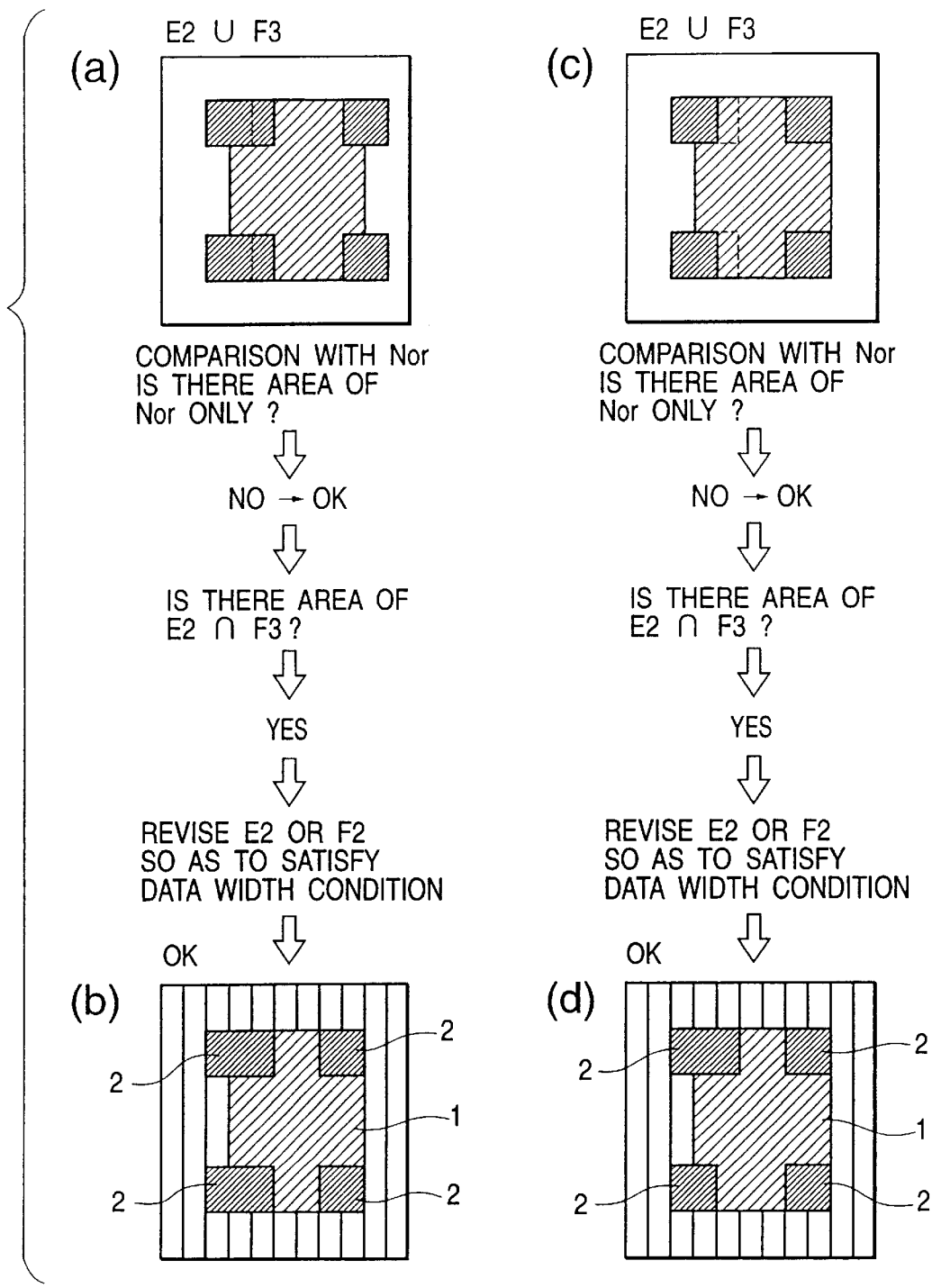
FIG. 60 is an explanatory diagram to show a way up to generation of a third rough mask pattern candidate by combining revised patterns E2 and F3 of FIG. 56 and FIG. 57, resizing each weight area, and setting a transmittance according to the weight of each area.

The final shape of rough pattern and the assignment of transmittances to respective areas are also determined in similar fashion for cases where E3 replaces E2 or F3 replaces F2 (FIGS. 59 and 60). FIG. 61 shows an example in which areas after OR of E3 and F2 fail to include part of the data Nor, which is thus excluded from candidates for the rough pattern. The above operation results in obtaining the three rough pattern candidates illustrated in FIGS. 58 to 60 in the present example. At the stage of synthesis of E2 (or E3) and F2 (or F3), a resultant rough pattern shape differs, depending upon which E2 (or E3) or F2 (or F3) is adopted at a duplicate portion thereof. For example, when OR is made between E2 and F2 with priority to F2, that is, when the pattern F2 is overlaid on the pattern E2, a rough pattern candidate illustrated in FIG. 59(b) is obtained without the revision described above. When the pattern F3 is overlaid on the pattern E2 as illustrated in FIG. 60(c), the rough pattern candidate is obtained as indicated in FIG. 60(d) or at the right end of FIG. 62, depending upon which pattern is given the priority.

Figure 62:
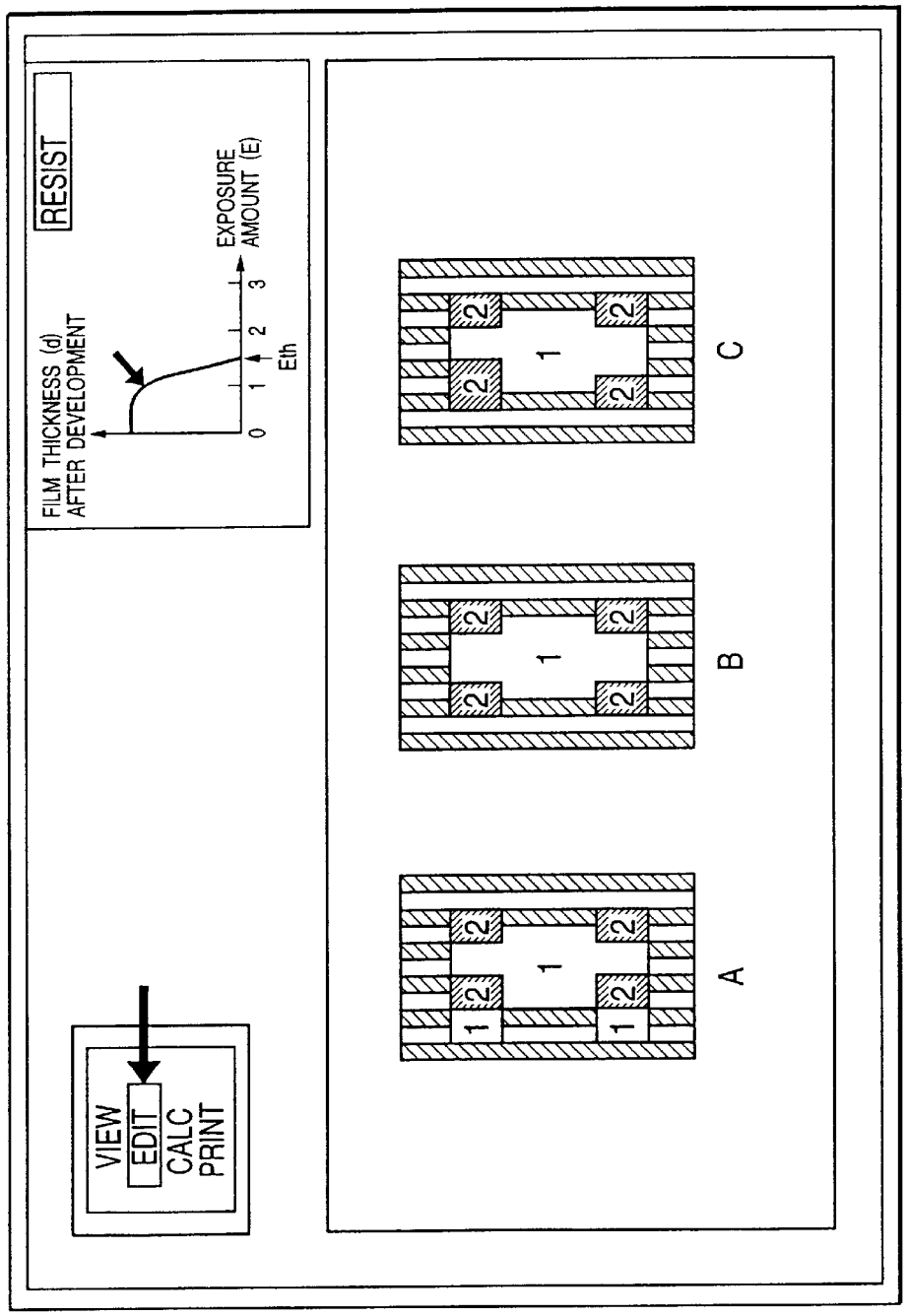
FIG. 62 is an explanatory diagram to show a state of a display of the rough mask pattern candidates of FIG. 58 to FIG. 60 on the display screen.

The resultant rough patterns or rough pattern candidates are displayed on the display, as illustrated in FIG. 62.

When a plurality of rough pattern candidates are obtained, the present example is adapted to compute an image corresponding to each rough pattern and select one optimal rough pattern, based on the obtained images.

The computation and selection of image in the present example will be described referring to FIG. 63 and FIG. 64.

Figure 63:
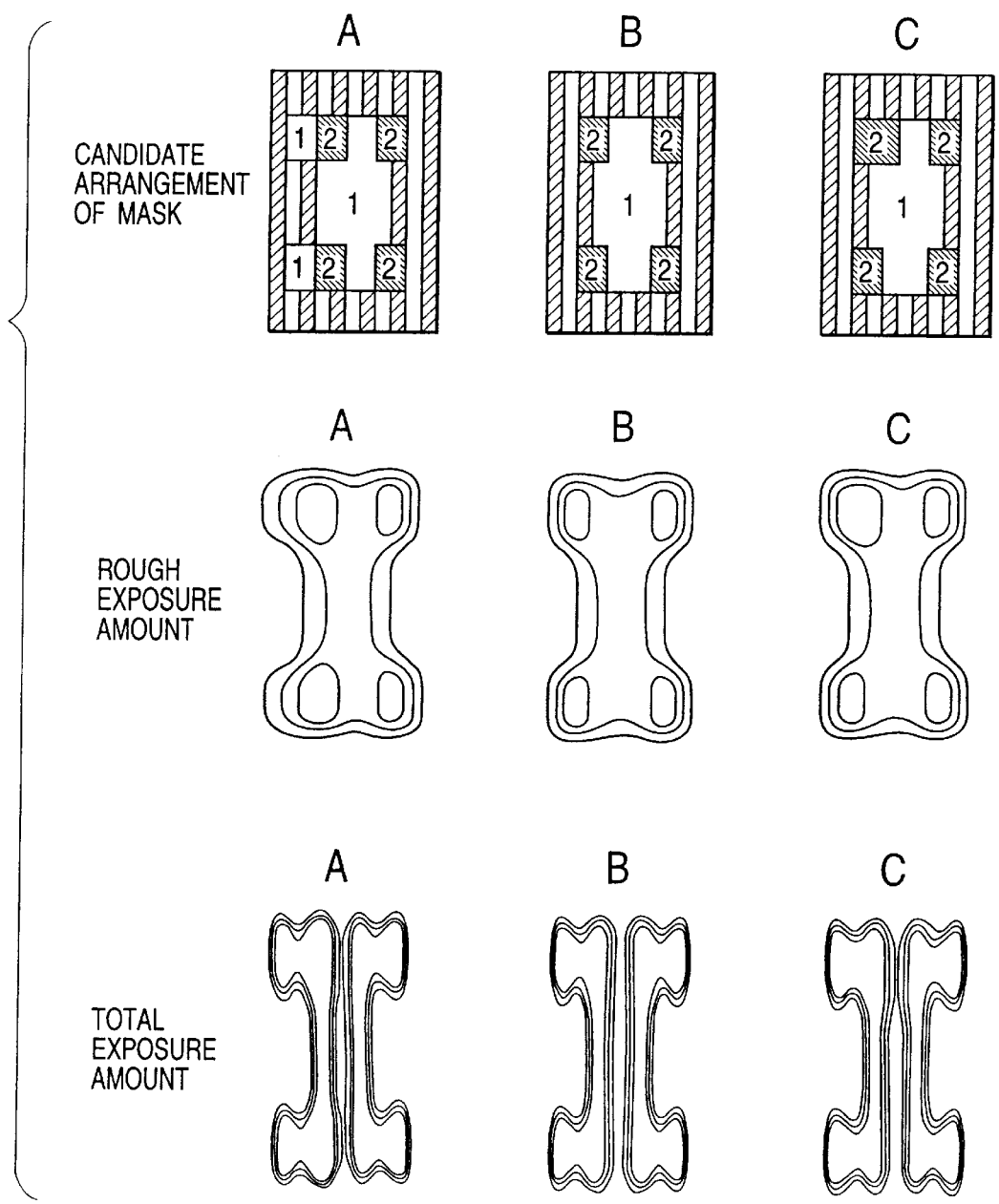
FIG. 63 is a diagram to show rough exposure images and total exposure images corresponding to the respective rough mask pattern candidates of FIG. 58 to FIG. 60.

FIG. 63 shows three rough pattern candidates of the present example, A, B, and C, in the upper part.

Figure 64:
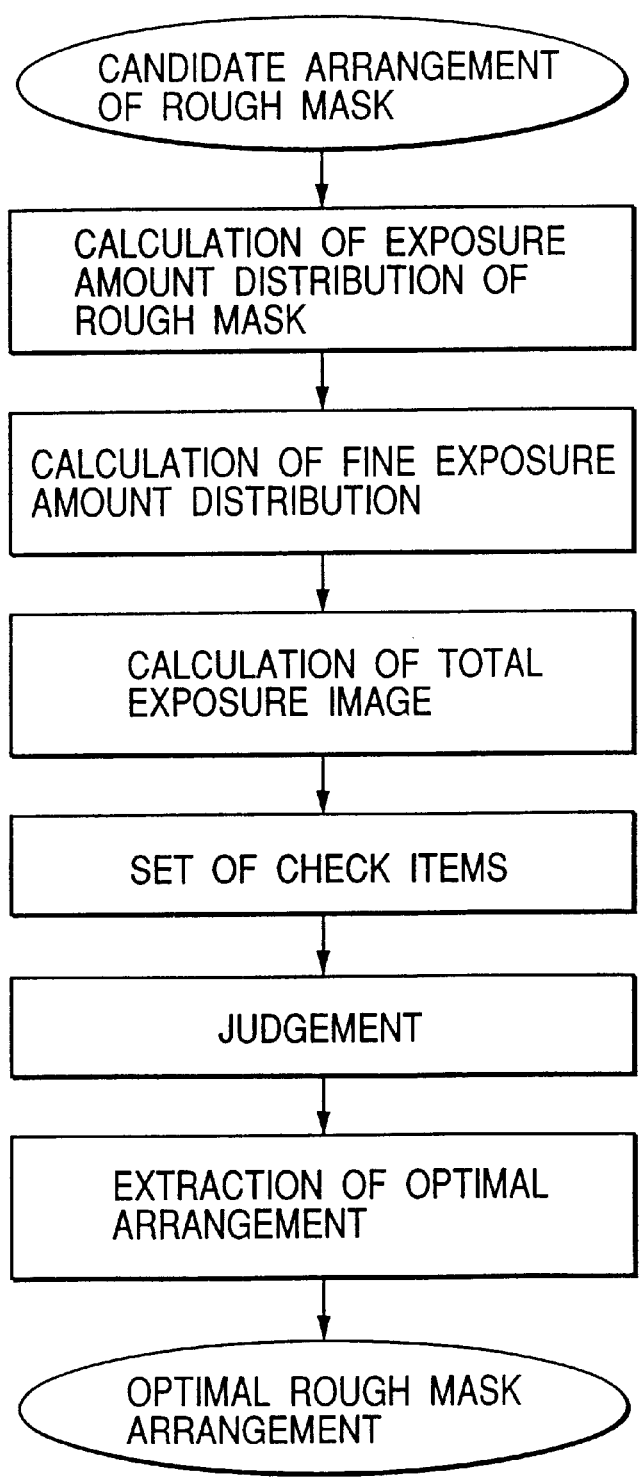
FIG. 64 is a flowchart to show an operation of selecting an optimal arrangement out of a plurality of rough pattern candidates.

FIG. 64 is a diagram to show the flow of operation to select an optimal arrangement out of the three such rough pattern candidates. This flow will be described first.

The first step is to compute an exposure amount distribution based on the pattern image of the rough mask for each of the plural rough mask arrangement candidates A to C. This operation is carried out using the data of the projection exposure apparatus and its projection optical system not illustrated. Then an exposure amount distribution is also computed similarly as to the fine exposure based on the image of the Levenson pattern. The next step is to compute a total exposure image resulting from the multiple exposure based on the exposure amount distributions obtained by these two computations, for each of the candidates. The next step is to input required items for the shape of the obtained target pattern as to this total exposure image, as check items. Then it is determined whether the total exposure image of each candidate is superior/inferior or good/bad, based on the check items, and as a consequence, the optimal rough mask arrangement is extracted. Specific examples of the check items are line width uniformity of gate lines, a short-circuit between gates, the area of contact part, and so on, and in addition thereto, it is also possible to define various check items based on the target pattern and the operation principles as elements. It is noted that the check items do not always have to be inputted as numerical values. Namely, without execution of the check item setting, the judgment of superior/inferior or good/bad can also be performed in such a way that an inspector, a designer, or an operator or the like directly checks the displayed image by vision.

FIG. 63 is a diagram concerning a specific example of the selection of optimal rough mask arrangement using the flow as illustrated in FIG. 64, which is an example in which the selection operation is carried out for the three rough mask candidates obtained in the present example. FIG. 63 shows exposure amount distributions by the respective rough masks (rough exposure amounts) in the middle part. In the middle part of FIG. 63 the exposure amount distributions are illustrated in the form of contours as the result of computation with the rough mask alone, for each of the three rough mask arrangement candidates A, B, C. The masks have the patterns of three discrete transmittances 0%, 50%, and 100%, but the exposure amount distributions are continuous. The conditions for obtaining the distributions were as follows; the line width of fine lines was 0.15 $\mu$m and the projection optical system used had the wavelength 248 nm and NA 0.6. Then computed were the exposure amount distributions (not illustrated) by the common periodic fine exposure, and the total exposure images in the lower part of FIG. 63 were obtained by appropriate addition of exposure amounts.

It is apparent that these three total exposure images have the shape close to the target pattern to be obtained and the design algorithm to select the candidates was correct. When the shapes of the respective patterns are compared in detail, it is seen that they have mutually different portions. The final rough mask arrangement is selected based on this difference.

In the present embodiment, these total exposure images were displayed as being switched from the rough pattern candidates or together with a demagnified screen of the rough pattern candidates on the screen of FIG. 62, and an examiner determined which candidate should be selected, based on the total exposure images.

The check items considered to be important were the line width uniformity of gate line part and the gate line spacing.

As a result, it was concluded that B was optimal and B was selected. The reason is as follows. In the pattern A the gate line spacing is narrow at the portions close to the upper and lower contact portions, so as to pose the possibility of a short-circuit of the wire because of interconnection of the pattern; likewise, in the pattern C the spacing is narrow at the gate line part in the upper portion.

As described above, the present example is an example in which when a plurality of mask arrangement candidates are obtained, the optical images to be obtained by the exposure apparatus are computed, the candidates are subjected to the judgment of superior/inferior or good/bad, and the optimal candidate is selected based thereon.

The present example was adapted to display the total exposure images obtained by the multiple exposure on the screen and determine the optimal candidate by the examiner, but it is also possible to automatically determine the optimal candidate by an internal operation using the input check items. In that case the total exposure images do not have to be displayed on the screen. It is also possible to preliminarily input the check items and thereafter compute the images, and the order of the flow illustrated in FIG. 64 can be rearranged appropriately.

The present example was adapted to carry out the selection operation by the optical images, but it can also be contemplated that the selection operation is carried out with consideration to information concerning the developing step, for example, a sensitivity property of the resist or the like as occasion may demand. These are also within the scope of the present invention.

According to the present example, the operation by the data preparing person is only to prepare the data (target pattern data) of the same shape as the circuit pattern desired to form finally on the resist, and the preparation of the rough pattern mask data thereafter is automatically carried out by the computer according to the above procedures; even in cases where there are a plurality of rough pattern mask data candidates, one can be selected out of those rough patterns by visually checking the exposure states of the respective candidates automatically computed and displayed in the screen and giving a direction command through the input device such as the mouse or the like; therefore, the optimal pattern can be created at high speed even in the design of large scale semiconductor integrated circuits.

In the design of large-scale logic circuits these years, the circuit designers often carry out the circuit design by logical description without attention to the actual layout pattern. In that case, the circuit designers can design semiconductor integrated circuits using the microscopic pattern according to the multiple exposure technology as in the present invention by the same techniques as before, by adding the automatic preparation procedure of the rough pattern mask data for the multiple exposure of the present example after the procedure of preparing the physical layout pattern to be formed on the resist, based on the logical description data from the logical description.

In creation of the mask using the operation result of each example described above, the data can be handled, for example, by assigning a layer capable of being handled on the CAD (Computer Aided Design) tool to each of the data of the different mask transmittances, so as to prepare the mask creating data. Alternatively, the mask creating data may also be prepared by using different branch numbers called data types for the respective transmittances on one layer.

The above examples were described on the presumption that the two-beam interference exposure was carried out using the Levenson pattern as the micro-line pattern, but the micro-line pattern may also be printed by probe writing using near-field light, a laser beam, an electron beam, STM, AFM, or the like. In this case, the probe writing is just to write only portions of the Levenson pattern overlapping with the portions of the transmittance 1 in the rough pattern, with the light amount corresponding to the transmittance 1, so that the writing time can be reduced considerably.

The micro-line pattern does not always have to be limited to the periodic pattern like the Levenson pattern, but it can also be the checkerboard pattern or the pattern resulting from double exposure of orthogonal, microscopic, periodic patterns such as the orthogonal Levenson patterns or the like. Further, the micro-line pattern can also be the pattern in which lines are arranged at irregular pitch.

Next described is an example of a method for producing devices by making use of each exposure apparatus or each exposure method or the pattern design method described above.

Figure 65:
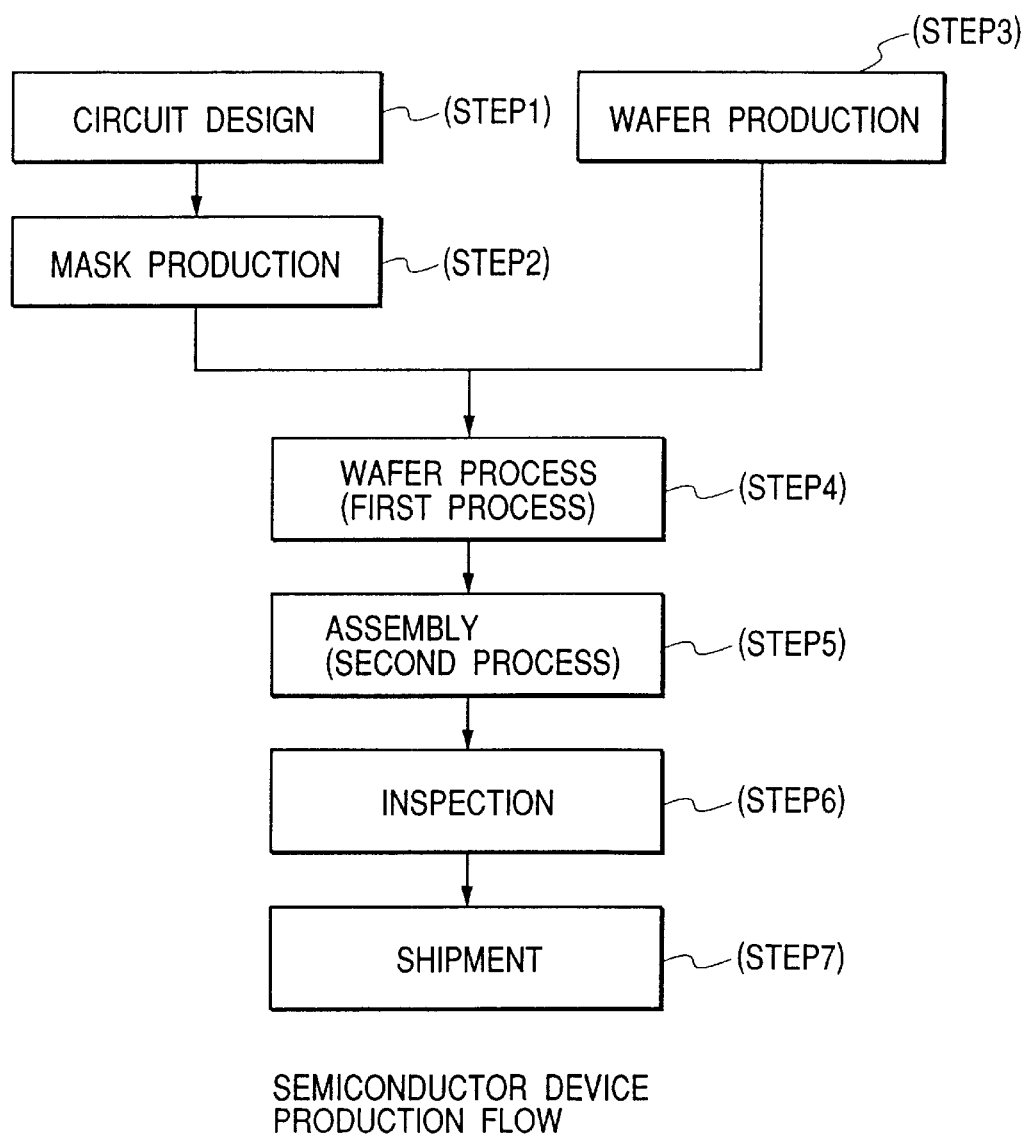
FIG. 65 is a diagram to show the flow of production of microscopic devices.

FIG. 65 is a flow of production of microdevices (the semiconductor chip such as IC, LSI, etc., the liquid crystal panel, CCD, the thin film magnetic head, micro-machine, etc.). Step 1 (circuit design) is to carry out pattern design of devices. Step 2 (mask production) is to produce a mask in which the designed pattern is formed. On the other hand, step 3 (wafer production) is to produce a wafer using a material of silicon, glass, or the like. Step 4 (wafer process) is called a pre-step, which is a step of forming actual circuits on the wafer by the lithography technology, using the mask and wafer prepared as described above. Next step 5 (assembly) is called a post step which is a step of making semiconductor chips using the wafer prepared in step 4, including an assembly step (dicing, bonding), a packaging step (encapsulation of chip), and so on. Step 6 (inspection) is to inspect the semiconductor devices fabricated in step 5 by carrying out an operation checking test, a durability test, etc. thereof. The semiconductor devices are completed through these steps and are shipped (step 7).

Figure 66:
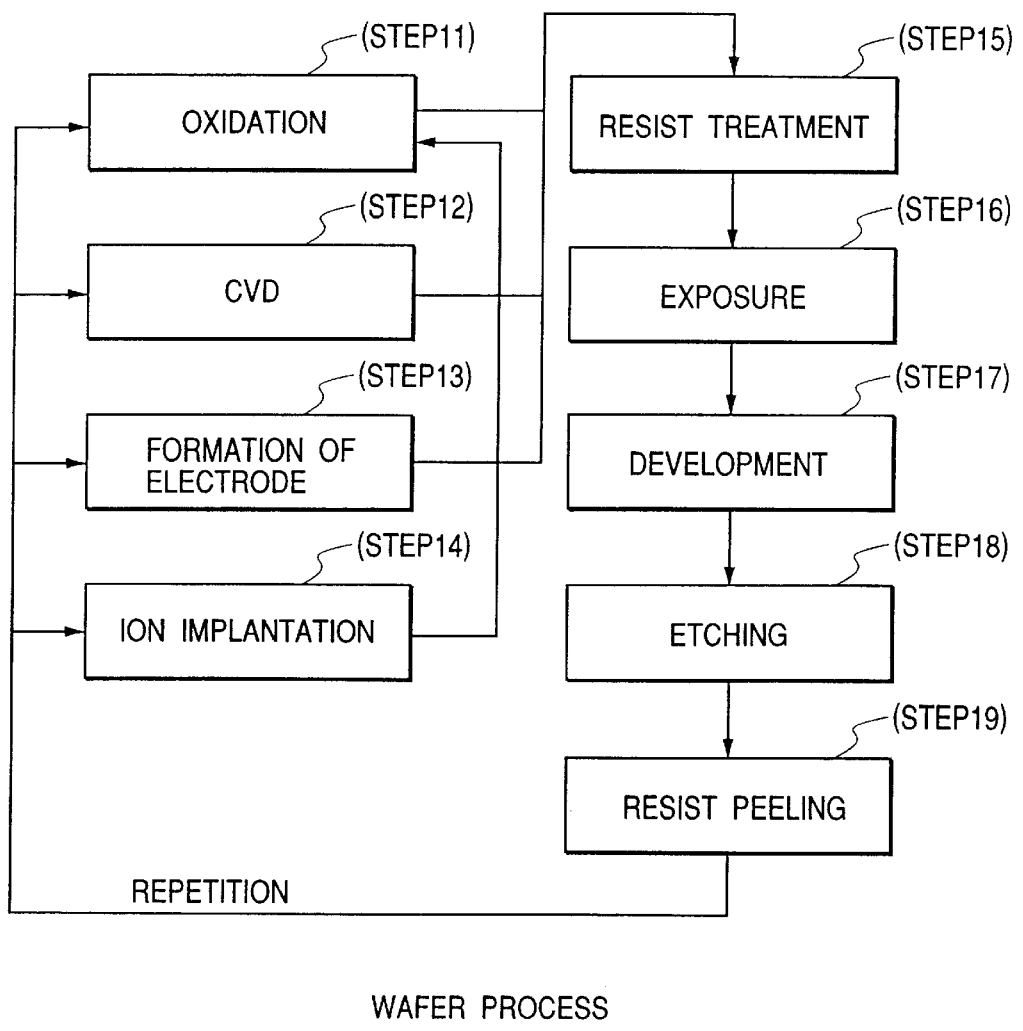
FIG. 66 is a diagram to show the detailed flow of the wafer process in FIG. 65.

FIG. 66 is the detailed flow of the above wafer process. Step 11 (oxidation) is to oxidize the surface of the wafer. Step 12 (CVD) is to form an insulating film on the surface of the wafer. Step 13 (formation of electrodes) is to form the electrodes on the wafer by evaporation. Step 14 (ion implantation) is to implant ions into the wafer. Step 15 (resist treatment) is to coat the wafer with a photosensitive agent. Step 16 (exposure) is to print the circuit pattern of the mask in the wafer by the normal exposure apparatus using the rough mask described above, and by the two-beam interference exposure apparatus or the probe exposure apparatus for exposure of the microscopic pattern. Step 17 (development) is to develop the exposed wafer. Step 18 (etching) is to remove the other portions than the developed resist image. Step 19 (resist peeling) is to remove the now unnecessary resist after the etching. By repeatedly carrying out these steps, the circuit patterns are formed in multi-layer structure on the wafer.

The devices of high integration, which were hard to produce before, can be produced using the production method of the present example.

What is claimed is:

1. A method for creating a mask pattern projected on a substrate in multiple exposure for carrying out overlay printing of a micro-line pattern and a mask pattern a minimum line width of which is wider than a line width of the micro-line pattern and which provides multi-level exposure amount onto the substrate, so as to form a target pattern, said method comprising:

a step of preparing data of the target pattern desired to form after the exposure;

a step of carrying out a logical operation of predetermined micro-line pattern data and said target pattern data;

a step of dividing a surface of the mask pattern into plural types of areas, based on the result of the logical operation;

a step of setting a plurality of light transmittances required or allowed for the types of areas and grouping areas for which one light transmittance can be selected, in each light transmittance;

a step of synthesizing a synthetic pattern from grouped patterns formed in the respective light transmittances, wherein data of the synthetic pattern is used as data of the mask pattern: and forming said mask pattern from said data, said mask pattern adapted to be projected on a substrate in a multi-level exposure for carrying out the overlay printing.

2. The method according to claim 1, further comprising a step of determining whether each of the grouped patterns comprised of the grouped areas satisfies a design rule of the mask pattern and revising a grouped pattern not satisfying the design rule so that said grouped pattern satisfies the design rule, wherein the grouped patterns formed in the respective light transmittances and revised if necessary are used to synthesize the synthetic pattern.

3. The method according to claim 2, further comprising a second revising step of, after the synthesis with said plurality of grouped patterns, determining whether the synthetic pattern satisfies said design rule, and revising the synthetic pattern if the synthetic pattern does not satisfy the design rule.

4. A method for creating a mask pattern used in multiple exposure for carrying out overlay printing of a micro-line pattern and a mask pattern a minimum line width of which is wider than a line width of the micro-line pattern to form a target pattern having a minimum line width corresponding to the line width of said micro-line pattern, said method comprising:

a step of preparing data of the target pattern desired to form after the exposure;

a step of carrying out a logical operation of predetermined micro-line pattern data and said target pattern data;

a step of dividing a surface of the mask pattern into plural types of areas, based on the result of the logical operation;

a step of setting a single light transmittance or a plurality of light transmittances required or allowed for the types of areas and grouping areas for which one light transmittance can be selected, in each light transmittance; and a step of synthesizing a synthetic pattern from grouped patterns formed in the respective light transmittances, wherein data of the synthetic pattern is used as data of the mask pattern, the method further comprising:
- a) a step of determining whether each of the grouped patterns comprised of the grouped areas satisfies a design rule of the mask pattern and revising a grouped pattern not satisfying the design rule so that said grouped pattern satisfies the design rule, wherein the grouped patterns formed in the respective light transmittances and revised if necessary are used to synthesize the synthetic pattern,
- b) optionally, a second revising step of, after the synthesis with said plurality of grouped patterns, determining whether the synthetic pattern satisfies said design rule, and revising the synthetic pattern if the synthetic pattern does not satisfy the design rule, and
- c) a step of selecting one of obtained data when each of said revising steps results in obtaining a plurality of revision results for one grouped pattern or the synthetic pattern or when a plurality of synthesis results are obtained in said synthesizing step and, as a result, if said mask pattern data obtained includes a plurality of mask pattern data, said selection step comprising computing images corresponding to the respective mask pattern data and selecting one of said data, based on the obtained image data.

5. The method according to claim 2, wherein when the line width of said micro-line pattern is L, said target pattern has a line width and a space equal to an integer not less than 1, times L and said mask pattern has a line width and a space equal to an integer not less than 2, times L, and wherein each of said revising steps is first to move each side of said grouped pattern or the synthetic pattern toward the inside of a light transmitting pattern by L/2 and then to move each side of a light transmitting pattern left after the movement, toward the outside thereof by L/2, thereby erasing only a pattern having the width of L.

6. The method according to claim 5, wherein said revising step is a step of carrying out such a revision that in a portion where a clearance between light transmitting patterns in the grouped pattern or the synthetic pattern from which the pattern having the width of L was erased, has the width of L, one side or both sides of the clearance are moved by L toward the outside of the clearance to revise the width to 2L or more and then a revising step similar to that in claim 5 to erase a pattern having the width of L is carried out again for the revised pattern.

7. A computer-executable program for effecting on a computer the method as set forth in claim 1.

8. A computer-readable memory medium in which the computer-executable program as set forth in claim 7 is stored.

9. A method for creating a mask pattern used in multiple exposure for carrying out overlay printing of a micro-line pattern and a mask pattern a minimum line width of which is wider than a line width of the micro-line pattern to form a target pattern having a minimum line width corresponding to the line width of said micro-line pattern, said method comprising:
- a step of preparing data of the target pattern desired to form after the exposure;
- a step of carrying out a logical operation of predetermined micro-line pattern data and said target pattern data;
- a step of dividing a surface of the mask pattern into plural types of areas, based on the result of the logical operation;
- a step of setting a single light transmittance or a plurality of light transmittances required or allowed for the types of areas and for grouping areas for which one light transmittance can be selected, in each light transmittance; and
- a step of synthesizing a synthetic pattern from grouped patterns formed in the respective light transmittances, wherein data of the synthetic pattern is used as data of the mask pattern, said method further comprising:
- a first revising step of determining whether each of the grouped patterns comprised of the grouped areas satisfies a design rule of the mask pattern and revising a grouped pattern not satisfying the design rule so that said grouped pattern satisfies the design rule;
- a second revising step of, after the synthesis with said plurality of grouped patterns, determining whether the synthetic pattern satisfies said design rule, and revising the synthetic pattern if the synthetic pattern does not satisfy the design rule; and
- a selection step carried out when each of said revising steps results in obtaining a plurality of revision results for one grouped pattern or synthetic pattern or when said synthesizing step results in obtaining a plurality of synthesis results and, as a result, if said mask pattern data includes a plurality of mask pattern data, said selection step comprising computing images corresponding to the respective mask pattern data and selecting one of said data, based on the obtained image data.

10. The method according to claim 9, wherein when the line width of said micro-line pattern is L, said target pattern has a line width and a space equal to an integer not less than 1, times L and said mask pattern has a line width and a space equal to an integer not less than 2, times L, and wherein each of said revising steps is first to move each side of said grouped pattern or the synthetic pattern toward the inside of a light transmitting pattern by L/2 and then to move each side of a light transmitting pattern left after the movement, toward the outside thereof by L/2, thereby erasing only a pattern having the width of L.

11. The method according to claim 10, wherein said revising step is a step of carrying out such a revision that in a portion where a clearance between light transmitting patterns in the grouped pattern or the synthetic pattern from which the pattern having the width of L was erased, has the width of L, one side or both sides of the clearance are moved by L toward the outside of the clearance to revise the width to 2L or more and then said revising step to erase the pattern having the width of L is carried out again for the revised pattern.

12. A computer-executable program for effecting on a computer the method as set forth in claim 9.

13. A computer-readable memory medium in which the computer-executable program as set forth in claim 12 is stored.

14. A method for creating a mask pattern projected onto a substrate comprising:
- a step of preparing data of a target pattern desired to form after exposure;
- a step of carrying out a logical operation of predetermined micro-line pattern data and said target pattern data;
- a step of dividing a surface of a mask pattern into plural types of areas, based on the result of the logical operation;
- a step of setting a plurality of light transmittances required or allowed for the types of areas and grouping areas for which one light transmittance can be selected, in each light transmittance;

a step of synthesizing a synthetic pattern from grouped patterns formed in the respective light transmittances, wherein data of the synthetic pattern is used as data of the mask pattern; and forming said mask pattern from said data, wherein said mask pattern provides a multi-level exposure amount onto the substrate.

15. A mask pattern creating method comprising:

a step of preparing data of a target pattern desired to form after exposure;

a step of carrying out a logical operation of predetermined micro-line pattern data and said target pattern data;

a step of dividing a surface of a mask pattern into plural types of areas, based on the result of the logical operation;

a step of setting a light transmittance or a plurality of light transmittances required or allowed for the types of areas and grouping areas for which one light transmittance can be selected, in each light transmittance;

a first revising step of determining whether each of the grouped patterns comprised of the grouped areas satisfies a predetermined mask pattern design rule, and revising a grouped pattern not satisfying the design rule so that said grouped pattern satisfies the design rule; and a step of synthesizing a synthetic pattern from grouped patterns formed in the respective light transmittances and revised if necessary, wherein data of the synthetic pattern is used as data of the mask pattern, said mask pattern creating method further comprising:
 a second revising step of determining whether the synthetic pattern satisfies said design rule and revising the synthetic pattern if the synthetic pattern does not satisfy the design rule;
 a selection step carried out when each revising step results in obtaining a plurality of revision results for one grouped pattern or synthetic pattern or when said synthesizing step results in obtaining a plurality of synthesis results and, as a result, if said mask pattern data includes a plurality of mask pattern data, said selection step comprising computing images corresponding to the respective mask pattern data and selecting one of the data, based on the obtained image data.

16. A pattern computing method wherein multiple image computing means carries out an operation, using micro-line pattern data prepared by micro-line pattern handling means, arbitrary rough pattern data prepared by rough pattern handling means, and a characteristic parameter for a pattern forming operation inputted by characteristic parameter handling means, and outputs forming pattern data of the result of the operation to forming pattern handling means, wherein the rough pattern data provides multi-level exposure amount distribution on a wafer.

17. A pattern computing method wherein, using data from either three handling means out of data from four handling means including micro-line pattern data prepared by micro-line pattern handling means, arbitrary rough pattern data prepared by rough pattern handling means, a characteristic parameter for a pattern forming operation inputted by characteristic parameter handling means, and final forming pattern data prepared by forming pattern handling means, one rest data is computed and outputted, wherein the rough pattern data provides multi-level exposure amount distribution on a wafer.

18. An exposure method for transferring the mask pattern obtained by making use of the pattern computing method as set forth in claim 16 or 17, onto a photosensitive substrate.

19. A computer-executable software program for effecting on a computer the method as set forth in claim 16.

20. A computer-readable memory medium in which the computer-executable software program of claim 19 is stored.

21. A computer-executable software program for effecting on a computer the method as set forth in claim 17.

22. A computer-readable memory medium in which the computer-executable software program of claim 21 is stored.

* * * * *

UNITED STATES PATENT AND TRADEMARK OFFICE
CERTIFICATE OF CORRECTION

PATENT NO.    : 6,670,080 B2
DATED         : December 30, 2003
INVENTOR(S)   : Mitsuro Sugita et al.

It is certified that error appears in the above-identified patent and that said Letters Patent is hereby corrected as shown below:

Title page,
Item [*] Notice, insert the following paragraph:
-- This patent issued on a continued prosecution application filed under 37 CFR 1.53(d), and is subject to the twenty year patent term provisions of 35 U.S.C. 154(a)(2). --

Column 2,
Line 47, "of" should be deleted.

Column 5,
Line 64, "device" should read -- the device --.

Column 11,
Line 34, "characteristic," should read -- characteristics, --.

Column 13,
Line 15, "is" should read -- and is --.

Column 14,
Line 53, "developed." should read -- being developed. --

Column 16,
Line 61, "$P_0P/M=2R/M=\lambda/(M \cdot 2NA)$" should read -- $P_0=P/M=2R/M=\lambda/(M \cdot 2NA)$ --.

Column 17,
Line 33, the first occurrence of "a" should read -- $\sigma$ --.

Column 18,
Line 28, the first occurrence of "exposure" should read -- exposure: --.
Line 39, "$c''=k'' \times c+I_1$," should read -- $c'=k \times c+I_1$ --.
Line 58, "have" should read -- has --.

Column 20,
Line 53, "$c'0.89$," should read -- $c' = 0.89$, --.

Column 21,
Line 51, "a" should read -- $\sigma$ --.

UNITED STATES PATENT AND TRADEMARK OFFICE
CERTIFICATE OF CORRECTION

PATENT NO. : 6,670,080 B2
DATED : December 30, 2003
INVENTOR(S) : Mitsuro Sugita et al.

It is certified that error appears in the above-identified patent and that said Letters Patent is hereby corrected as shown below:

Column 23,
Line 34, "a" should read -- σ --.
Lines 35 and 36, "a," should read -- σ, --.

Column 25,
Line 24, "is" should read -- is a --.

Column 26,
Line 6, the first occurrence of "is" should read -- are --.
Line 7, "is" should read -- are --.

Column 28,
Line 30, "y" should read -- γ --.

Column 29,
Lines 18 and 23, "pass" should read -- passing --.

Column 30,
Line 36, "The most" should read -- Most --.

Column 33,
Line 30, "includes" should read -- include --.

Column 39,
Line 60, "other portions than" should read -- portions other than --.

UNITED STATES PATENT AND TRADEMARK OFFICE
CERTIFICATE OF CORRECTION

PATENT NO. : 6,670,080 B2
DATED : December 30, 2003
INVENTOR(S) : Mitsuro Sugita et al.

It is certified that error appears in the above-identified patent and that said Letters Patent is hereby corrected as shown below:

Column 40,
Line 6, "provides" should read -- provides a --.

Column 44,
Line 14, "provides" should read -- provides a --.
Line 25, "provides" should read -- provides a --.

Signed and Sealed this

Third Day of August, 2004

JON W. DUDAS
*Acting Director of the United States Patent and Trademark Office*